United States Patent
Song

(10) Patent No.: US 11,908,541 B2
(45) Date of Patent: *Feb. 20, 2024

(54) PROCESSING-IN-MEMORY (PIM) SYSTEMS

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 250 days.

This patent is subject to a terminal disclaimer.

(21) Appl. No.: 17/491,893

(22) Filed: Oct. 1, 2021

(65) Prior Publication Data

US 2022/0020406 A1 Jan. 20, 2022

Related U.S. Application Data

(63) Continuation-in-part of application No. 17/027,276, filed on Sep. 21, 2020, now Pat. No. 11,513,733.
(Continued)

(30) Foreign Application Priority Data

Jan. 17, 2020 (KR) ........................ 10-2020-0006903

(51) Int. Cl.
*G11C 7/10* (2006.01)
*G06F 7/544* (2006.01)

(52) U.S. Cl.
CPC .......... *G11C 7/1039* (2013.01); *G06F 7/5443* (2013.01); *G11C 7/1069* (2013.01); *G11C 7/1096* (2013.01)

(58) Field of Classification Search
CPC ... G11C 7/1039; G11C 7/1069; G11C 7/1096; G11C 7/1006; G11C 11/54; G06F 7/5443; G06F 2207/4824
(Continued)

(56) References Cited

U.S. PATENT DOCUMENTS 5,706,514 A 1/1998 Bonola
5,751,987 A 5/1998 Mahant-Shetti et al.
(Continued)

FOREIGN PATENT DOCUMENTS

| KR | 1020180109619 A | 10/2018 |
| KR | 1020190018888 A | 2/2019 |
| KR | 1020200108772 A | 9/2020 |

OTHER PUBLICATIONS

U.S. Appl. No. 17/894,014, all pages. (Year: 2022).*
(Continued)

*Primary Examiner* — Fernando Hidalgo
(74) *Attorney, Agent, or Firm* — William Park & Associates Ltd.

(57) ABSTRACT

A processing-in-memory (PIM) system includes a first and second PIM devices and a host. Each of the first and second PIM devices includes a plurality of multiplying-and-accumulating (MAC) operators and a plurality of memory banks supplying weight data to the plurality of MAC operators. The host controls the first and second PIM devices and includes a data buffer. The first and second PIM devices include a first global buffer and a second global buffer, which supply the vector data to the plurality of MAC operators, respectively. The host reads the vector data out of the first and second PIM devices to store the vector data into the data buffer and writes the vector data stored in the data buffer into the first and second global buffers.

27 Claims, 63 Drawing Sheets

Related U.S. Application Data

(60) Provisional application No. 62/958,226, filed on Jan. 7, 2020.

(58) Field of Classification Search
USPC .................................................. 365/189.05
See application file for complete search history.

(56) References Cited

U.S. PATENT DOCUMENTS

| | | | |
|---|---|---|---|
| 10,042,639 | B2 | 8/2018 | Gopal et al. |
| 11,513,733 | B2* | 11/2022 | Song .................... G06F 3/0659 |
| 2006/0236079 | A1 | 10/2006 | Lin et al. |
| 2009/0254694 | A1 | 10/2009 | Ehrman et al. |
| 2010/0312998 | A1 | 12/2010 | Walker |
| 2013/0262612 | A1 | 10/2013 | Langas et al. |
| 2017/0344301 | A1 | 11/2017 | Ryu et al. |
| 2019/0198061 | A1* | 6/2019 | Oh .......................... G11C 5/02 |
| 2019/0243654 | A1 | 8/2019 | Mirhosseininiri et al. |
| 2020/0026498 | A1* | 1/2020 | Sumbul ............... G06F 12/0811 |
| 2020/0089472 | A1 | 3/2020 | Pareek et al. |
| 2020/0174749 | A1 | 6/2020 | Kang et al. |
| 2020/0294558 | A1* | 9/2020 | Yu ........................ G11C 7/1039 |
| 2021/0072986 | A1 | 3/2021 | Yudanov et al. |
| 2022/0012303 | A1 | 1/2022 | Zheng |
| 2022/0068366 | A1 | 3/2022 | Kwon et al. |

OTHER PUBLICATIONS

Daehon Kwon et al., "A 1 ynm 1.25 V 8Gb 16Gb/s/Pin GDDR6-Based Accelerator-in-Memory Supporting 1TFLOPS MAC Operation and Various Activation Functions for Deep Learning Application.", IEEE Journal of Solid-State Circuits 58.1 (2022): 291-302. (Year: 2022).

Mingxuan He et al., "Newton: A DRAM-maker's accelerator-in-memory (AiM) architecture for machine learning", 2020 53rd Annual IEEE/ACM International Symposium on Microarchitecture (Micro), IEEE, 2020; 14 pages (Year: 2020).

Seongju Lee et al., "A 1 ynm 1.25V 8Gb, 16Gb/s/pin GDDR6-based Accelerator-in-Memory supporting 1TFLOPS MAC Operation and Various Activation Functions for Deep-Learning Applications", 2022 IEEE International Solid-State Circuits Conference (ISSCC). vol. 65. IEEE, 2022. 3 pages. (Year: 2022).

* cited by examiner

FIG.5

$$\begin{pmatrix} W0.0 & W0.1 & W0.2 & W0.3 & W0.4 & W0.5 & W0.6 & W0.7 \\ W1.0 & W1.1 & W1.2 & W1.3 & W1.4 & W1.5 & W1.6 & W1.7 \\ W2.0 & W2.1 & W2.2 & W2.3 & W2.4 & W2.5 & W2.6 & W2.7 \\ W3.0 & W3.1 & W3.2 & W3.3 & W3.4 & W3.5 & W3.6 & W3.7 \\ W4.0 & W4.1 & W4.2 & W4.3 & W4.4 & W4.5 & W4.6 & W4.7 \\ W5.0 & W5.1 & W5.2 & W5.3 & W5.4 & W5.5 & W5.6 & W5.7 \\ W6.0 & W6.1 & W6.2 & W6.3 & W6.4 & W6.5 & W6.6 & W6.7 \\ W7.0 & W7.1 & W7.2 & W7.3 & W7.4 & W7.5 & W7.6 & W7.7 \end{pmatrix} \times \begin{pmatrix} X0.0 \\ X1.0 \\ X2.0 \\ X3.0 \\ X4.0 \\ X5.0 \\ X6.0 \\ X7.0 \end{pmatrix} = \begin{pmatrix} MAC0.0 \\ MAC1.0 \\ MAC2.0 \\ MAC3.0 \\ MAC4.0 \\ MAC5.0 \\ MAC6.0 \\ MAC7.0 \end{pmatrix}$$

WEIGHT MATRIX  VECTOR MATRIX  MAC RESULT MATRIX

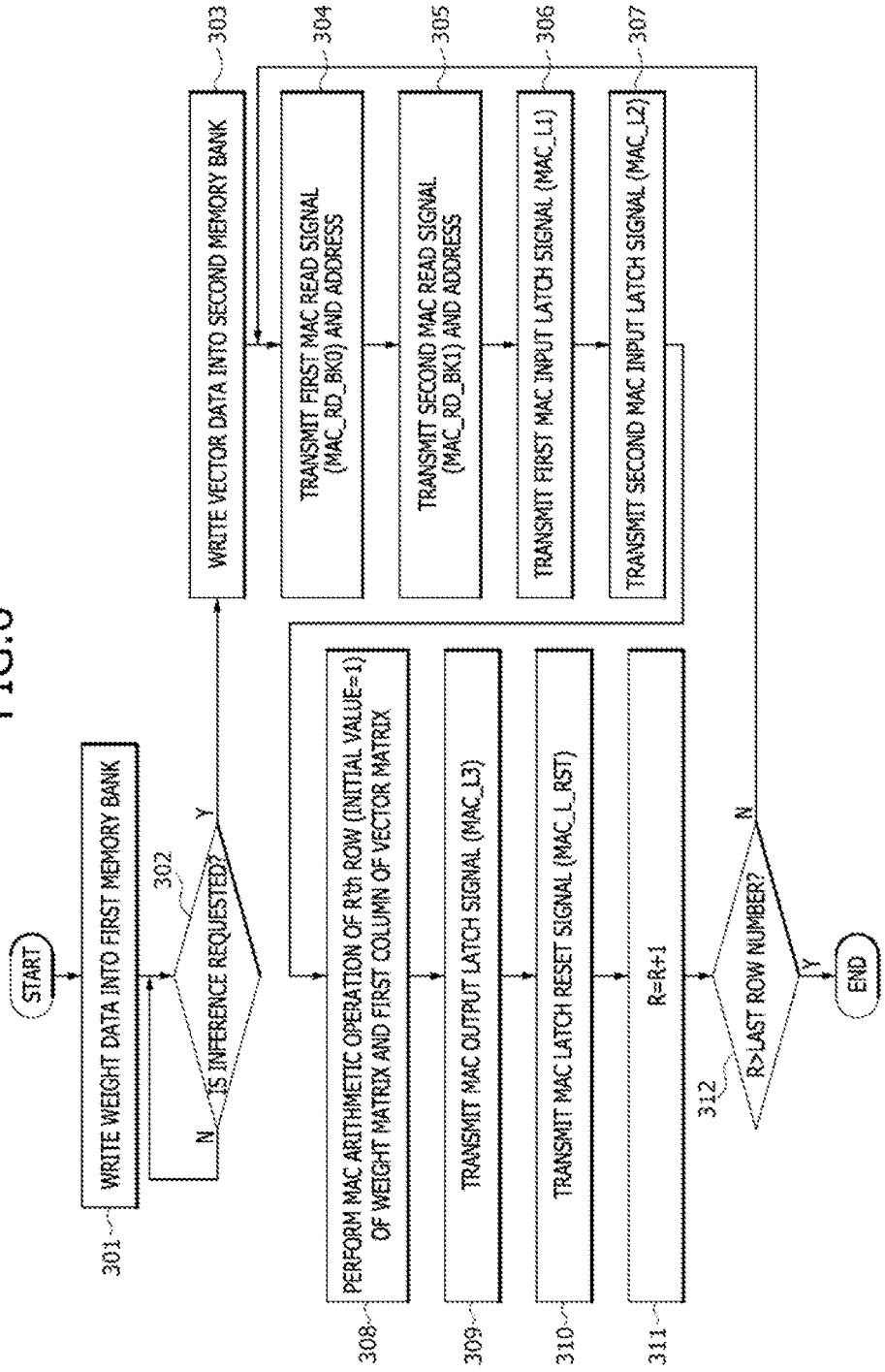

PROCESSING-IN-MEMORY (PIM) SYSTEMS

CROSS-REFERENCE TO RELATED APPLICATIONS

This is a continuation-in-part of U.S. patent application Ser. No. 17/027,276, filed on Sep. 21, 2020, which claims the priority of provisional application No. 62/958,226, filed on Jan. 7, 2020, and Korean Application No. 10-2020-0006903, filed on Jan. 17, 2020, which are all incorporated herein by reference in their entirety.

BACKGROUND

1. Technical Field

Various embodiments of the present disclosure relate to processing-in-memory (PIM) systems and, more particularly, to PIM systems including a PIM device and a controller and methods of operating the PIM systems.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. In general, techniques for effectively learning deep neural networks (DNNs) or deep networks having increased layers as compared with general neural networks to utilize the deep neural networks (DNNs) or the deep networks in pattern recognition or inference are commonly referred to as deep learning.

One cause of this widespread interest may be the improved performance of processors performing arithmetic operations. To improve the performance of artificial intelligence, it may be necessary to increase the number of layers constituting a neural network in the artificial intelligence to educate the artificial intelligence. This trend has continued in recent years, which has led to an exponential increase in the amount of computation required for the hardware that actually does the computation. Moreover, if the artificial intelligence employs a general hardware system including memory and a processor which are separated from each other, the performance of the artificial intelligence may be degraded due to limitation of the amount of data communication between the memory and the processor. In order to solve this problem, a PIM device in which a processor and memory are integrated in one semiconductor chip has been used as a neural network computing device. Because the PIM device directly performs arithmetic operations internally, data processing speed in the neural network may be improved.

SUMMARY

According to an embodiment, a processing-in-memory (PIM) system includes a first PIM device, a second PIM device, and a host. Each of the first and second PIM devices includes a plurality of multiplying-and-accumulating (MAC) operators capable of performing a MAC arithmetic operation and a plurality of memory banks capable of supplying weight data to the plurality of MAC operators. The MAC arithmetic operation is performed using the weight data and vector data as input data. The host is capable of controlling the first and second PIM devices and includes a data buffer. The first and second PIM devices include a first global buffer and a second global buffer, which are capable of supplying the vector data to the plurality of MAC operators, respectively. The host is configured to read the vector data out of the first and second PIM devices to store the vector data into the data buffer and is configured to write the vector data stored in the data buffer into the first and second global buffers.

According to another embodiment, a processing-in-memory (PIM) system includes a first PIM device, a second PIM device, a host, and a memory device. Each of the first and second PIM devices includes a plurality of multiplying-and-accumulating (MAC) operators capable of performing a MAC arithmetic operation and a plurality of memory banks capable of supplying weight data to the plurality of MAC operators. The MAC arithmetic operation is performed using the weight data and vector data as input data. The host is capable of controlling the first and second PIM devices and includes a data buffer. The memory device is configured to communicate with the host. The first and second PIM devices include a first global buffer and a second global buffer, which are capable of supplying the vector data to the plurality of MAC operators, respectively. The host is configured to read the vector data out of the memory device to store the vector data into the data buffer and is configured to write the vector data stored in the data buffer into the first and second global buffers.

BRIEF DESCRIPTION OF THE DRAWINGS

Certain features of the disclosed technology are illustrated in various embodiments with reference to the attached drawings.

FIG. 5 illustrates an example of a MAC arithmetic operation performed in a PIM system according to a first embodiment of the present disclosure.

FIG. 6 is a flowchart illustrating processes of the MAC arithmetic operation illustrated in FIG. 5 in a PIM system according to a first embodiment of the present disclosure.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean a relative positional relationship, but not used to limit certain cases in which the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements therebetween.

Various embodiments are directed to PIM systems and methods of operating the PIM systems.

Figure 1:
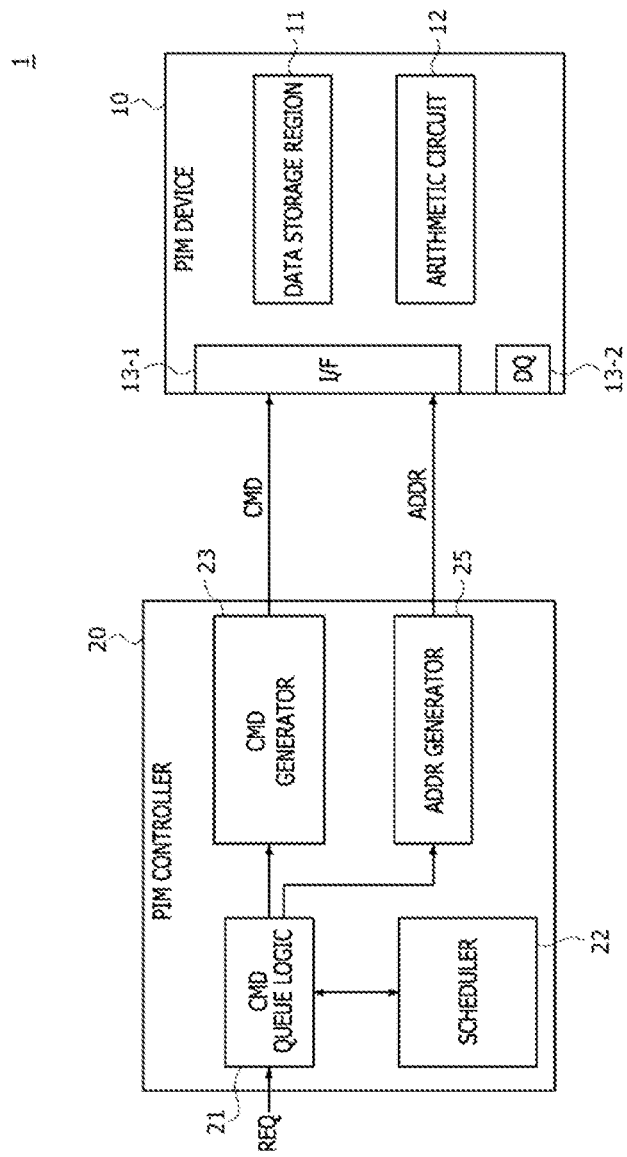
FIG. 1 is a block diagram illustrating a PIM system according to an embodiment of the present disclosure.

FIG. 1 is a block diagram illustrating a PIM system according to an embodiment of the present disclosure. As illustrated in FIG. 1, the PIM system 1 may include a PIM device 10 and a PIM controller 20. The PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device 10 through the data I/O pad 13-2.

The interface 13-1 of the PIM device 10 may receive a command CMD and address ADDR from the PIM controller 20. The interface 13-1 may output the command CMD to the data storage region 11 or the arithmetic circuit 12 in the PIM device 10. The interface 13-1 may output the address ADDR to the data storage region 11 in the PIM device 10. The data I/O pad 13-2 of the PIM device 10 may function as a data communication terminal between a device external to the PIM device 10, for example the PIM controller 20, and the data storage region 11 included in the PIM device 10. The external device to the PIM device 10 may correspond to the PIM controller 20 of the PIM system 1 or a host located outside the PIM system 1. Accordingly, data outputted from the host or the PIM controller 20 may be inputted into the PIM device 10 through the data I/O pad 13-2.

The PIM controller 20 may control operations of the PIM device 10. In an embodiment, the PIM controller 20 may control the PIM device 10 such that the PIM device 10 operates in a memory mode or an arithmetic mode. In the event that the PIM controller 20 controls the PIM device 10 such that the PIM device 10 operates in the memory mode, the PIM device 10 may perform a data read operation or a data write operation for the data storage region 11. In the event that the PIM controller 20 controls the PIM device 10 such that the PIM device 10 operates in the arithmetic mode, the arithmetic circuit 12 of the PIM device 10 may receive first data and second data from the data storage region 11 to perform an arithmetic operation. In the event that the PIM controller 20 controls the PIM device 10 such that the PIM device 10 operates in the arithmetic mode, the PIM device 10 may also perform the data read operation and the data write operation for the data storage region 11 to execute the arithmetic operation. The arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The PIM controller 20 may be configured to include command queue logic 21, a scheduler 22, a command (CMD) generator 23, and an address (ADDR) generator 25. The command queue logic 21 may receive a request REQ from an external device (e.g., a host of the PIM system 1) and store the command queue corresponding to the request REQ in the command queue logic 21. The command queue logic 21 may transmit information on a storage status of the command queue to the scheduler 22 whenever the command queue logic 21 stores the command queue. The command queue stored in the command queue logic 21 may be transmitted to the command generator 23 according to a sequence determined by the scheduler 22. The command queue logic 21, and also the command queue logic 210 of FIGS. 2 and 20, may be implemented as hardware, software, or a combination of hardware and software. For example, the command queue logic 21 and/or 210 may be a command queue logic circuit operating in accordance with an algorithm and/or a processor executing command queue logic code.

The scheduler 22 may adjust a sequence of the command queue when the command queue stored in the command queue logic 21 is outputted from the command queue logic 21. In order to adjust the output sequence of the command queue stored in the command queue logic 21, the scheduler 22 may analyze the information on the storage status of the command queue provided by the command queue logic 21 and may readjust a process sequence of the command queue so that the command queue is processed according to a proper sequence.

The command generator 23 may receive the command queue related to the memory mode of the PIM device 10 and the MAC mode of the PIM device 10 from the command queue logic 21. The command generator 23 may decode the command queue to generate and output the command CMD. The command CMD may include a memory command for the memory mode or an arithmetic command for the arithmetic mode. The command CMD outputted from the command generator 23 may be transmitted to the PIM device 10.

The command generator 23 may be configured to generate and transmit the memory command to the PIM device 10 in the memory mode. The command generator 23 may be configured to generate and transmit a plurality of arithmetic commands to the PIM device 10 in the arithmetic mode. In one example, the command generator 23 may be configured to generate and output first to fifth arithmetic commands with predetermined time intervals in the arithmetic mode. The first arithmetic command may be a control signal for reading the first data out of the data storage region 11. The second arithmetic command may be a control signal for reading the second data out of the data storage region 11. The third arithmetic command may be a control signal for latching the first data in the arithmetic circuit 12. The fourth arithmetic command may be a control signal for latching the second data in the arithmetic circuit 12. And the fifth MAC command may be a control signal for latching arithmetic result data of the arithmetic circuit 12.

The address generator 25 may receive address information from the command queue logic 21 and generate the address ADDR for accessing a region in the data storage region 11. In an embodiment, the address ADDR may include a bank address, a row address, and a column address. The address ADDR outputted from the address generator 25 may be inputted to the data storage region 11 through the interface (I/F) 13-1.

Figure 2:
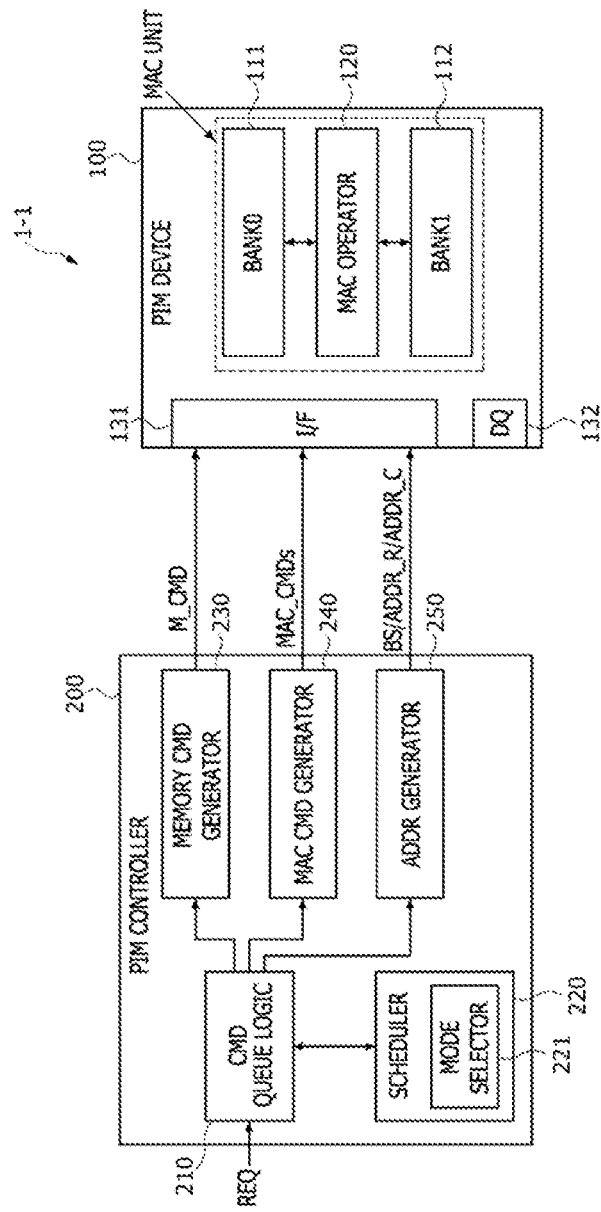
FIG. 2 is a block diagram illustrating a PIM system according to a first embodiment of the present disclosure.

FIG. 2 is a block diagram illustrating a PIM system 1-1 according to a first embodiment of the present disclosure. As illustrated in FIG. 2, the PIM system 1-1 may include a PIM device 100 and a PIM controller 200. The PIM device 100 may include a first memory bank (BANK0) 111, a second memory bank (BANK1) 112, a MAC operator 120, an interface (I/F) 131, and a data input/output (I/O) pad 132. For an embodiment, the MAC operator 120 represents a MAC operator circuit. The first memory bank (BANK0) 111, the second memory bank (BANK1) 112, and the MAC operator 120 included in the PIM device 100 may constitute one MAC unit. In another embodiment, the PIM device 100 may include a plurality of MAC units. The first memory bank (BANK0) 111 and the second memory bank (BANK1) 112 may represent a memory region for storing data, for example, a DRAM device. Each of the first memory bank (BANK0) 111 and the second memory bank (BANK1) 112 may be a component unit which is independently activated and may be configured to have the same data bus width as data I/O lines in the PIM device 100. In an embodiment, the first and second memory banks 111 and 112 may operate through interleaving such that an active operation of the first and second memory banks 111 and 112 is performed in parallel while another memory bank is selected. Each of the first and second memory banks 111 and 112 may include at least one cell array which includes memory unit cells located at cross points of a plurality of rows and a plurality of columns.

Although not shown in the drawings, a core circuit may be disposed adjacent to the first and second memory banks 111 and 112. The core circuit may include X-decoders XDECs and Y-decoders/IO circuits YDEC/IOs. An X-decoder XDEC may also be referred to as a word line decoder or a row decoder. The X-decoder XDEC may receive a row address ADD_R from the PIM controller 200 and may decode the row address ADD_R to select and enable one of the rows (i.e., word lines) coupled to the selected memory bank. Each of the Y-decoders/IO circuits YDEC/IOs may include a Y-decoder YDEC and an I/O circuit JO. The Y-decoder YDEC may also be referred to as a bit line decoder or a column decoder. The Y-decoder YDEC may receive a column address ADDR_C from the PIM controller 200 and may decode the column address ADDR_C to select and enable at least one of the columns (i.e., bit lines) coupled to the selected memory bank. Each of the I/O circuits may include an I/O sense amplifier for sensing and amplifying a level of a read datum outputted from the corresponding memory bank during a read operation for the first and second memory banks 111 and 112. In addition, the I/O circuit may include a write driver for driving a write datum during a write operation for the first and second memory banks 111 and 112.

The interface 131 of the PIM device 100 may receive a memory command M_CMD, MAC commands MAC_CMDs, a bank selection signal BS, and the row/column addresses ADDR_R/ADDR_C from the PIM controller 200. The interface 131 may output the memory command M_CMD, together with the bank selection signal BS and the row/column addresses ADDR_R/ADDR_C, to the first memory bank 111 or the second memory bank 112. The interface 131 may output the MAC commands MAC_CMDs to the first memory bank 111, the second memory bank 112, and the MAC operator 120. In such a case, the interface 131 may output the bank selection signal BS and the row/column addresses ADDR_R/ADDR_C to both of the first memory bank 111 and the second memory bank 112. The data I/O pad 132 of the PIM device 100 may function as a data communication terminal between a device external to the PIM device 100 and the MAC unit (which includes the first and second memory banks 111 and 112 and the MAC operator 120) included in the PIM device 100. The external device to the PIM device 100 may correspond to the PIM controller 200 of the PIM system 1-1 or a host located outside the PIM system 1-1. Accordingly, data outputted from the host or the PIM controller 200 may be inputted into the PIM device 100 through the data I/O pad 132.

The PIM controller 200 may control operations of the PIM device 100. In an embodiment, the PIM controller 200 may control the PIM device 100 such that the PIM device 100 operates in a memory mode or a MAC mode. In the event that the PIM controller 200 controls the PIM device 100 such that the PIM device 100 operates in the memory mode, the PIM device 100 may perform a data read operation or a data write operation for the first memory bank 111 and the second memory bank 112. In the event that the PIM controller 200 controls the PIM device 100 such that the PIM device 100 operates in the MAC mode, the PIM device 100 may perform a MAC arithmetic operation for the MAC operator 120. In the event that the PIM controller 200 controls the PIM device 100 such that the PIM device 100 operates in the MAC mode, the PIM device 100 may also perform the data read operation and the data write operation for the first and second memory banks 111 and 112 to execute the MAC arithmetic operation.

The PIM controller 200 may be configured to include command queue logic 210, a scheduler 220, a memory command generator 230, a MAC command generator 240, and an address generator 250. The command queue logic 210 may receive a request REQ from an external device (e.g., a host of the PIM system 1-1) and store a command queue corresponding to the request REQ in the command queue logic 210. The command queue logic 210 may transmit information on a storage status of the command queue to the scheduler 220 whenever the command queue logic 210 stores the command queue. The command queue stored in the command queue logic 210 may be transmitted to the memory command generator 230 or the MAC command generator 240 according to a sequence determined by the scheduler 220. When the command queue outputted from the command queue logic 210 includes command information requesting an operation in the memory mode of the PIM device 100, the command queue logic 210 may transmit the command queue to the memory command generator 230. On the other hand, when the command queue outputted from the command queue logic 210 is command information requesting an operation in the MAC mode of the PIM device 100, the command queue logic 210 may transmit the command queue to the MAC command generator 240. Information on whether the command queue relates to the memory mode or the MAC mode may be provided by the scheduler 220.

The scheduler 220 may adjust a timing of the command queue when the command queue stored in the command queue logic 210 is outputted from the command queue logic 210. In order to adjust the output timing of the command queue stored in the command queue logic 210, the scheduler 220 may analyze the information on the storage status of the command queue provided by the command queue logic 210 and may readjust a process sequence of the command queue such that the command queue is processed according to a proper sequence. The scheduler 220 may output and transmit to the command queue logic 210 information on whether the command queue outputted from the command queue logic 210 relates to the memory mode of the PIM device 100 or relates to the MAC mode of the PIM device 100. In order to obtain the information on whether the command queue outputted from the command queue logic 210 relates to the memory mode or the MAC mode, the scheduler 220 may include a mode selector 221. The mode selector 221 may generate a mode selection signal including information on whether the command queue stored in the command queue logic 210 relates to the memory mode or the MAC mode, and the scheduler 220 may transmit the mode selection signal to the command queue logic 210.

The memory command generator 230 may receive the command queue related to the memory mode of the PIM device 100 from the command queue logic 210. The memory command generator 230 may decode the command queue to generate and output the memory command M_CMD. The memory command M_CMD outputted from the memory command generator 230 may be transmitted to the PIM device 100. In an embodiment, the memory command M_CMD may include a memory read command and a memory write command. When the memory read command is outputted from the memory command generator 230, the PIM device 100 may perform the data read operation for the first memory bank 111 or the second memory bank 112. Data which are read out of the PIM device 100 may be transmitted to an external device through the data I/O pad 132. The read data outputted from the PIM device 100 may be transmitted to a host through the PIM controller 200. When the memory write command is outputted from the memory command generator 230, the PIM device 100 may perform the data write operation for the first memory bank 111 or the second memory bank 112. In such a case, data to be written into the PIM device 100 may be transmitted from the host to the PIM device 100 through the PIM controller 200. The write data inputted to the PIM device 100 may be transmitted to the first memory bank 111 or the second memory bank 112 through the data I/O pad 132.

The MAC command generator 240 may receive the command queue related to the MAC mode of the PIM device 100 from the command queue logic 210. The MAC command generator 240 may decode the command queue to generate and output the MAC commands MAC_CMDs. The MAC commands MAC_CMDs outputted from the MAC command generator 240 may be transmitted to the PIM device 100. The data read operation for the first memory bank 111 and the second memory bank 112 of the PIM device 100 may be performed by the MAC commands MAC_CMDs outputted from the MAC command generator 240, and the MAC arithmetic operation of the MAC operator 120 may also be performed by the MAC commands MAC_CMDs outputted from the MAC command generator 240. The MAC commands MAC_CMDs and the MAC arithmetic operation of the PIM device 100 according to the MAC commands MAC_CMDs will be described in detail with reference to FIG. 3.

The address generator 250 may receive address information from the command queue logic 210. The address generator 250 may generate the bank selection signal BS for selecting one of the first and second memory banks 111 and 112 and may transmit the bank selection signal BS to the PIM device 100. In addition, the address generator 250 may generate the row address ADDR_R and the column address ADDR_C for accessing a region (e.g., memory cells) in the first or second memory bank 111 or 112 and may transmit the row address ADDR_R and the column address ADDR_C to the PIM device 100.

Figure 3:
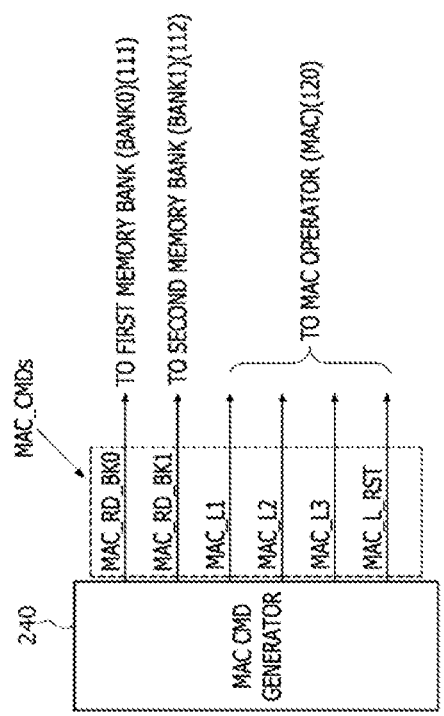
FIG. 3 illustrates MAC commands outputted from a MAC command generator of a PIM controller included in a PIM system according to a first embodiment of the present disclosure.

FIG. 3 illustrates the MAC commands MAC_CMDs outputted from the MAC command generator 240 included in the PIM system 1-1 according to the first embodiment of the present disclosure. As illustrated in FIG. 3, the MAC commands MAC_CMDs may include first to sixth MAC command signals. In an embodiment, the first MAC command signal may be a first MAC read signal MAC_RD_BK0, the second MAC command signal may be a second MAC read signal MAC_RD_BK1, the third MAC command signal may be a first MAC input latch signal MAC_L1, the fourth MAC command signal may be a second MAC input latch signal MAC_L2, the fifth MAC command signal may be a MAC output latch signal MAC_L3, and the sixth MAC command signal may be a MAC latch reset signal MAC_L_RST.

The first MAC read signal MAC_RD_BK0 may control an operation for reading first data (e.g., weight data) out of the first memory bank 111 to transmit the first data to the MAC operator 120. The second MAC read signal MAC_RD_BK1 may control an operation for reading second data (e.g., vector data) out of the second memory bank 112 to transmit the second data to the MAC operator 120. The first MAC input latch signal MAC_L1 may control an input latch operation of the weight data transmitted from the first memory bank 111 to the MAC operator 120. The second MAC input latch signal MAC_L2 may control an input latch operation of the vector data transmitted from the second memory bank 112 to the MAC operator 120. If the input latch operations of the weight data and the vector data are performed, the MAC operator 120 may perform the MAC arithmetic operation to generate MAC result data corresponding to the result of the MAC arithmetic operation. The MAC output latch signal MAC_L3 may control an output latch operation of the MAC result data generated by the MAC operator 120. And, the MAC latch reset signal MAC_L_RST may control an output operation of the MAC result data generated by the MAC operator 120 and a reset operation of an output latch included in the MAC operator 120.

The PIM system 1-1 according to the present embodiment may be configured to perform a deterministic MAC arithmetic operation. The term "deterministic MAC arithmetic operation" used in the present disclosure may be defined as the MAC arithmetic operation performed in the PIM system 1-1 during a predetermined fixed time. Thus, the MAC commands MAC_CMDs transmitted from the PIM controller 200 to the PIM device 100 may be sequentially generated with fixed time intervals. Accordingly, the PIM controller 200 does not require any extra end signals of various operations executed for the MAC arithmetic operation to generate the MAC commands MAC_CMDs for controlling the MAC arithmetic operation. In an embodiment, latencies of the various operations executed by MAC commands MAC_CMDs for controlling the MAC arithmetic operation may be set to have fixed values in order to perform the deterministic MAC arithmetic operation. In such a case, the MAC commands MAC_CMDs may be sequentially outputted from the PIM controller 200 with fixed time intervals corresponding to the fixed latencies.

For example, the MAC command generator 240 is configured to output the first MAC command at a first point in time. The MAC command generator 240 is configured to output the second MAC command at a second point in time when a first latency elapses from the first point in time. The first latency is set as the time it takes to read the first data out of the first storage region based on the first MAC command and to output the first data to the MAC operator. The MAC command generator 240 is configured to output the third MAC command at a third point in time when a second latency elapses from the second point in time. The second latency is set as the time it takes to read the second data out of the second storage region based on the second MAC command and to output the second data to the MAC operator. The MAC command generator 240 is configured to output the fourth MAC command at a fourth point in time when a third latency elapses from the third point in time. The third latency is set as the time it takes to latch the first data in the MAC operator based on the third MAC command. The MAC command generator 240 is configured to output the fifth MAC command at a fifth point in time when a fourth latency elapses from the fourth point in time. The fourth latency is set as the time it takes to latch the second data in the MAC operator based on the fourth MAC command and to perform the MAC arithmetic operation of the first and second data which are latched in the MAC operator. The MAC command generator 240 is configured to output the sixth MAC command at a sixth point in time when a fifth latency elapses from the fifth point in time. The fifth latency is set as the time it takes to perform an output latch operation of MAC result data generated by the MAC arithmetic operation.

Figure 4:
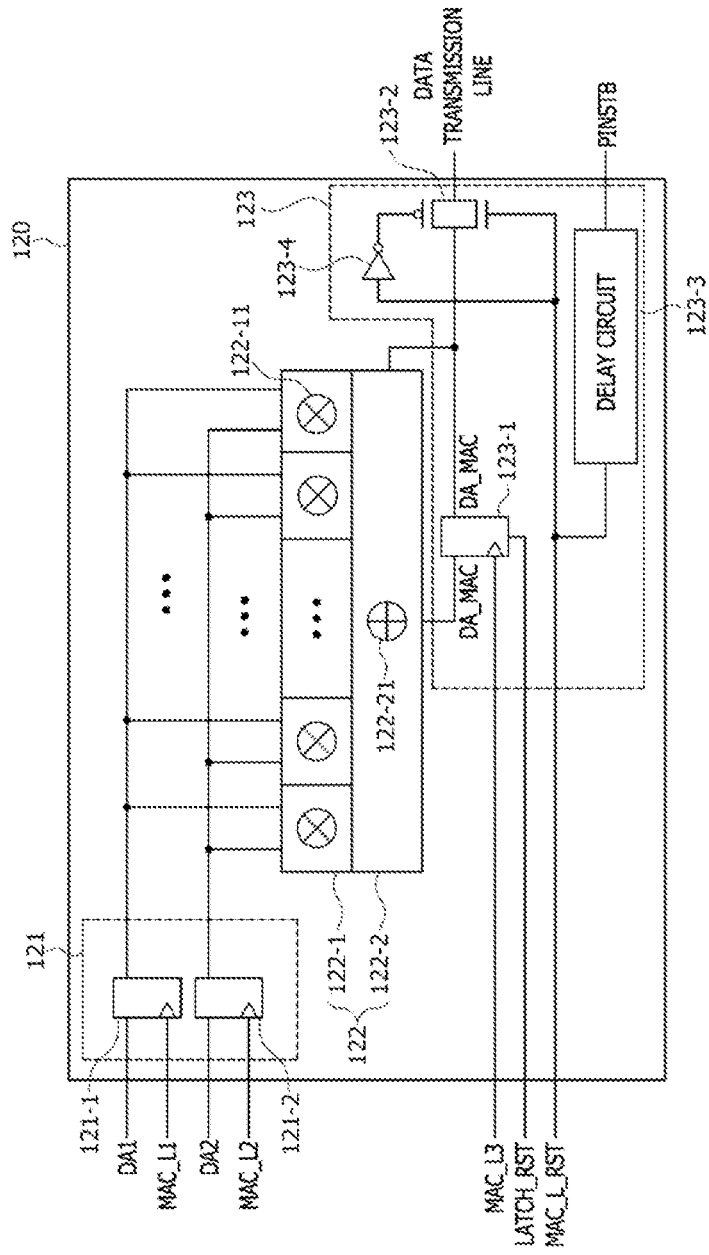
FIG. 4 is a block diagram illustrating an example of a configuration of a MAC operator of a PIM device included in a PIM system according to a first embodiment of the present disclosure.

FIG. 4 illustrates an example of the MAC operator 120 of the PIM device 100 included in the PIM system 1-1 according to the first embodiment of the present disclosure. Referring to FIG. 4, MAC operator 120 may be configured to include a data input circuit 121, a MAC circuit 122, and a data output circuit 123. The data input circuit 121 may include a first input latch 121-1 and a second input latch 121-2. The MAC circuit 122 may include a multiplication logic circuit 122-1 and an addition logic circuit 122-2. The data output circuit 123 may include an output latch 123-1, a transfer gate 123-2, a delay circuit 123-3, and an inverter 123-4. In an embodiment, the first input latch 121-1, the second input latch 121-2, and the output latch 123-1 may be realized using flip-flops.

The data input circuit 121 of the MAC operator 120 may be synchronized with the first MAC input latch signal MAC_L1 to latch first data DA1 transferred from the first memory bank 111 to the MAC circuit 122 through an internal data transmission line. In addition, the data input circuit 121 of the MAC operator 120 may be synchronized with the second MAC input latch signal MAC_L2 to latch second data DA2 transferred from the second memory bank 112 to the MAC circuit 122 through another internal data transmission line. Because the first MAC input latch signal MAC_L1 and the second MAC input latch signal MAC_L2 are sequentially transmitted from the MAC command generator 240 of the PIM controller 200 to the MAC operator 120 of the PIM device 100 with a predetermined time interval, the second data DA2 may be inputted to the MAC circuit 122 of the MAC operator 120 after the first data DA1 is inputted to the MAC circuit 122 of the MAC operator 120.

The MAC circuit 122 may perform the MAC arithmetic operation of the first data DA1 and the second data DA2 inputted through the data input circuit 121. The multiplication logic circuit 122-1 of the MAC circuit 122 may include a plurality of multipliers 122-11. Each of the multipliers 122-11 may perform a multiplying calculation of the first data DA1 outputted from the first input latch 121-1 and the second data DA2 outputted from the second input latch 121-2 and may output the result of the multiplying calculation. Bit values constituting the first data DA1 may be separately inputted to the multipliers 122-11. Similarly, bit values constituting the second data DA2 may also be separately inputted to the multipliers 122-11. For example, if the first data DA1 is represented by an 'N'-bit binary stream, the second data DA2 is represented by an 'N'-bit binary stream, and the number of the multipliers 122-11 is 'M', then 'N/M'-bit portions of the first data DA1 and 'N/M'-bit portions of the second data DA2 may be inputted to each of the multipliers 122-11.

The addition logic circuit 122-2 of the MAC circuit 122 may include a plurality of adders 122-21. Although not shown in the drawings, the plurality of adders 122-21 may be disposed to provide a tree structure including a plurality of stages. Each of the adders 122-21 disposed at a first stage may receive two sets of multiplication result data from two of the multipliers 122-11 included in the multiplication logic circuit 122-1 and may perform an adding calculation of the two sets of multiplication result data to output the addition result data. Each of the adders 122-21 disposed at a second stage may receive two sets of addition result data from two of the adders 122-21 disposed at the first stage and may perform an adding calculation of the two sets of addition result data to output the addition result data. The adder 122-21 disposed at a last stage may receive two sets of addition result data from two adders 122-21 disposed at the previous stage and may perform an adding calculation of the two sets of addition result data to output the addition result data. Although not shown in the drawings, the addition logic circuit 122-2 may further include an additional adder for performing an accumulative adding calculation of MAC result data DA_MAC outputted from the adder 122-21 disposed at the last stage and previous MAC result data DA_MAC stored in the output latch 123-1 of the data output circuit 123.

The data output circuit 123 may output the MAC result data DA_MAC outputted from the MAC circuit 122 to a data transmission line. Specifically, the output latch 123-1 of the data output circuit 123 may be synchronized with the MAC output latch signal MAC_L3 to latch the MAC result data DA_MAC outputted from the MAC circuit 122 and to output the latched data of the MAC result data DA_MAC. The MAC result data DA_MAC outputted from the output latch 123-1 may be fed back to the MAC circuit 122 for the accumulative adding calculation. In addition, the MAC result data DA_MAC may be inputted to the transfer gate 123-2. The output latch 123-1 may be initialized if a latch reset signal LATCH_RST is inputted to the output latch 123-1. In such a case, all of data latched by the output latch 123-1 may be removed. In an embodiment, the latch reset signal LATCH_RST may be activated by generation of the MAC latch reset signal MAC_L_RST and may be inputted to the output latch 123-1.

The MAC latch reset signal MAC_L_RST outputted from the MAC command generator 240 may be inputted to the transfer gate 123-2, the delay circuit 123-3, and the inverter 123-4. The inverter 123-4 may inversely buffer the MAC latch reset signal MAC_L_RST to output the inversely buffered signal of the MAC latch reset signal MAC_L_RST to the transfer gate 123-2. The transfer gate 123-2 may transfer the MAC result data DA_MAC from the output latch 123-1 to the data transmission line in response to the MAC latch reset signal MAC_L_RST. The delay circuit 123-3 may delay the MAC latch reset signal MAC_L_RST by a certain time to generate and output a latch control signal PINSTB.

FIG. 5 illustrates an example of the MAC arithmetic operation performed in the PIM system 1-1 according to the first embodiment of the present disclosure. As illustrated in FIG. 5, the MAC arithmetic operation performed by the PIM system 1-1 may be executed though a matrix calculation. Specifically, the PIM device 100 may execute a matrix multiplying calculation of an 'M×N' weight matrix (e.g., '8×8' weight matrix) and a 'N×1' vector matrix (e.g., '8×1' vector matrix) according to control of the PIM controller 200 (where, 'M' and 'N' are natural numbers). Elements W0.0, . . . , and W7.7 constituting the weight matrix may correspond to the first data DA1 inputted to the MAC operator 120 from the first memory bank 111. Elements X0.0, . . . , and X7.0 constituting the vector matrix may correspond to the second data DA2 inputted to the MAC operator 120 from the second memory bank 112. Each of the elements W0.0, . . . , and W7.7 constituting the weight matrix may be represented by a binary stream having a plurality of bit values. In addition, each of the elements X0.0, . . . , and X7.0 constituting the vector matrix may also be represented by a binary stream having a plurality of bit values. The number of bits included in each of the elements W0.0, . . . , and W7.7 constituting the weight matrix may be equal to the number of bits included in each of the elements X0.0, . . . , and X7.0 constituting the vector matrix.

The matrix multiplying calculation of the weight matrix and the vector matrix may be appropriate for a multilayer perceptron-type neural network structure (hereinafter, referred to as an 'MLP-type neural network'). In general, the MLP-type neural network for executing deep learning may include an input layer, a plurality of hidden layers (e.g., at least three hidden layers), and an output layer. The matrix multiplying calculation (i.e., the MAC arithmetic operation) of the weight matrix and the vector matrix illustrated in FIG. 5 may be performed in one of the hidden layers. In a first hidden layer of the plurality of hidden layers, the MAC arithmetic operation may be performed using vector data inputted to the first hidden layer. However, in each of second to last hidden layers among the plurality of hidden layers, the MAC arithmetic operation may be performed using a calculation result of the previous hidden layer as the vector data.

FIG. 6 is a flowchart illustrating processes of the MAC arithmetic operation described with reference to FIG. 5, which are performed in the PIM system 1-1 according to the first embodiment of the present disclosure. In addition, FIGS. 7 to 13 are block diagrams illustrating the processes of the MAC arithmetic operation illustrated in FIG. 5, which are performed in the PIM system 1-1 according to the first embodiment of the present disclosure. Referring to FIGS. 6 to 13, before the MAC arithmetic operation is performed, the first data (i.e., the weight data) may be written into the first memory bank 111 at a step 301. Thus, the weight data may be stored in the first memory bank 111 of the PIM device 100. In the present embodiment, it may be assumed that the weight data are the elements W0.0, . . . , and W7.7 constituting the weight matrix of FIG. 5. The integer before the decimal point is one less than a row number, and the integer after the decimal point is one less than a column number. Thus, for example, the weight W0.0 represents the element of the first row and the first column of the weight matrix.

At a step 302, whether an inference is requested may be determined. An inference request signal may be transmitted from an external device located outside of the PIM system 1-1 to the PIM controller 200 of the PIM system 1-1. An inference request, in some instances, may be based on user input. An inference request may initiate a calculation performed by the PIM system 1-1 to reach a determination based on input data. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 200 at the step 302, then the PIM controller 200 may write the vector data transmitted with the inference request signal into the second memory bank 112 at a step 303. Accordingly, the vector data may be stored in the second memory bank 112 of the PIM device 100.

Figure 7:
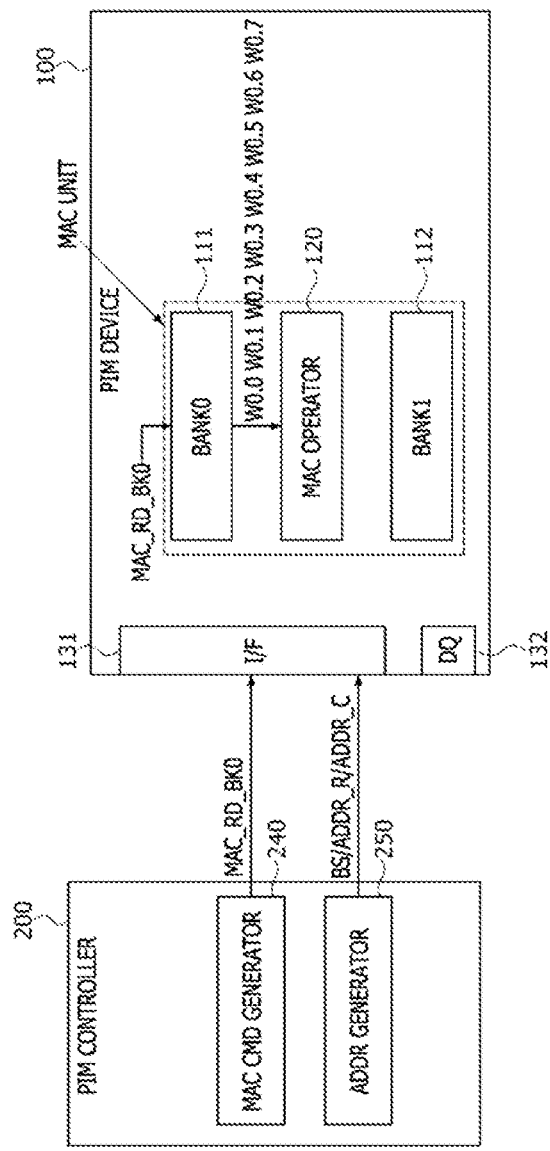
FIGS. 7 to 13 are block diagrams illustrating processes of the MAC arithmetic operation illustrated in FIG. 5 in a PIM system according to a first embodiment of the present disclosure.

At a step 304, the MAC command generator 240 of the PIM controller 200 may generate and transmit the first MAC read signal MAC_RD_BK0 to the PIM device 100, as illustrated in FIG. 7. In such a case, the address generator 250 of the PIM controller 200 may generate and transmit the bank selection signal BS and the row/column address ADDR_R/ADDR_C to the PIM device 100. The bank selection signal BS may be generated to select the first memory bank 111 of the first and second memory banks 111 and 112. Thus, the first MAC read signal MAC_RD_BK0 may control the data read operation for the first memory bank 111 of the PIM device 100. The first memory bank 111 may output and transmit the elements W0.0, . . . , and W0.7 in the first row of the weight matrix of the weight data stored in a region of the first memory bank 111, which is selected by the row/column address ADDR_R/ADDR_C, to the MAC operator 120 in response to the first MAC read signal MAC_RD_BK0. In an embodiment, the data transmission from the first memory bank 111 to the MAC operator 120 may be executed through a global input/output (hereinafter, referred to as 'GIO') line which is provided as a data transmission path in the PIM device 100. Alternatively, the data transmission from the first memory bank 111 to the MAC operator 120 may be executed through a first bank input/output (hereinafter, referred to as 'BIO') line which is provided specifically for data transmission between the first memory bank 111 and the MAC operator 120.

Figure 8:
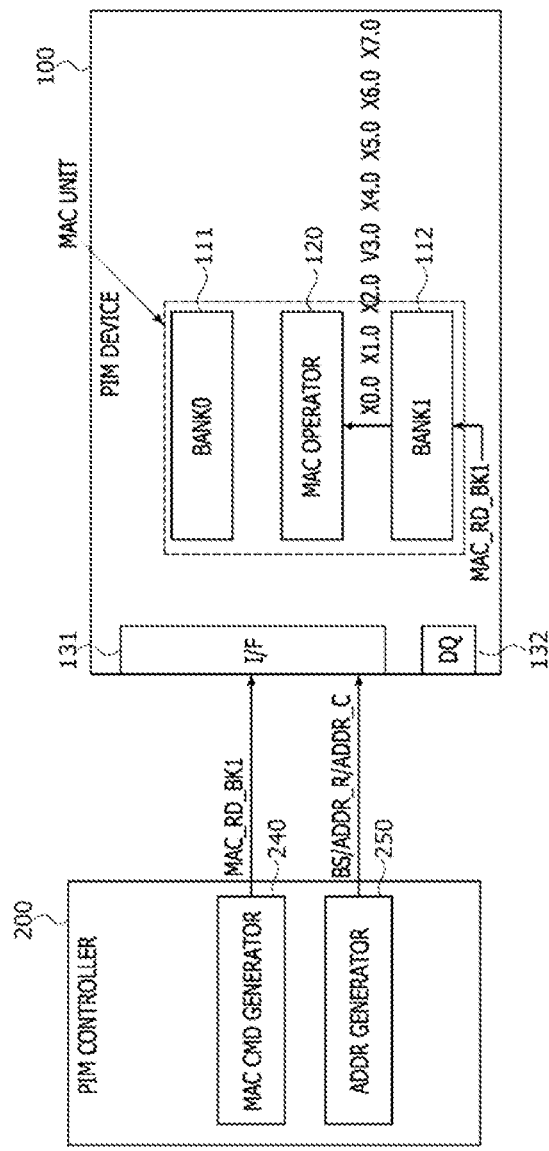

At a step 305, the MAC command generator 240 of the PIM controller 200 may generate and transmit the second MAC read signal MAC_RD_BK1 to the PIM device 100, as illustrated in FIG. 8. In such a case, the address generator 250 of the PIM controller 200 may generate and transmit the bank selection signal BS for selecting the second memory bank 112 and the row/column address ADDR_R/ADDR_C to the PIM device 100. The second MAC read signal MAC_RD_BK1 may control the data read operation for the second memory bank 112 of the PIM device 100. The second memory bank 112 may output and transmit the elements X0.0, . . . , and X7.0 in the first column of the vector matrix corresponding to the vector data stored in a region of the second memory bank 112, which is selected by the row/column address ADDR_R/ADDR_C, to the MAC operator 120 in response to the second MAC read signal MAC_RD_BK1. In an embodiment, the data transmission from the second memory bank 112 to the MAC operator 120 may be executed through the GIO line in the PIM device 100. Alternatively, the data transmission from the second memory bank 112 to the MAC operator 120 may be executed through a second BIO line which is provided specifically for data transmission between the second memory bank 112 and the MAC operator 120.

Figure 9:
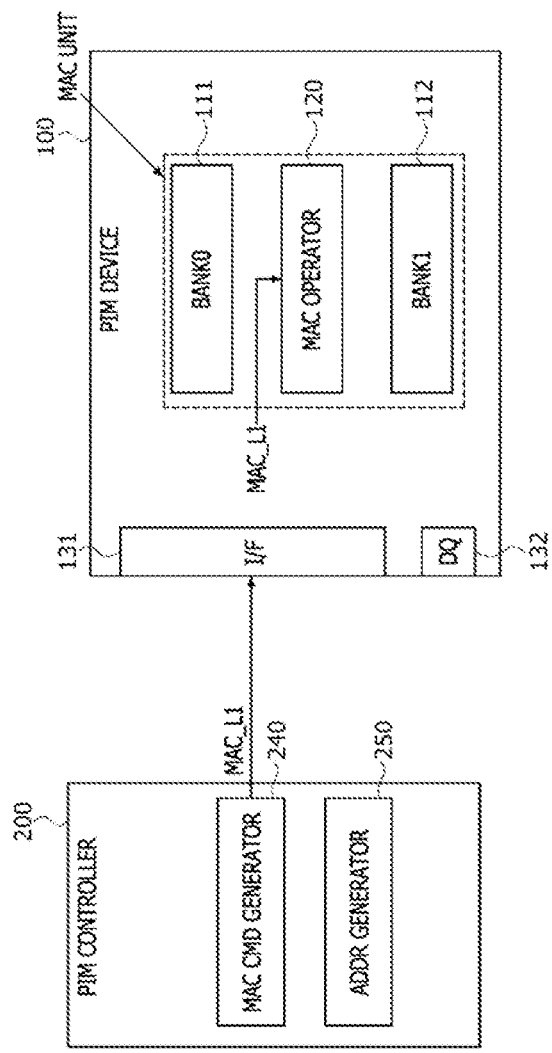
Figure 11:
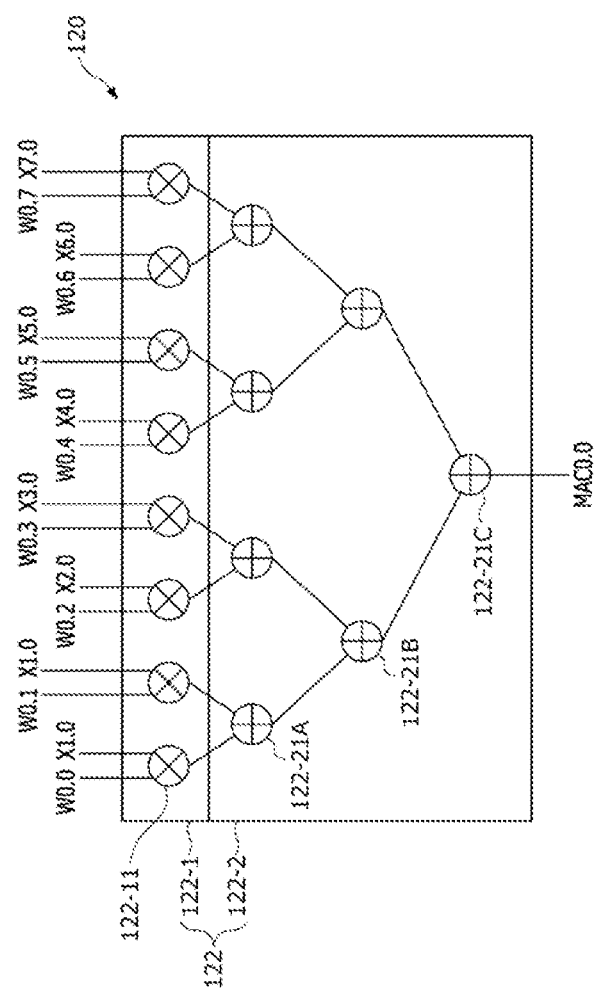

At a step 306, the MAC command generator 240 of the PIM controller 200 may generate and transmit the first MAC input latch signal MAC_L1 to the PIM device 100, as illustrated in FIG. 9. The first MAC input latch signal MAC_L1 may control the input latch operation of the first data for the MAC operator 120 of the PIM device 100. The elements W0.0, . . . , and W0.7 in the first row of the weight matrix may be inputted to the MAC circuit 122 of the MAC operator 120 by the input latch operation, as illustrated in FIG. 11. The MAC circuit 122 may include the plurality of multipliers 122-11 (e.g., eight multipliers 122-11), the number of which is equal to the number of columns of the weight matrix. In such a case, the elements W0.0, . . . , and W0.7 in the first row of the weight matrix may be inputted to the eight multipliers 122-11, respectively.

Figure 10:
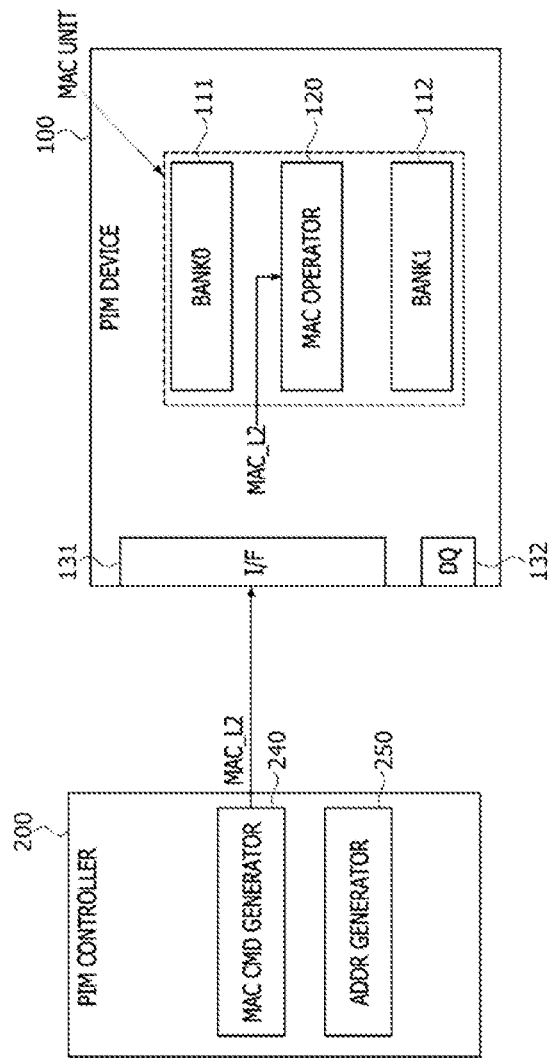

At a step 307, the MAC command generator 240 of the PIM controller 200 may generate and transmit the second MAC input latch signal MAC_L2 to the PIM device 100, as illustrated in FIG. 10. The second MAC input latch signal MAC_L2 may control the input latch operation of the second data for the MAC operator 120 of the PIM device 100. The elements X0.0, ..., and X7.0 in the first column of the vector matrix may be inputted to the MAC circuit 122 of the MAC operator 120 by the input latch operation, as illustrated in FIG. 11. In such a case, the elements X0.0, ..., and X7.0 in the first column of the vector matrix may be inputted to the eight multipliers 122-11, respectively.

At a step 308, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. For example, the scalar product is calculated of the Rth '1×N' row vector of the 'M×N' weight matrix and the 'N×1' vector matrix as an 'R×1' element of the 'M×1' MAC result matrix. For R=1, the scalar product of the first row of the weight matrix and the first column of the vector matrix shown in FIG. 5 is W0.0*X0.0+W0.1*X1.0+W0.2*X2.0+W0.3*X3.0+W0.4*X4.0+W0.5*X5.0+W0.6*X6.0+W0.7*X7.0. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2, as illustrated in FIG. 11, may include four adders 122-21A disposed at a first stage, two adders 122-21B disposed at a second stage, and an adder 122-21C disposed at a third stage.

Each of the adders 122-21A disposed at the first stage may receive output data of two of the multipliers 122-11 and may perform an adding calculation of the output data of the two multipliers 122-11 to output the result of the adding calculation. Each of the adders 122-21B disposed at the second stage may receive output data of two of the adders 122-21A disposed at the first stage and may perform an adding calculation of the output data of the two adders 122-21A to output the result of the adding calculation. The adder 122-21C disposed at the third stage may receive output data of two of the adders 122-21B disposed at the second stage and may perform an adding calculation of the output data of the two adders 122-21B to output the result of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to an element MAC0.0 located at a first row of an '8×1' MAC result matrix having eight elements of MAC0.0, ..., and MAC7.0, as illustrated in FIG. 5. The output data MAC0.0 of the addition logic circuit 122-2 may be inputted to the output latch 123-1 disposed in the data output circuit 123 of the MAC operator 120, as described with reference to FIG. 4.

Figure 12:
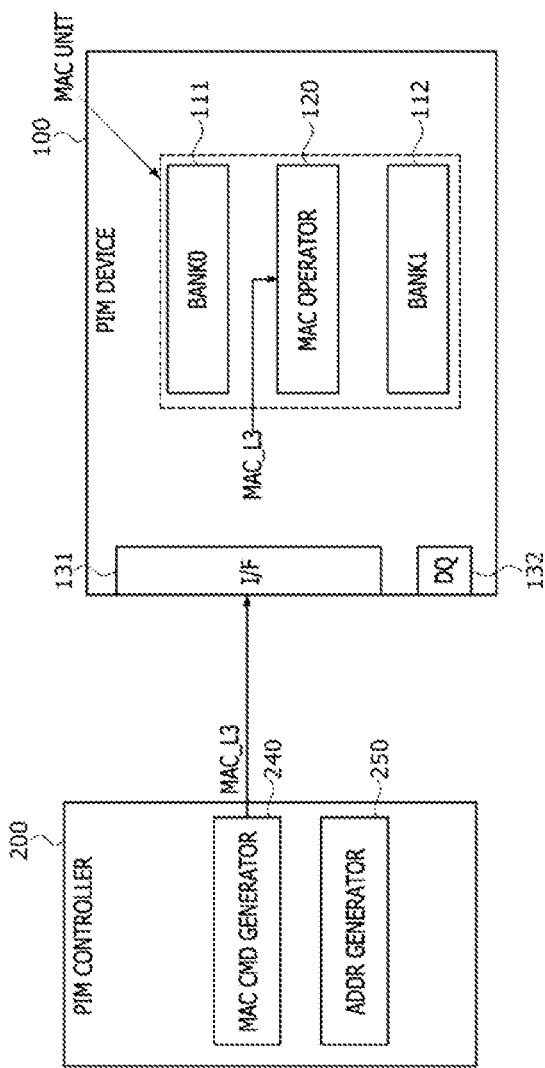

At a step 309, the MAC command generator 240 of the PIM controller 200 may generate and transmit the MAC output latch signal MAC_L3 to the PIM device 100, as illustrated in FIG. 12. The MAC output latch signal MAC_L3 may control the output latch operation of the MAC result data MAC0.0 performed by the MAC operator 120 of the PIM device 100. The MAC result data MAC0.0 inputted from the MAC circuit 122 of the MAC operator 120 may be outputted from the output latch 123-1 in synchronization with the MAC output latch signal MAC_L3, as described with reference to FIG. 4. The MAC result data MAC0.0 outputted from the output latch 123-1 may be inputted to the transfer gate 123-2 of the data output circuit 123.

Figure 13:
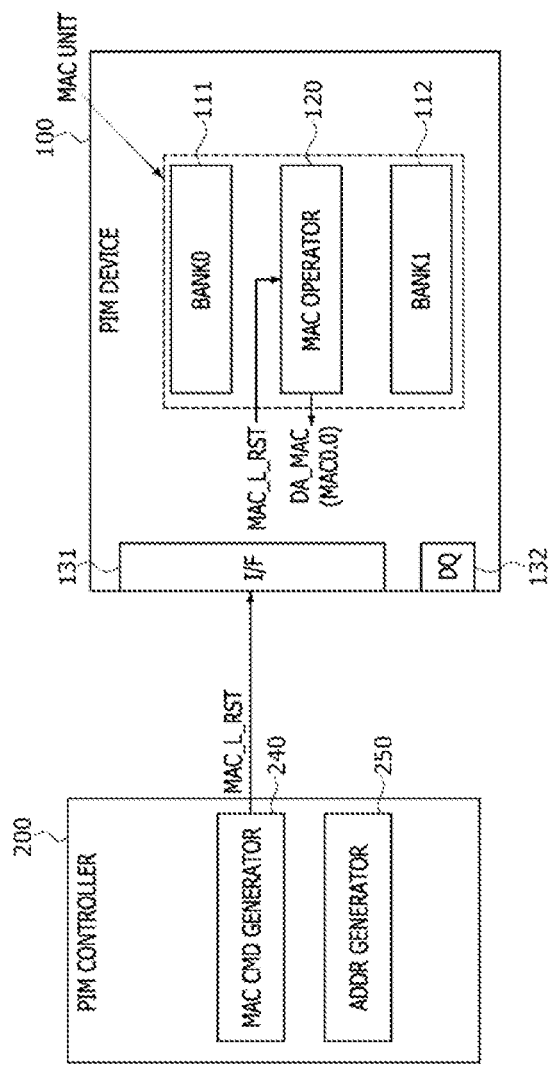

At a step 310, the MAC command generator 240 of the PIM controller 200 may generate and transmit the MAC latch reset signal MAC_L_RST to the PIM device 100, as illustrated in FIG. 13. The MAC latch reset signal MAC_L_RST may control an output operation of the MAC result data MAC0.0 generated by the MAC operator 120 and a reset operation of the output latch included in the MAC operator 120. As described with reference to FIG. 4, the transfer gate 123-2 receiving the MAC result data MAC0.0 from the output latch 123-1 of the MAC operator 120 may be synchronized with the MAC latch reset signal MAC_L_RST to output the MAC result data MAC0.0. In an embodiment, the MAC result data MAC0.0 outputted from the MAC operator 120 may be stored into the first memory bank 111 or the second memory bank 112 through the first BIO line or the second BIO line in the PIM device 100.

At a step 311, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 311. At a step 312, whether the row number changed at the step 311 is greater than the row number of the last row (i.e., the eighth row of the current example) of the weight matrix may be determined. Because the row number of the weight matrix is changed to '2' at the step 311, a process of the MAC arithmetic operation may be fed back to the step 304.

If the process of the MAC arithmetic operation is fed back to the step 304 from the step 312, then the same processes as described with reference to the steps 304 to 310 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 304 at the step 312, then the processes from the step 304 to the step 311 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 311, the MAC arithmetic operation may terminate because the row number of '9' is greater than the last row number of '8' at the step 312.

Figure 14:
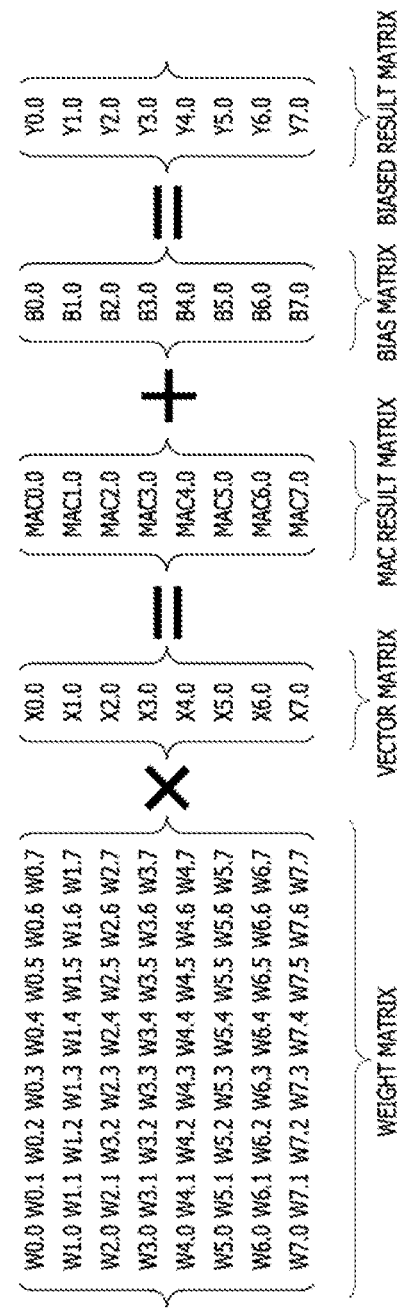
FIG. 14 illustrates another example of a MAC arithmetic operation performed in a PIM system according to a first embodiment of the present disclosure.

FIG. 14 illustrates another example of a MAC arithmetic operation performed in the PIM system 1-1 according to the first embodiment of the present disclosure. As illustrated in FIG. 14, the MAC arithmetic operation performed by the PIM system 1-1 may further include an adding calculation of the MAC result matrix and a bias matrix. Specifically, as described with reference to FIG. 5, the PIM device 100 may execute the matrix multiplying calculation of the '8×8' weight matrix and the '8×1' vector matrix according to control of the PIM controller 200. As a result of the matrix multiplying calculation of the '8×8' weight matrix and the '8×1' vector matrix, the '8×1' MAC result matrix having the eight elements MAC0.0, . . . , and MAC7.0 may be generated. The '8×1' MAC result matrix may be added to a '8×1' bias matrix. The '8×1' bias matrix may have elements B0.0, . . . , and B7.0 corresponding to bias data. The bias data may be set to reduce an error of the MAC result matrix. As a result of the adding calculation of the MAC result matrix and the bias matrix, a '8×1' biased result matrix having eight elements Y0.0, . . . , and Y7.0 may be generated.

Figure 15:
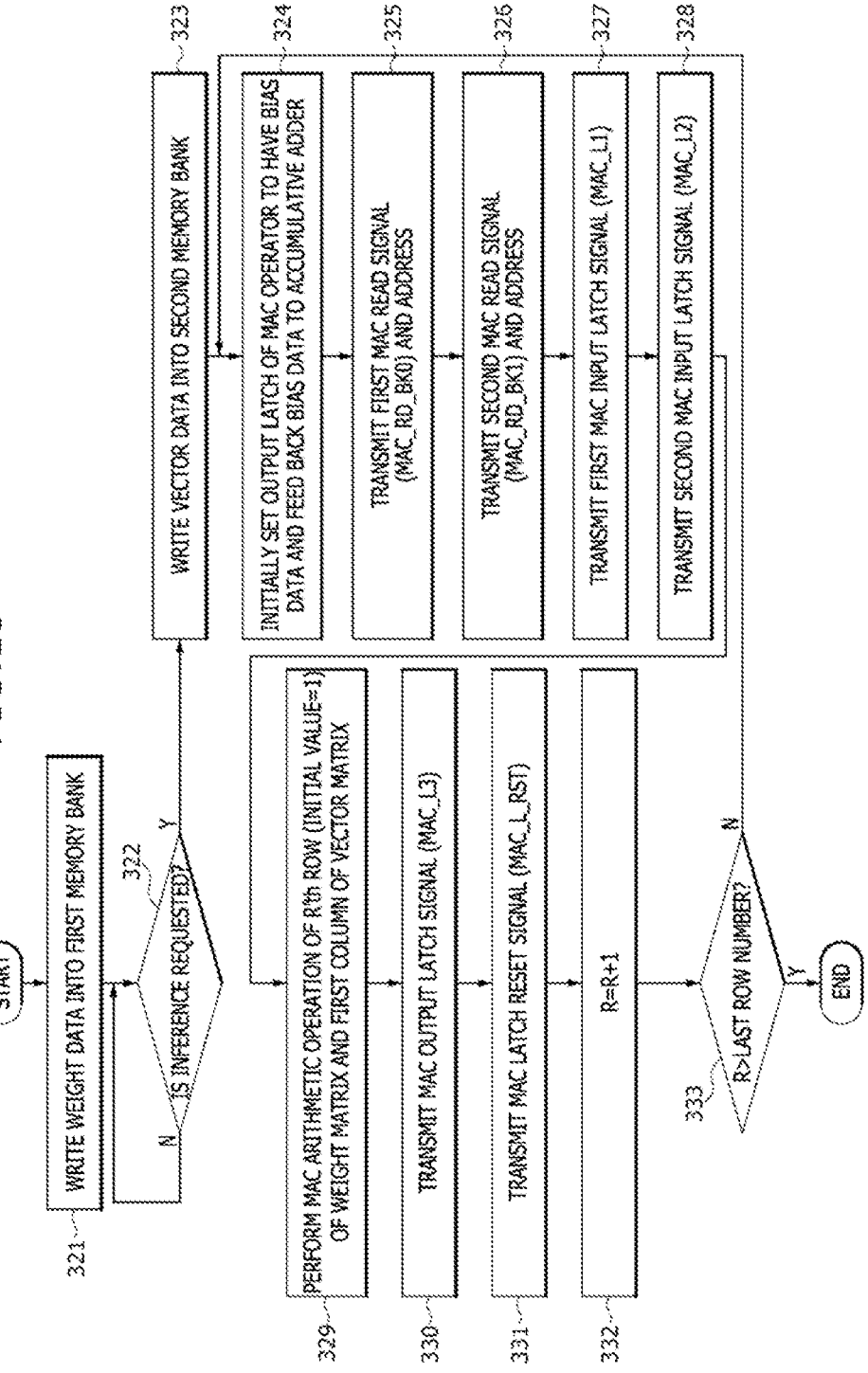
FIG. 15 is a flowchart illustrating processes of the MAC arithmetic operation illustrated in FIG. 14 in a PIM system according to a first embodiment of the present disclosure.
Figure 16:
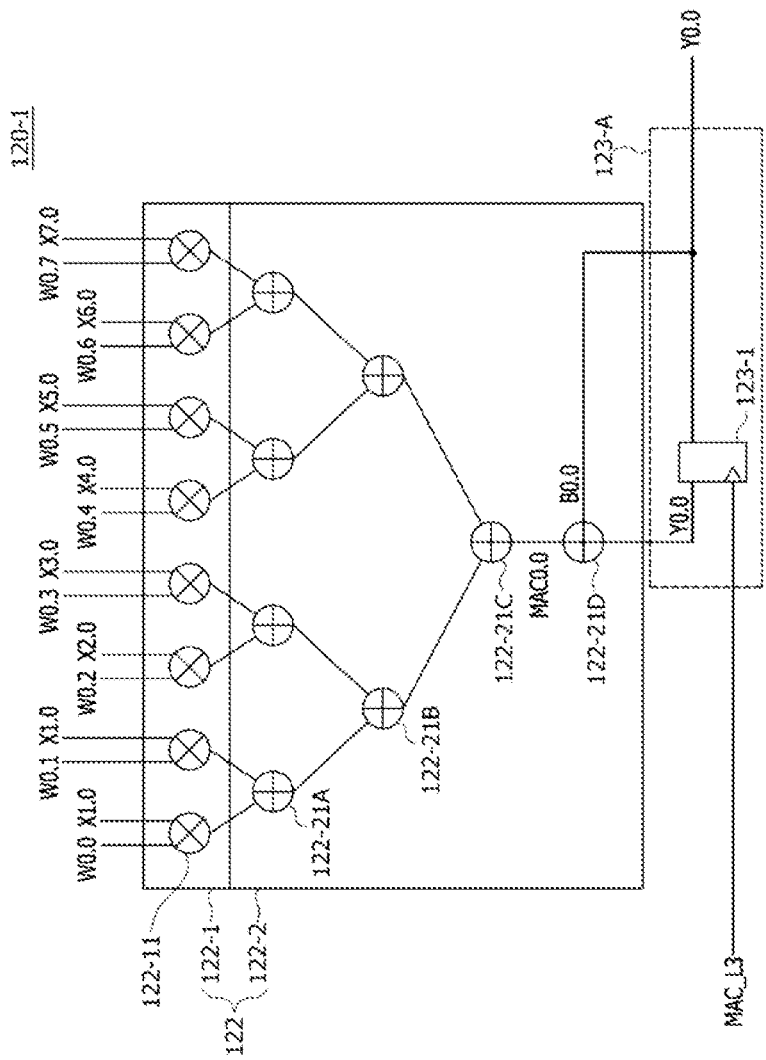
FIG. 16 illustrates an example of a configuration of a MAC operator for performing the MAC arithmetic operation of FIG. 14 in a PIM system according to a first embodiment of the present disclosure.

FIG. 15 is a flowchart illustrating processes of the MAC arithmetic operation described with reference to FIG. 14 in the PIM system 1-1 according to the first embodiment of the present disclosure. Moreover, FIG. 16 illustrates an example of a configuration of a MAC operator 120-1 for performing the MAC arithmetic operation of FIG. 14 in the PIM system 1-1 according to the first embodiment of the present disclosure. In FIG. 16, the same reference numerals or the same reference symbols as used in FIG. 4 denote the same elements, and the detailed descriptions of the same elements as indicated in the previous embodiment will be omitted hereinafter. Referring to FIG. 15, the first data (i.e., the weight data) may be written into the first memory bank 111 at a step 321 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 14.

At a step 322, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 200 at the step 322, the PIM controller 200 may write the vector data transmitted with the inference request signal into the second memory bank 112 at a step 323. Accordingly, the vector data may be stored in the second memory bank 112 of the PIM device 100.

At a step 324, the output latch of the MAC operator may be initially set to have the bias data and the initially set bias data may be fed back to an accumulative adder of the MAC operator. This process is executed to perform the matrix adding calculation of the MAC result matrix and the bias matrix, which is described with reference to FIG. 14. In other words, the output latch 123-1 in the data output circuit 123-A of the MAC operator (120-1) is set to have the bias data. Because the matrix multiplying calculation is executed for the first row of the weight matrix, the output latch 123-1 may be initially set to have the element B0.0 located at a cross point of the first row and the first column of the bias matrix as the bias data. The output latch 123-1 may output the bias data B0.0, and the bias data B0.0 outputted from the output latch 123-1 may be inputted to the accumulative adder 122-21D of the addition logic circuit 122-2, as illustrated in FIG. 16.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-1 of the PIM device 100. When a subsequent MAC arithmetic operation is performed, the accumulative adder 122-21D of the MAC operator 120-1 may add the MAC result data MAC0.0 outputted from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be outputted from the output latch 123-1 in synchronization with the MAC output latch signal MAC_L3 transmitted in a subsequent process.

In a step 325, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 325 may be executed in the same way as described with reference to FIG. 7. In a step 326, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 326 may be executed in the same way as described with reference to FIG. 8.

At a step 327, the MAC command generator 240 of the PIM controller 200 may generate and transmit the first MAC input latch signal MAC_L1 to the PIM device 100. The step 327 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 328, the MAC command generator 240 of the PIM controller 200 may generate and transmit the second MAC input latch signal MAC_L2 to the PIM device 100. The step 328 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 329, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 16. The accumulative adder 122-21D may add output data of the adder 122-21C to feedback data fed back from the output latch 123-1 to output the result of the adding calculation. The output data of the adder 122-21C may be the matrix multiplying result MAC0.0, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be inputted to the output latch 123 disposed in a data output circuit 123-A of the MAC operator 120-1.

At a step 330, the MAC command generator 240 of the PIM controller 200 may generate and transmit the MAC output latch signal MAC_L3 to the PIM device 100. The step 330 may be executed in the same way as described with reference to FIG. 12. The MAC output latch signal MAC_L3 may control the output latch operation of the MAC result data MAC0.0, which is performed by the MAC operator 120-1 of the PIM device 100. The biased result data Y0.0 transmitted from the MAC circuit 122 of the MAC operator 120 to the output latch 123-1 may be outputted from the output latch 123-1 in synchronization with the MAC output latch signal MAC_L3. The biased result data Y0.0 outputted from the output latch 123 may be inputted to the transfer gate 123-2.

At a step 331, the MAC command generator 240 of the PIM controller 200 may generate and transmit the MAC latch reset signal MAC_L_RST to the PIM device 100. The step 331 may be executed in the same way as described with reference to FIG. 13. The MAC latch reset signal MAC_L_RST may control an output operation of the biased result data Y0.0 generated by the MAC operator 120 and a reset operation of the output latch 123-1 included in the MAC operator 120. The transfer gate 123-2 receiving the biased result data Y0.0 from the output latch 123-1 of the data output circuit 123-A included in the MAC operator 120 may be synchronized with the MAC latch reset signal MAC_L_RST to output the biased result data Y0.0. In an embodiment, the biased result data Y0.0 outputted from the MAC operator 120 may be stored into the first memory bank 111 or the second memory bank 112 through the first BIO line or the second BIO line in the PIM device 100.

At a step 332, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 332. At a step 333, whether the row number changed at the step 332 is greater than the row number of the last row (i.e., the eighth row of the current example) of the weight matrix may be determined. Because the row number of the weight matrix is changed to '2' at the step 332, a process of the MAC arithmetic operation may be fed back to the step 324.

If the process of the MAC arithmetic operation is fed back to the step 324 from the step 333, then the same processes as described with reference to the steps 324 to 331 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix and the bias data B0.0 in the output latch 123-1 initially set at the step 324 may be changed into the bias data B1.0. If the process of the MAC arithmetic operation is fed back to the step 324 at the step 333, the processes from the step 324 to the step 332 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 332, the MAC arithmetic operation may terminate because the row number of '9' is greater than the last row number of '8' at the step 333.

Figure 17:
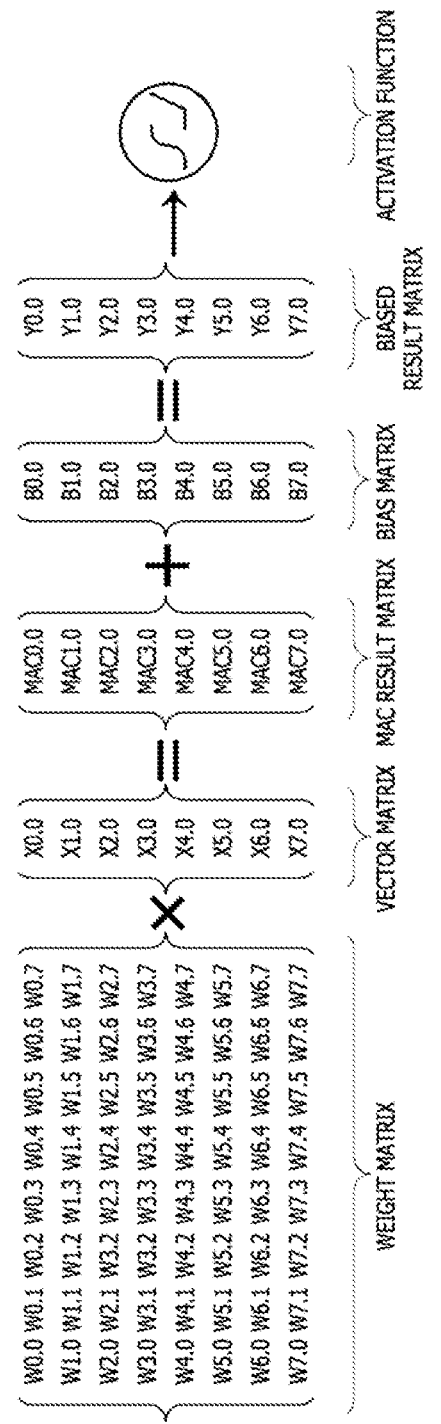
FIG. 17 illustrates yet another example of a MAC arithmetic operation performed in a PIM system according to a first embodiment of the present disclosure.

FIG. 17 illustrates yet another example of a MAC arithmetic operation performed in the PIM system 1-1 according to the first embodiment of the present disclosure. As illustrated in FIG. 17, the MAC arithmetic operation performed by the PIM system 1-1 may further include a process for applying the biased result matrix to an activation function. Specifically, as described with reference to FIG. 14, the PIM device 100 may execute the matrix multiplying calculation of the '8×8' weight matrix and the '8×1' vector matrix according to control of the PIM controller 200 to generate the MAC result matrix. In addition, the MAC result matrix may be added to the bias matrix to generate biased result matrix.

The biased result matrix may be applied to the activation function. The activation function means a function which is used to calculate a unique output value by comparing a MAC calculation value with a critical value in an MLP-type neural network. In an embodiment, the activation function may be a unipolar activation function which generates only positive output values or a bipolar activation function which generates negative output values as well as positive output values. In different embodiments, the activation function may include a sigmoid function, a hyperbolic tangent (Tan h) function, a rectified linear unit (ReLU) function, a leaky ReLU function, an identity function, and a maxout function.

Figure 18:
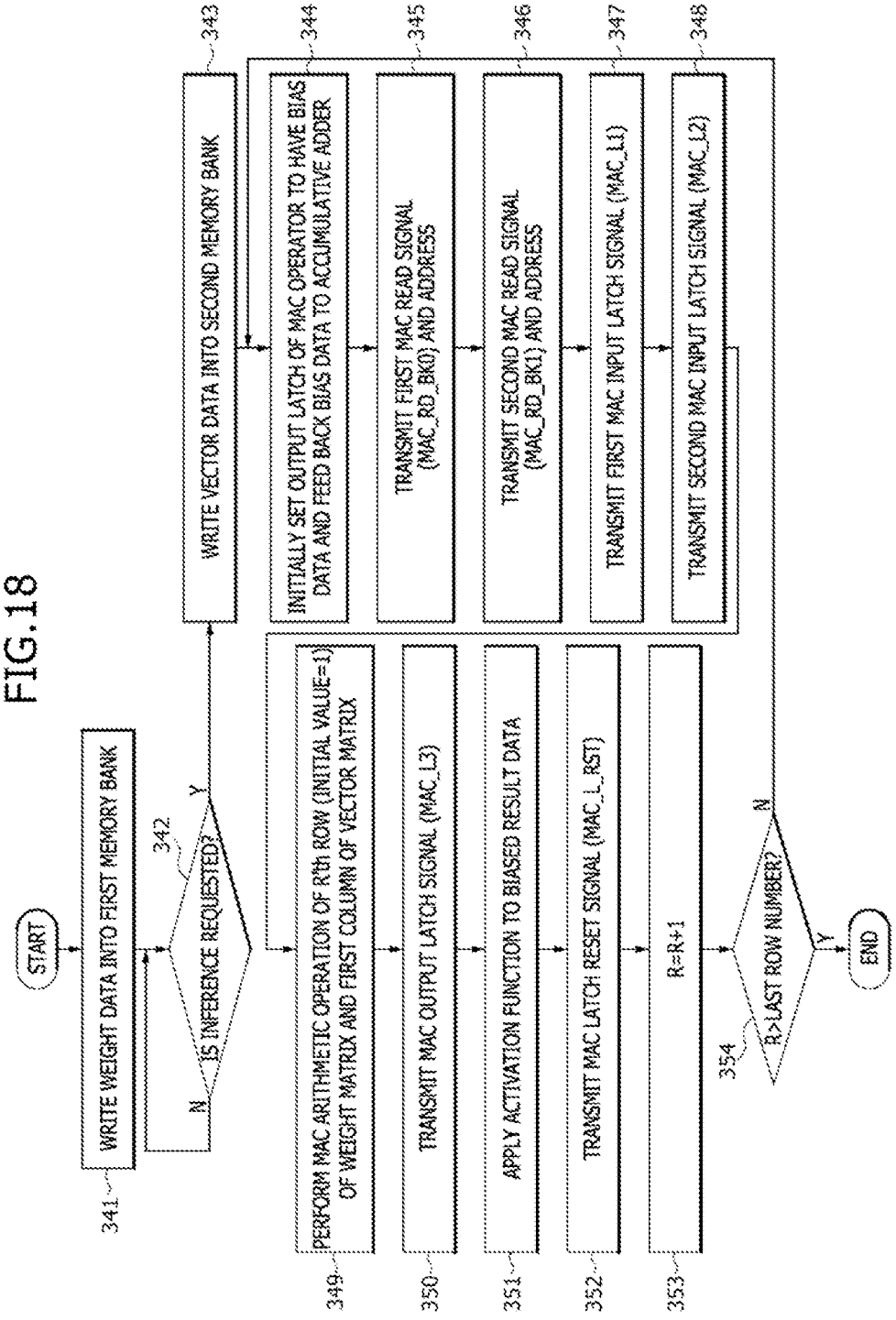
FIG. 18 is a flowchart illustrating processes of the MAC arithmetic operation illustrated in FIG. 17 in a PIM system according to a first embodiment of the present disclosure.
Figure 19:
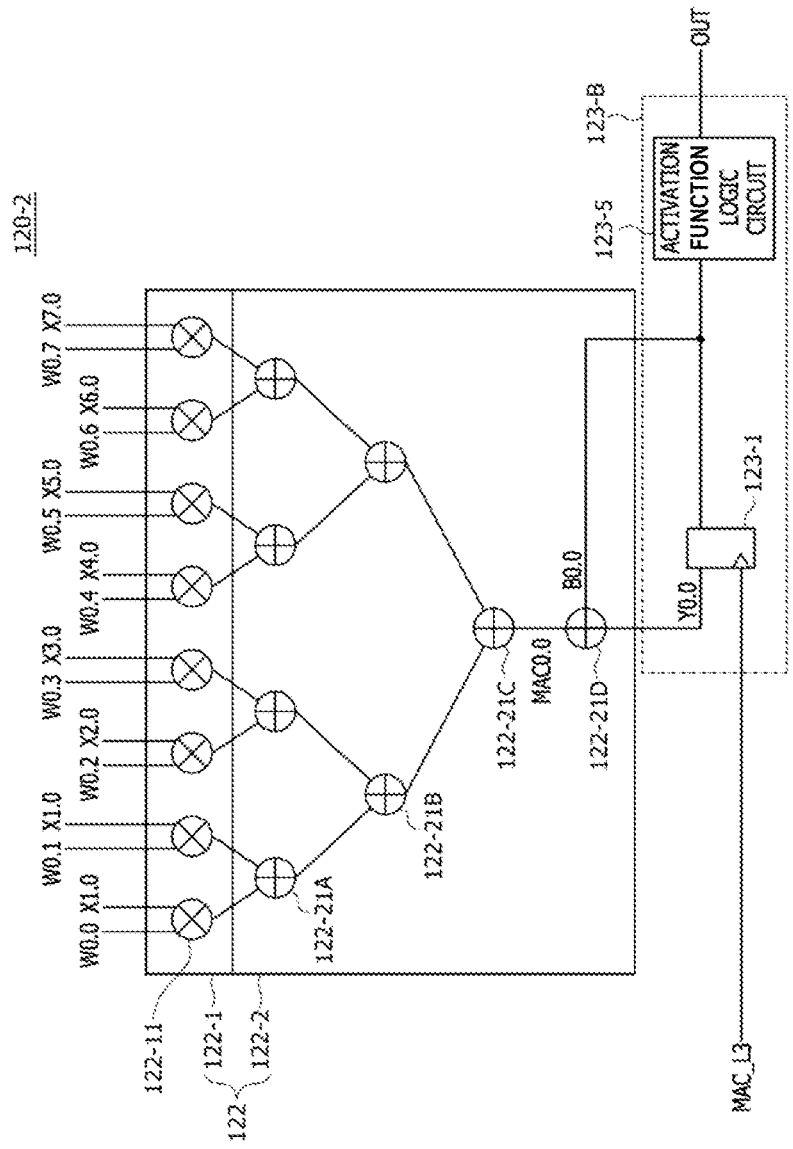
FIG. 19 illustrates an example of a configuration of a MAC operator for performing the MAC arithmetic operation of FIG. 17 in a PIM system according to a first embodiment of the present disclosure.

FIG. 18 is a flowchart illustrating processes of the MAC arithmetic operation described with reference to FIG. 17 in the PIM system 1-1 according to the first embodiment of the present disclosure. Moreover, FIG. 19 illustrates an example of a configuration of a MAC operator 120-2 for performing the MAC arithmetic operation of FIG. 17 in the PIM system 1-1 according to the first embodiment of the present disclosure. In FIG. 19, the same reference numerals or the same reference symbols as used in FIG. 4 denote the same elements, and the detailed descriptions of the same elements as mentioned in the previous embodiment will be omitted hereinafter. Referring to FIG. 18, the first data (i.e., the weight data) may be written into the first memory bank 111 at a step 341 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 17.

At a step 342, whether an inference is requested may be determined. An inference request signal may be transmitted from an external device located outside of the PIM system 1-1 to the PIM controller 200 of the PIM system 1-1. In an embodiment, if no is inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., the data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 200 at the step 342, then the PIM controller 200 may write the vector data transmitted with the inference request signal into the second memory bank 112 at a step 343. Accordingly, the vector data may be stored in the second memory bank 112 of the PIM device 100.

At a step 344, an output latch of a MAC operator may be initially set to have bias data and the initially set bias data may be fed back to an accumulative adder of the MAC operator. This process is executed to perform the matrix adding calculation of the MAC result matrix and the bias matrix, which is described with reference to FIG. 17. That is, as illustrated in FIG. 19, the output latch 123-1 of the MAC operator (120-2 of FIG. 19) may be initially set to have the bias data of the bias matrix. Because the matrix multiplying calculation is executed for the first row of the weight matrix, the element B0.0 located at first row and the first column of the bias matrix may be initially set as the bias data in the output latch 123-1. The output latch 123-1 may output the bias data B0.0, and the bias data B0.0 outputted from the output latch 123-1 may be inputted to the accumulative adder 122-21D of the MAC operator 120-2.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-2 of the PIM device 100. When a subsequent MAC arithmetic operation is performed, the accumulative adder 122-21D of the MAC operator 120-2 may add the MAC result data MAC0.0 outputted from the adder 122-21C disposed at the last stage to the bias data B0.0 which is fed back from the output latch 123-1 to generate the biased result data Y0.0 and may output the biased result data Y0.0 to the output latch 123-1. As illustrated in FIG. 19, the biased result data Y0.0 may be transmitted from the output latch 123-1 to an activation function logic circuit 123-5 disposed in a data output circuit 123-B of the MAC operator 120-2 in synchronization with the MAC output latch signal MAC_L3 transmitted in a subsequent process.

In a step 345, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 345 may be executed in the same way as described with reference to FIG. 7. In a step 346, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 346 may be executed in the same way as described with reference to FIG. 8.

At a step 347, the MAC command generator 240 of the PIM controller 200 may generate and transmit the first MAC input latch signal MAC_L1 to the PIM device 100. The step 347 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 348, the MAC command generator 240 of the PIM controller 200 may generate and transmit the second MAC input latch signal MAC_L2 to the PIM device 100. The step 348 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 349, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 19. The accumulative adder 122-21D may add output data of the adder 122-21C to feedback data fed back from the output latch 123-1 to output the result of the adding calculation. The output data of the adder 122-21C may be the element MAC0.0 of the '8×1' MAC result matrix, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be inputted to the output latch 123-1 disposed in the data output circuit 123-A of the MAC operator 120.

At a step 350, the MAC command generator 240 of the PIM controller 200 may generate and transmit the MAC output latch signal MAC_L3 to the PIM device 100. The step 350 may be executed in the same way as described with reference to FIG. 12. The MAC output latch signal MAC_L3 may control the output latch operation of the output latch 123-1 included in the MAC operator 120 of the PIM device 100. The biased result data Y0.0 transmitted from the MAC circuit 122 of the MAC operator 120 to the output latch 123-1 may be outputted from the output latch 123-1 in synchronization with the MAC output latch signal MAC_L3. The biased result data Y0.0 outputted from the output latch 123-1 may be inputted to the activation function logic circuit 123-5. At a step 351, the activation function logic circuit 123-5 may apply an activation function to the biased result data Y0.0 to generate a final output value, and the final output value may be inputted to the transfer gate (123-2 of FIG. 4). This, for example, is the final output value for the current of R which is incremented in step 354.

At a step 352, the MAC command generator 240 of the PIM controller 200 may generate and transmit the MAC latch reset signal MAC_L_RST to the PIM device 100. The step 352 may be executed in the same way as described with reference to FIG. 13. The MAC latch reset signal MAC_L_RST may control an output operation of the final output value generated by the MAC operator 120 and a reset operation of the output latch 123-1 included in the MAC operator 120. The transfer gate 123-2 receiving the final output value from the activation function logic circuit 123-5 of the data output circuit 123-B included in the MAC operator 120 may be synchronized with the MAC latch reset signal MAC_L_RST to output the final output value. In an embodiment, the final output value outputted from the MAC operator 120 may be stored into the first memory bank 111 or the second memory bank 112 through the first BIO line or the second BIO line in the PIM device 100.

At a step 353, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 353. At a step 354, whether the row number changed at the step 353 is greater than the row number of the last row (i.e., the eighth row) of the weight matrix may be determined. Because the row number of the weight matrix is changed to '2' at the step 353, a process of the MAC arithmetic operation may be fed back to the step 344.

If the process of the MAC arithmetic operation is fed back to the step 344 from the step 354, the same processes as described with reference to the steps 344 to 354 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix, and the bias data B0.0 in the output latch 123-1 initially set at the step 344 may be changed to the bias data B1.0. If the process of the MAC arithmetic operation is fed back to the step 344 from the step 354, the processes from the step 344 to the step 354 may be iteratively performed until the MAC arithmetic operation is performed for all of the rows of the weight matrix with the vector matrix. For an embodiment, a plurality of final output values, namely, one final output value for each incremented value of R, represents an 'N×1' final result matrix. If the MAC arithmetic operation for the eighth row of the weight matrix terminates and the row number of the weight matrix changes from '8' to '9' at the step 354, the MAC arithmetic operation may terminate because the row number of '9' is greater than the last row number of '8' at the step 354.

Figure 20:
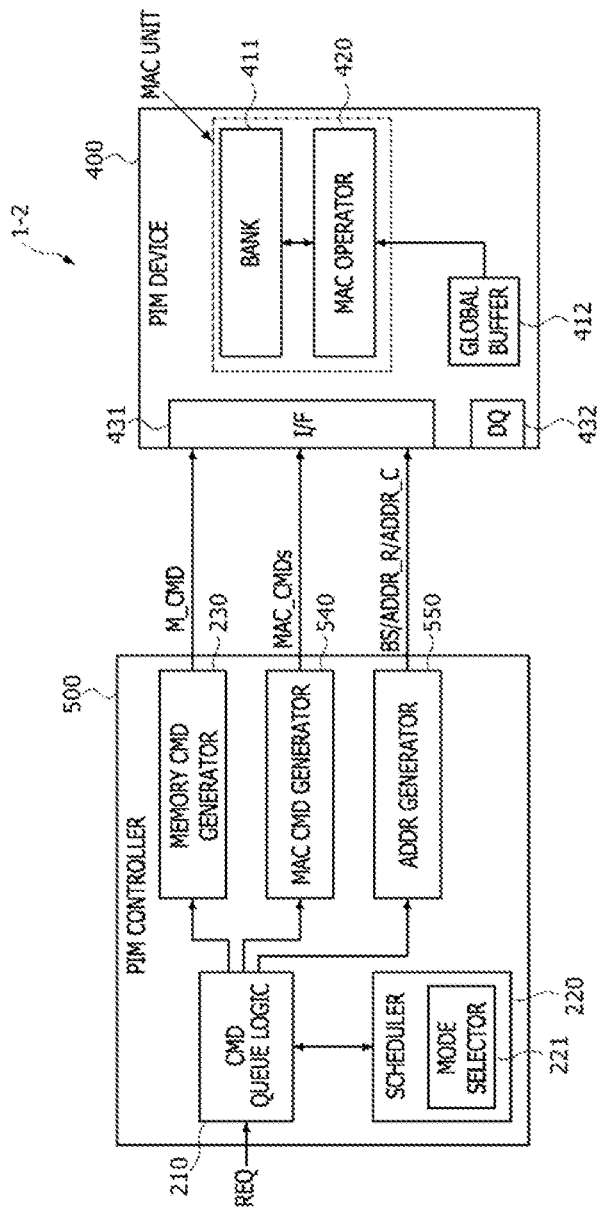
FIG. 20 is a block diagram illustrating a PIM system according to a second embodiment of the present disclosure.

FIG. 20 is a block diagram illustrating a PIM system 1-2 according to a second embodiment of the present disclosure. In FIG. 20, the same reference numerals or the same reference symbols as used in FIG. 2 denote the same elements. As illustrated in FIG. 20, the PIM system 1-2 may be configured to include a PIM device 400 and a PIM controller 500. The PIM device 400 may be configured to include a memory bank (BANK) 411 corresponding to a storage region, a global buffer 412, a MAC operator 420, an interface (I/F) 431, and a data input/output (I/O) pad 432. For an embodiment, the MAC operator 420 represents a MAC operator circuit. The memory bank (BANK) 411 and the MAC operator 420 included in the PIM device 400 may constitute one MAC unit. In another embodiment, the PIM device 400 may include a plurality of MAC units. The memory bank (BANK) 411 may represent a memory region for storing data, for example, a DRAM device. The global buffer 412 may also represent a memory region for storing data, for example, a DRAM device or an SRAM device. The memory bank (BANK) 411 may be a component unit which is independently activated and may be configured to have the same data bus width as data I/O lines in the PIM device 400. In an embodiment, the memory bank 411 may operate through interleaving such that an active operation of the memory bank 411 is performed in parallel while another memory bank is selected. The memory bank 411 may include at least one cell array which includes memory unit cells located at cross points of a plurality of rows and a plurality of columns.

Although not shown in the drawings, a core circuit may be disposed adjacent to the memory bank 411. The core circuit may include X-decoders XDECs and Y-decoders/IO circuits YDEC/IOs. An X-decoder XDEC may also be referred to as a word line decoder or a row decoder. The X-decoder XDEC may receive a row address ADDR_R from the PIM controller 500 and may decode the row address ADDR_R to select and enable one of the rows (i.e., word lines) coupled to the selected memory bank. Each of the Y-decoders/IO circuits YDEC/IOs may include a Y-decoder YDEC and an I/O circuit JO. The Y-decoder YDEC may also be referred to as a bit line decoder or a column decoder. The Y-decoder YDEC may receive a column address ADD_C from the PIM controller 500 and may decode the column address ADD_C to select and enable at least one of the columns (i.e., bit lines) coupled to the selected memory bank. Each of the I/O circuits may include an I/O sense amplifier for sensing and amplifying a level of a read datum outputted from the corresponding memory bank during a read operation for the memory bank 411. In addition, the I/O circuit may include a write driver for driving a write datum during a write operation for the memory bank 411.

The MAC operator 420 of the PIM device 400 may have mostly the same configuration as the MAC operator 120 described with reference to FIG. 4. That is, the MAC operator 420 may be configured to include the data input circuit 121, the MAC circuit 122, and the data output circuit 123, as described with reference to FIG. 4. The data input circuit 121 may be configured to include the first input latch 121-1 and the second input latch 121-2. The MAC circuit 122 may be configured to include the multiplication logic circuit 122-1 and the addition logic circuit 122-2. The data output circuit 123 may be configured to include the output latch 123-1, the transfer gate 123-2, the delay circuit 123-3, and the inverter 123-4. In an embodiment, the first input latch 121-1, the second input latch 121-2, and the output latch 123-1 may be realized using flip-flops.

The MAC operator 420 may be different from the MAC operator 120 in that a MAC input latch signal MAC_L1 is simultaneously inputted to both of clock terminals of the first and second input latches 121-1 and 121-2. As indicated in the following descriptions, the weight data and the vector data may be simultaneously transmitted to the MAC operator 420 of the PIM device 400 included in the PIM system 1-2 according to the present embodiment. That is, the first data DA1 (i.e., the weight data) and the second data DA2 (i.e., the vector data) may be simultaneously inputted to both of the first input latch 121-1 and the second input latch 121-2 constituting the data input circuit 121, respectively. Accordingly, it may be unnecessary to apply an extra control signal to the clock terminals of the first and second input latches 121-1 and 121-2, and thus the MAC input latch signal MAC_L1 may be simultaneously inputted to both of the clock terminals of the first and second input latches 121-1 and 121-2 included in the MAC operator 420.

In another embodiment, the MAC operator 420 may be realized to have the same configuration as the MAC operator 120-1 described with reference to FIG. 16 to perform the operation illustrated in FIG. 14. Even in such a case, the MAC operator 420 may have the same configuration as described with reference to FIG. 16 except that the MAC input latch signal MAC_L1 is simultaneously inputted to both of the clock terminals of the first and second input latches 121-1 and 121-2 constituting the data input circuit 121. In yet another embodiment, the MAC operator 420 may be realized to have the same configuration as the MAC operator 120-2 described with reference to FIG. 19 to perform the operation illustrated in FIG. 17. Even in such a case, the MAC operator 420 may have the same configuration as described with reference to FIG. 19 except that the MAC input latch signal MAC_L1 is simultaneously inputted to both of the clock terminals of the first and second input latches 121-1 and 121-2 constituting the data input circuit 121.

The interface 431 of the PIM device 400 may receive the memory command M_CMD, the MAC commands MAC_CMDs, the bank selection signal BS, and the row/column addresses ADDR_R/ADDR_C from the PIM controller 500. The interface 431 may output the memory command M_CMD, together with the bank selection signal BS and the row/column addresses ADDR_R/ADDR_C, to the memory bank 411. The interface 431 may output the MAC commands MAC_CMDs to the memory bank 411 and the MAC operator 420. In such a case, the interface 431 may output the bank selection signal BS and the row/column addresses ADDR_R/ADDR_C to the memory bank 411. The data I/O pad 432 of the PIM device 400 may function as a data communication terminal between a device external to the PIM device 400, the global buffer 412, and the MAC unit (which includes the memory bank 411 and the MAC operator 420) included in the PIM device 400. The external device to the PIM device 400 may correspond to the PIM controller 500 of the PIM system 1-2 or a host located outside the PIM system 1-2. Accordingly, data outputted from the host or the PIM controller 500 may be inputted into the PIM device 400 through the data I/O pad 432. In addition, data generated by the PIM device 400 may be transmitted to the external device to the PIM device 400 through the data I/O pad 432.

The PIM controller 500 may control operations of the PIM device 400. In an embodiment, the PIM controller 500 may control the PIM device 400 such that the PIM device 400 operates in the memory mode or the MAC mode. In the event that the PIM controller 500 controls the PIM device 400 such that the PIM device 400 operates in the memory mode, the PIM device 400 may perform a data read operation or a data write operation for the memory bank 411. In the event that the PIM controller 500 controls the PIM device 400 such that the PIM device 400 operates in the MAC mode, the PIM device 400 may perform the MAC arithmetic operation for the MAC operator 420. In the event that the PIM controller 500 controls the PIM device 400 such that the PIM device 400 operates in the MAC mode, the PIM device 400 may also perform the data read operation and the data write operation for the memory bank 411 and the global buffer 412 to execute the MAC arithmetic operation.

The PIM controller 500 may be configured to include the command queue logic 210, the scheduler 220, the memory command generator 230, a MAC command generator 540, and an address generator 550. The scheduler 220 may include the mode selector 221. The command queue logic 210 may receive the request REQ from an external device (e.g., a host of the PIM system 1-2) and store a command queue corresponding the request REQ in the command queue logic 210. The command queue stored in the command queue logic 210 may be transmitted to the memory command generator 230 or the MAC command generator 540 according to a sequence determined by the scheduler 220. The scheduler 220 may adjust a timing of the command queue when the command queue stored in the command queue logic 210 is outputted from the command queue logic 210. The scheduler 210 may include the mode selector 221 that generates a mode selection signal including information on whether command queue stored in the command queue logic 210 relates to the memory mode or the MAC mode. The memory command generator 230 may receive the command queue related to the memory mode of the PIM device 400 from the command queue logic 210 to generate and output the memory command M_CMD. The command queue logic 210, the scheduler 220, the mode selector 221, and the memory command generator 230 may have the same function as described with reference to FIG. 2.

The MAC command generator 540 may receive the command queue related to the MAC mode of the PIM device 400 from the command queue logic 210. The MAC command generator 540 may decode the command queue to generate and output the MAC commands MAC_CMDs. The MAC commands MAC_CMDs outputted from the MAC command generator 540 may be transmitted to the PIM device 400. The data read operation for the memory bank 411 of the PIM device 400 may be performed by the MAC commands MAC_CMDs outputted from the MAC command generator 540, and the MAC arithmetic operation of the MAC operator 420 may also be performed by the MAC commands MAC_CMDs outputted from the MAC command generator 540. The MAC commands MAC_CMDs and the MAC arithmetic operation of the PIM device 400 according to the MAC commands MAC_CMDs will be described in detail with reference to FIG. 21.

The address generator 550 may receive address information from the command queue logic 210. The address generator 550 may generate the bank selection signal BS for selecting a memory bank where, for example, the memory bank 411 represents multiple memory banks. The address generator 550 may transmit the bank selection signal BS to the PIM device 400. In addition, the address generator 550 may generate the row address ADDR_R and the column address ADDR_C for accessing a region (e.g., memory cells) in the memory bank 411 and may transmit the row address ADDR_R and the column address ADDR_C to the PIM device 400.

Figure 21:
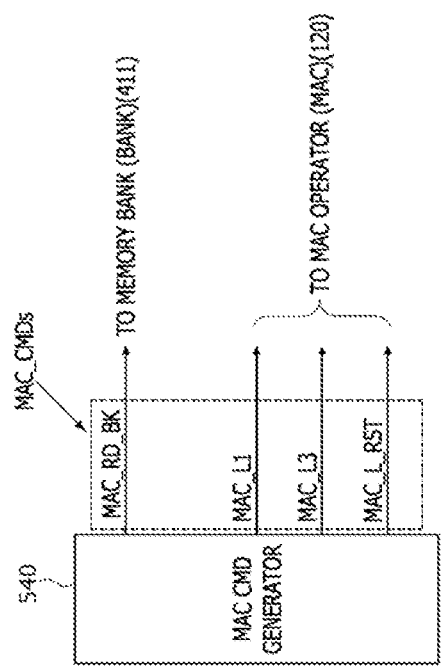
FIG. 21 illustrates MAC commands outputted from a MAC command generator of a PIM controller included in a PIM system according to a second embodiment of the present disclosure.

FIG. 21 illustrates the MAC commands MAC_CMDs outputted from the MAC command generator 540 included in the PIM system 1-2 according to the second embodiment of the present disclosure. As illustrated in FIG. 21, the MAC commands MAC_CMDs may include first to fourth MAC command signals. In an embodiment, the first MAC command signal may be a MAC read signal MAC_RD_BK, the second MAC command signal may be a MAC input latch signal MAC_L1, the third MAC command signal may be a MAC output latch signal MAC_L3, and the fourth MAC command signal may be a MAC latch reset signal MAC_L_RST.

The MAC read signal MAC_RD_BK may control an operation for reading the first data (e.g., the weight data) out of the memory bank 411 to transmit the first data to the MAC operator 420. The MAC input latch signal MAC_L1 may control an input latch operation of the weight data transmitted from the first memory bank 411 to the MAC operator 420. The MAC output latch signal MAC_L3 may control an output latch operation of the MAC result data generated by the MAC operator 420. And, the MAC latch reset signal MAC_L_RST may control an output operation of the MAC result data generated by the MAC operator 420 and a reset operation of an output latch included in the MAC operator 420.

The PIM system 1-2 according to the present embodiment may also be configured to perform the deterministic MAC arithmetic operation. Thus, the MAC commands MAC_CMDs transmitted from the PIM controller 500 to the PIM device 400 may be sequentially generated with fixed time intervals. Accordingly, the PIM controller 500 does not require any extra end signals of various operations executed for the MAC arithmetic operation to generate the MAC commands MAC_CMDs for controlling the MAC arithmetic operation. In an embodiment, latencies of the various operations executed by MAC commands MAC_CMDs for controlling the MAC arithmetic operation may be set to have fixed values in order to perform the deterministic MAC arithmetic operation. In such a case, the MAC commands MAC_CMDs may be sequentially outputted from the PIM controller 500 with fixed time intervals corresponding to the fixed latencies.

Figure 22:
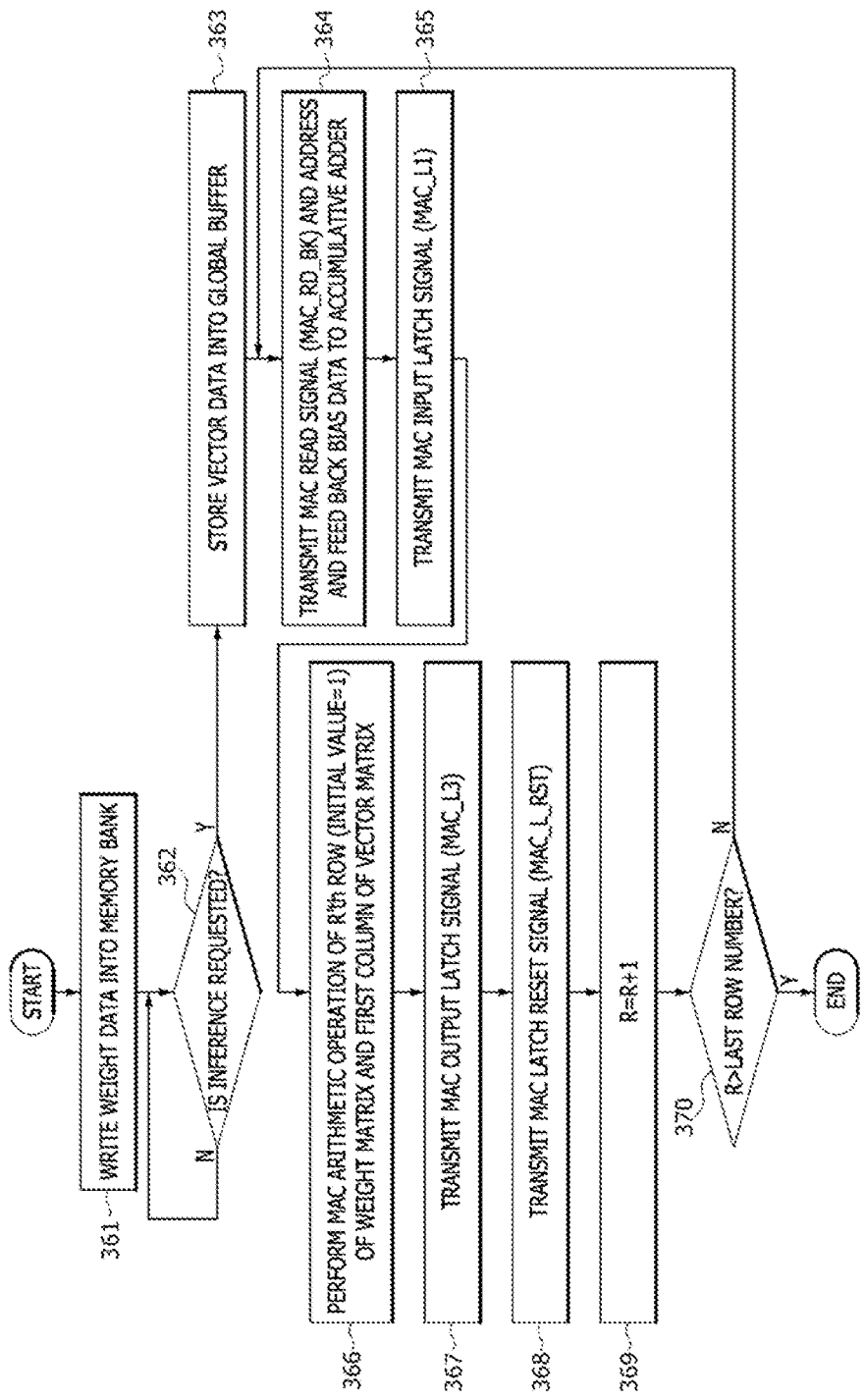
FIG. 22 is a flowchart illustrating processes of the MAC arithmetic operation illustrated in FIG. 5 in a PIM system according to a second embodiment of the present disclosure.

FIG. 22 is a flowchart illustrating processes of the MAC arithmetic operation described with reference to FIG. 5, which are performed in the PIM system 1-2 according to the second embodiment of the present disclosure. In addition, FIGS. 23 to 26 are block diagrams illustrating the processes of the MAC arithmetic operation illustrated in FIG. 5, which are performed in the PIM system 1-2 according to the second embodiment of the present disclosure. Referring to FIGS. 22 to 26, the first data (i.e., the weight data) may be written into the memory bank 411 at a step 361 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 5.

At a step 362, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 500 at the step 362, then the PIM controller 500 may write the vector data transmitted with the inference request signal into the global buffer 412 at a step 363. Accordingly, the vector data may be stored in the global buffer 412 of the PIM device 400.

Figure 23:
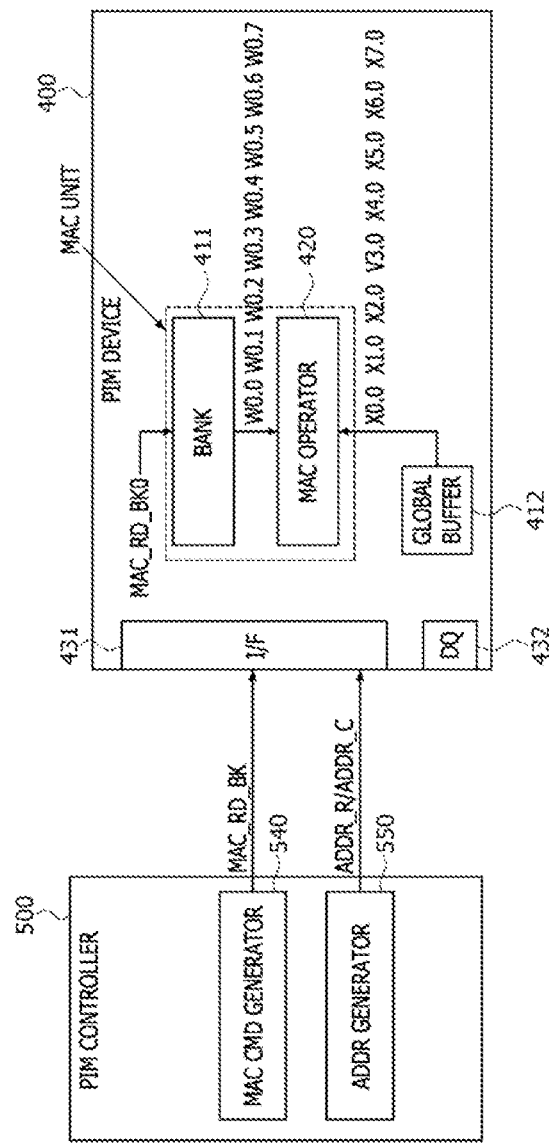
FIGS. 23 to 26 are block diagrams illustrating processes of the MAC arithmetic operation illustrated in FIG. 5 in a PIM system according to a second embodiment of the present disclosure.

At a step 364, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. Although not shown in the drawings, if a plurality of memory banks are disposed in the PIM device 400, the address generator 550 may transmit a bank selection signal for selecting the memory bank 411 among the plurality of memory banks as well as the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK outputted from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

Figure 24:
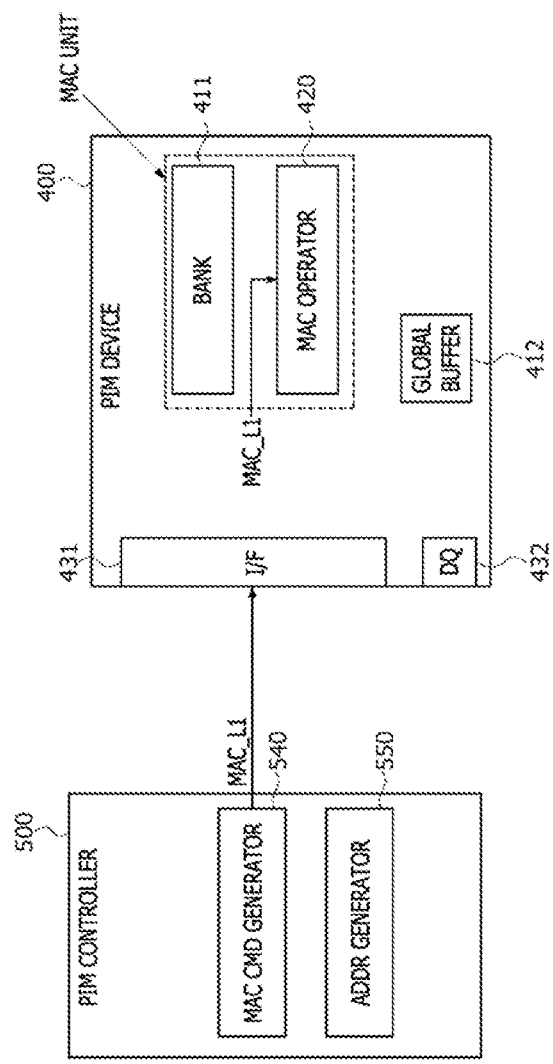

At a step 365, the MAC command generator 540 of the PIM controller 500 may generate and transmit the MAC input latch signal MAC_L1 to the PIM device 400, as illustrated in FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 366, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time.

Specifically, as described with reference to FIG. 4, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data from the multipliers 122-11 and may perform the adding calculation of the output data of the multipliers 122-11 to output the result data of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to the element MAC0.0 located at the first row of the '8×1' MAC result matrix having the eight elements of MAC0.0, . . . , and MAC7.0 illustrated in FIG. 5. The output data MAC0.0 of the addition logic circuit 122-2 may be inputted to the output latch 123-1 disposed in the data output circuit 123 of the MAC operator 420, as described with reference to FIG. 4.

Figure 25:
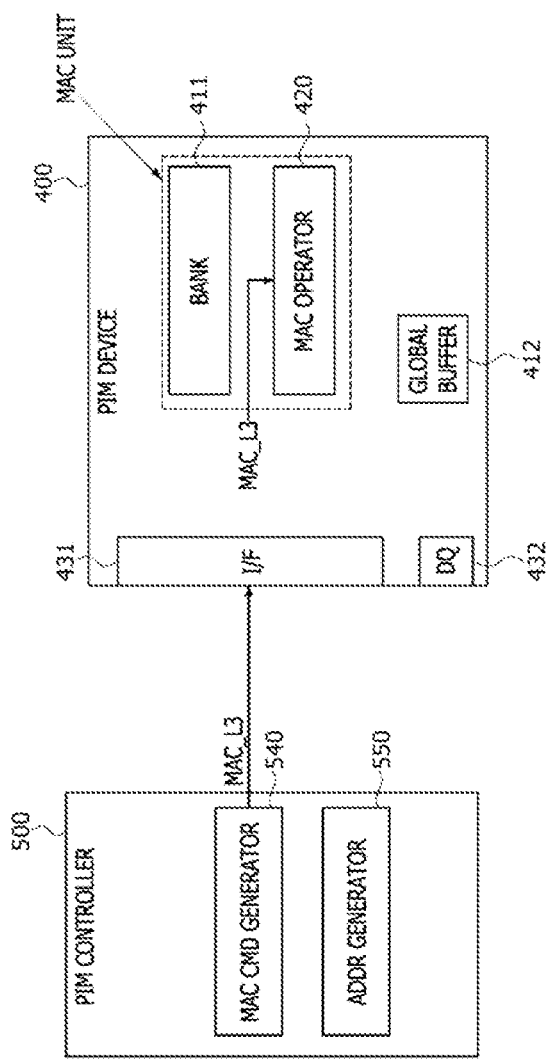

At a step 367, the MAC command generator 540 of the PIM controller 500 may generate and transmit the MAC output latch signal MAC_L3 to the PIM device 400, as illustrated in FIG. 25. The MAC output latch signal MAC_L3 may control the output latch operation of the MAC result data MAC0.0 performed by the MAC operator 420 of the PIM device 400. The MAC result data MAC0.0 transmitted from the MAC circuit 122 of the MAC operator 420 to the output latch 123-1 may be outputted from the output latch 123-1 by the output latch operation performed in synchronization with the MAC output latch signal MAC_L3, as described with reference to FIG. 4. The MAC result data MAC0.0 outputted from the output latch 123-1 may be inputted to the transfer gate 123-2 of the data output circuit 123.

Figure 26:
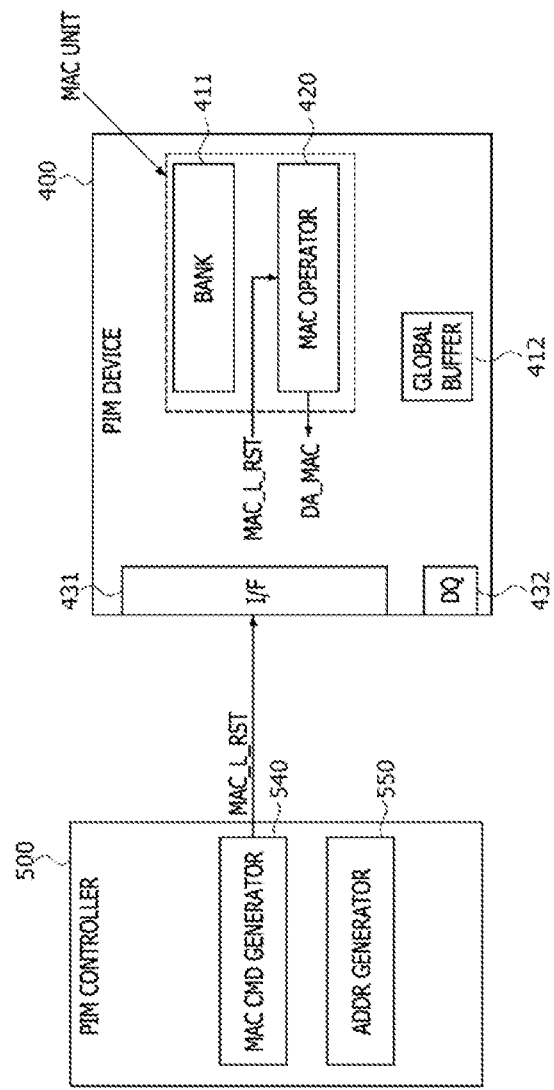

At a step 368, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the MAC result data MAC0.0 generated by the MAC operator 420 and a reset operation of the output latch 123-1 included in the MAC operator 420. As described with reference to FIG. 4, the transfer gate 123-2 receiving the MAC result data MAC0.0 from the output latch 123-1 of the MAC operator 420 may be synchronized with the MAC latch reset signal MAC_L_RST to output the MAC result data MAC0.0. In an embodiment, the MAC result data MAC0.0 outputted from the MAC operator 420 may be stored into the memory bank 411 through the BIO line in the PIM device 400.

At a step 369, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 369. At a step 370, whether the row number changed at the step 369 is greater than the row number of the last row (i.e., the eighth row) of the weight matrix may be determined. Because the row number of the weight matrix is changed to '2' at the step 370, a process of the MAC arithmetic operation may be fed back to the step 364.

If the process of the MAC arithmetic operation is fed back to the step 364 from the step 370, the same processes as described with reference to the steps 364 to 370 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 364 from the step 370, the processes from the step 364 to the step 370 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 369, the MAC arithmetic operation may terminate because the row number of '9' is greater than the last row number of '8' at the step 370.

Figure 27:
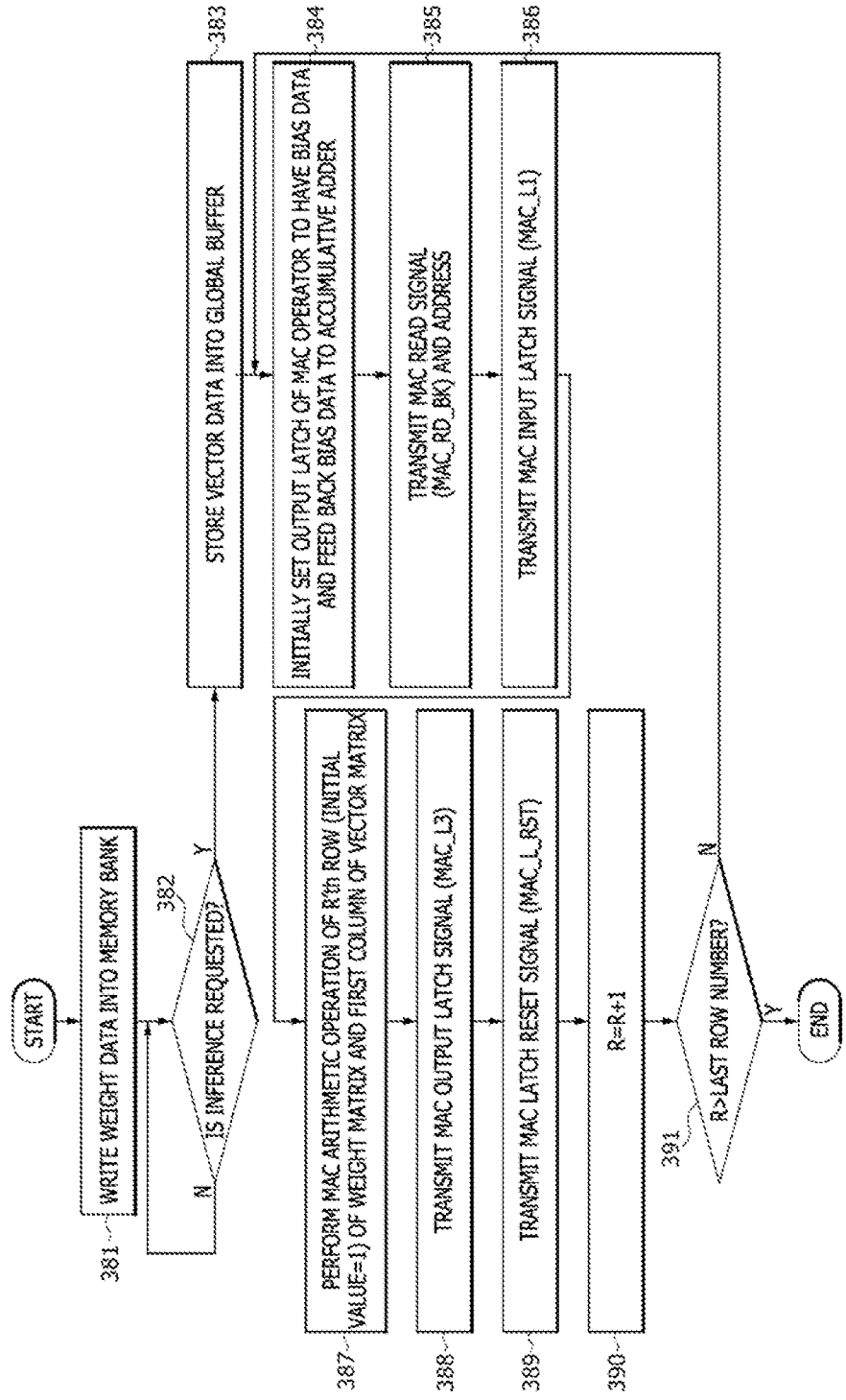
FIG. 27 is a flowchart illustrating processes of the MAC arithmetic operation illustrated in FIG. 14 in a PIM system according to a second embodiment of the present disclosure.

FIG. 27 is a flowchart illustrating processes of the MAC arithmetic operation described with reference to FIG. 14, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-1 illustrated in FIG. 16. Referring to FIGS. 20 and 27, the first data (i.e., the weight data) may be written into the memory bank 411 at a step 381 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 14.

At a step 382, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 500 at the step 382, then the PIM controller 500 may write the vector data transmitted with the inference request signal into the global buffer 412 at a step 383. Accordingly, the vector data may be stored in the global buffer 412 of the PIM device 400.

At a step 384, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 14. That is, as illustrated in FIG. 16, the output latch 123-1 of the data output circuit 123-A included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 outputted from the output latch 123-1 may be inputted to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 outputted from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be outputted from the output latch 123-1 in synchronization with the MAC output latch signal MAC_L3 transmitted in a subsequent process.

At a step 385, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK outputted from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 386, the MAC command generator 540 of the PIM controller 500 may generate and transmit the MAC input latch signal MAC_L1 to the PIM device 400, as illustrated in FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 387, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., MAC result data) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be inputted to the output latch 123-1 disposed in the data output circuit 123-A of the MAC operator 420.

At a step 388, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 outputted from the output latch 123-1 may be inputted to the transfer gate 123-2 of the data output circuit 123-A.

At a step 389, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the biased result data Y0.0 generated by the MAC operator 420 and a reset operation of the output latch 123-1 included in the MAC operator 420. The transfer gate 123-2 receiving the biased result data Y0.0 from the output latch 123-1 of the MAC operator 420 may be synchronized with the MAC latch reset signal MAC_L_RST to output the biased result data Y0.0. In an embodiment, the biased result data Y0.0 outputted from the MAC operator 120 may be stored into the memory bank 411 through the BIO line in the PIM device 400.

At a step 390, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 390. At a step 391, whether the row number changed at the step 390 is greater than the row number of the last row (i.e., the eighth row) of the weight matrix may be determined. Because the row number of the weight matrix is changed to '2' at the step 390, a process of the MAC arithmetic operation may be fed back to the step 384.

If the process of the MAC arithmetic operation is fed back to the step 384 at the step 391, the same processes as described with reference to the steps 384 to 391 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 384 at the step 391, then the processes from the step 384 to the step 390 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 390, then the MAC arithmetic operation may terminate because the row number of '9' is greater than the last row number of '8' at the step 391.

Figure 28:
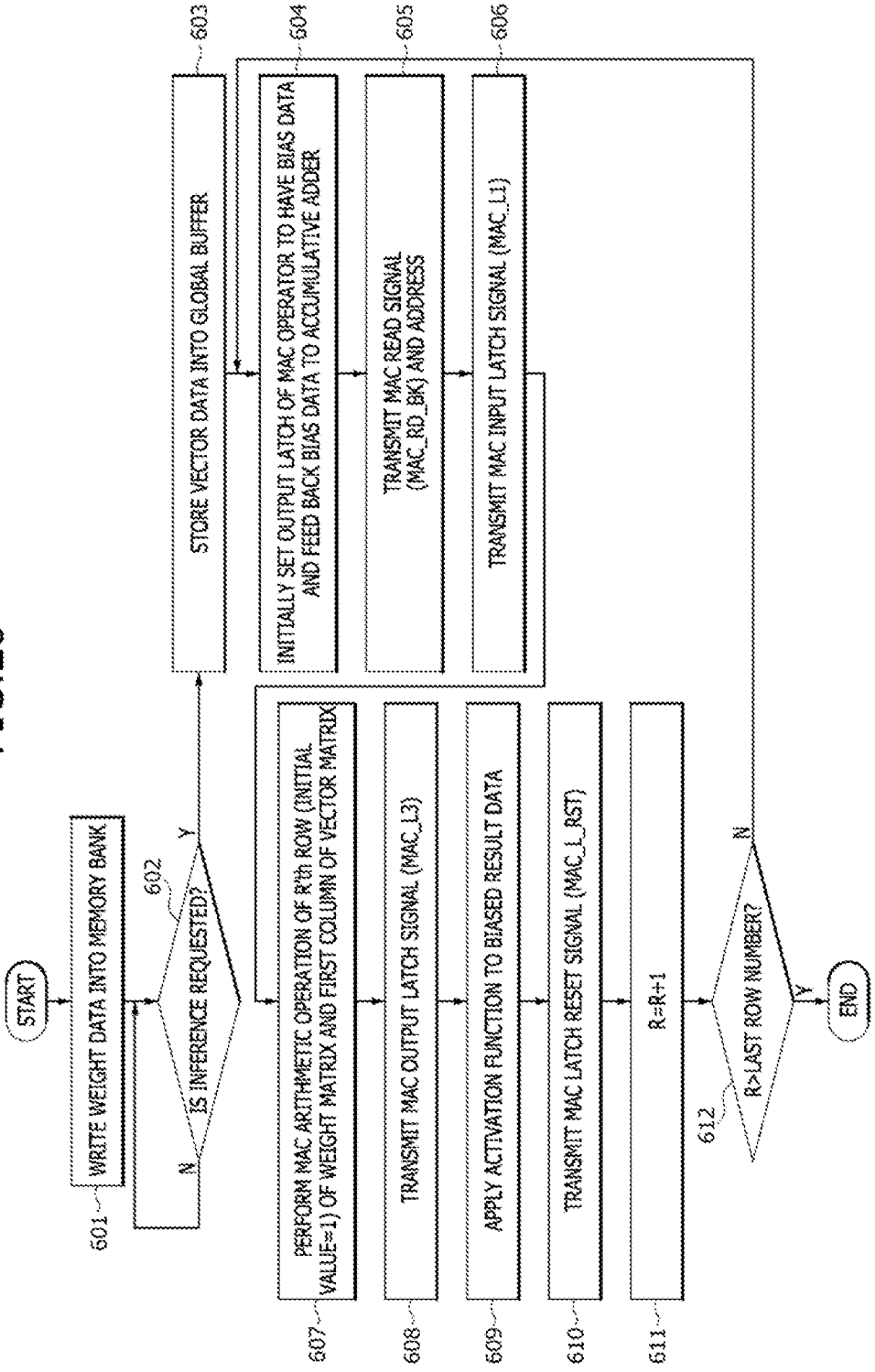
FIG. 28 is a flowchart illustrating processes of the MAC arithmetic operation illustrated in FIG. 17 in a PIM system according to a second embodiment of the present disclosure.

FIG. 28 is a flowchart illustrating processes of the MAC arithmetic operation described with reference to FIG. 17, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-2 illustrated in FIG. 19. Referring to FIGS. 19 and 28, the first data (i.e., the weight data) may be written into the memory bank 411 at a step 601 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 17.

At a step 602, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 500 at the step 602, then the PIM controller 500 may write the vector data transmitted with the inference request signal into the global buffer 412 at a step 603. Accordingly, the vector data may be stored in the global buffer 412 of the PIM device 400.

At a step 604, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 17. That is, as described with reference to FIG. 19, the output latch 123-1 of the data output circuit 123-B included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 outputted from the output latch 123-1 may be inputted to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 outputted from the adder 122-21C disposed at the last stage of the addition logic circuit 122-2 to the bias data B0.0 which is fed back from the output latch 123-1 to generate the biased result data Y0.0 and may output the biased result data Y0.0 to the output latch 123-1. The biased result data Y0.0 may be outputted from the output latch 123-1 in synchronization with the MAC output latch signal MAC_L3 transmitted in a subsequent process.

At a step 605, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK outputted from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 606, the MAC command generator 540 of the PIM controller 500 may generate and transmit the MAC input latch signal MAC_L1 to the PIM device 400, as described with reference to FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 607, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., the MAC result data MAC0.0) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be inputted to the output latch 123-1 disposed in the data output circuit 123-A of the MAC operator 420.

At a step 608, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 outputted from the output latch 123-1 may be inputted to the activation function logic circuit 123-5, which is illustrated in FIG. 19. At a step 610, the activation function logic circuit 123-5 may apply an activation function to the biased result data Y0.0 to generate a final output value, and the final output value may be inputted to the transfer gate (123-2 of FIG. 4).

At a step 610, the MAC command generator 540 of the PIM controller 500 may generate and transmit the MAC latch reset signal MAC_L_RST to the PIM device 400, as described with reference to FIG. 26. The MAC latch reset signal MAC_L_RST may control an output operation of the final output value generated by the MAC operator 420 and a reset operation of the output latch 123-1 included in the MAC operator 420. The transfer gate 123-2 receiving the final output value from the activation function logic circuit 123-5 of the data output circuit 123-B included in the MAC operator 420 may be synchronized with the MAC latch reset signal MAC_L_RST to output the final output value. In an embodiment, the final output value outputted from the MAC operator 420 may be stored into the memory bank 411 through the BIO line in the PIM device 400.

At a step 611, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 611. At a step 612, whether the row number changed at the step 611 is greater than the row number of the last row (i.e., the eighth row) of the weight matrix may be determined. Because the row number of the weight matrix is changed to '2' at the step 611, a process of the MAC arithmetic operation may be fed back to the step 604.

If the process of the MAC arithmetic operation is fed back to the step 604 from the step 612, the same processes as described with reference to the steps 604 to 612 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix to generate the MAC result data (corresponding to the element MAC1.0 located in the second row of the MAC result matrix) and the bias data (corresponding to the element B1.0 located in the second row of the bias matrix). If the process of the MAC arithmetic operation is fed back to the step 604 from the step 612, the processes from the step 604 to the step 612 may be iteratively performed until the MAC arithmetic operation is performed for all of the rows (i.e., first to eighth rows) of the weight matrix with the vector matrix. If the MAC arithmetic operation for the eighth row of the weight matrix terminates and the row number of the weight matrix changes from '8' to '9' at the step 611, the MAC arithmetic operation may terminate because the row number of '9' is greater than the last row number of '8' at the step 612.

Figure 29:
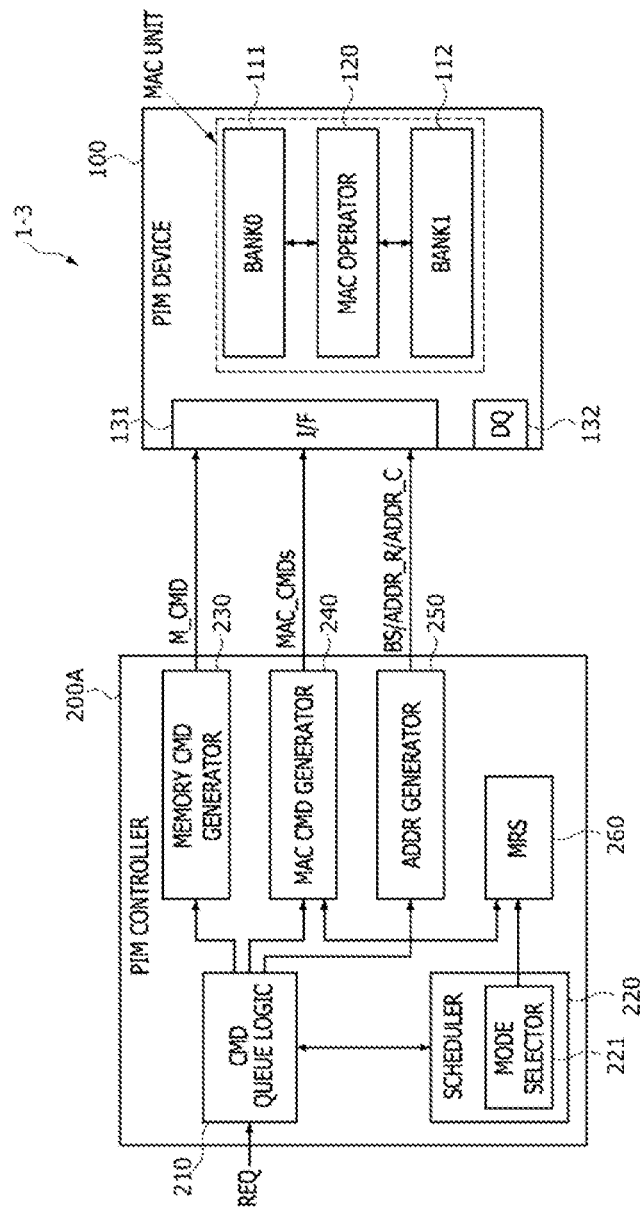
FIG. 29 is a block diagram illustrating a PIM system according to yet another embodiment of the present disclosure.

FIG. 29 is a block diagram illustrating a PIM system 1-3 according to a third embodiment of the present disclosure. As illustrated in FIG. 29, the PIM system 1-3 may have substantially the same configuration as the PIM system 1-1 illustrated in FIG. 2 except that a PIM controller 200A of the PIM system 1-3 further includes a mode register set (MRS) 260 as compared with the PIM controller 200 of the PIM system 1-1. Thus, the same explanation as described with reference to FIG. 2 will be omitted hereinafter. The mode register set 260 in the PIM controller 200A may receive an MRS signal instructing arrangement of various signals necessary for the MAC arithmetic operation of the PIM system 1-3. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 240. For an embodiment, the MRS 260 represents a MRS circuit.

In an embodiment, the MRS signal may include timing information on when the MAC commands MAC_CMDs are generated. In such a case, the deterministic operation of the PIM system 1-3 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the second memory bank 112 of the PIM device 100 by the inference request signal transmitted from an external device to the PIM controller 200A. Alternatively, the generation of the MRS signal in the MRS 260 may be executed after the vector data are stored in the second memory bank 112 of the PIM device 100 by the inference request signal transmitted from an external device to the PIM controller 200A.

Figure 30:
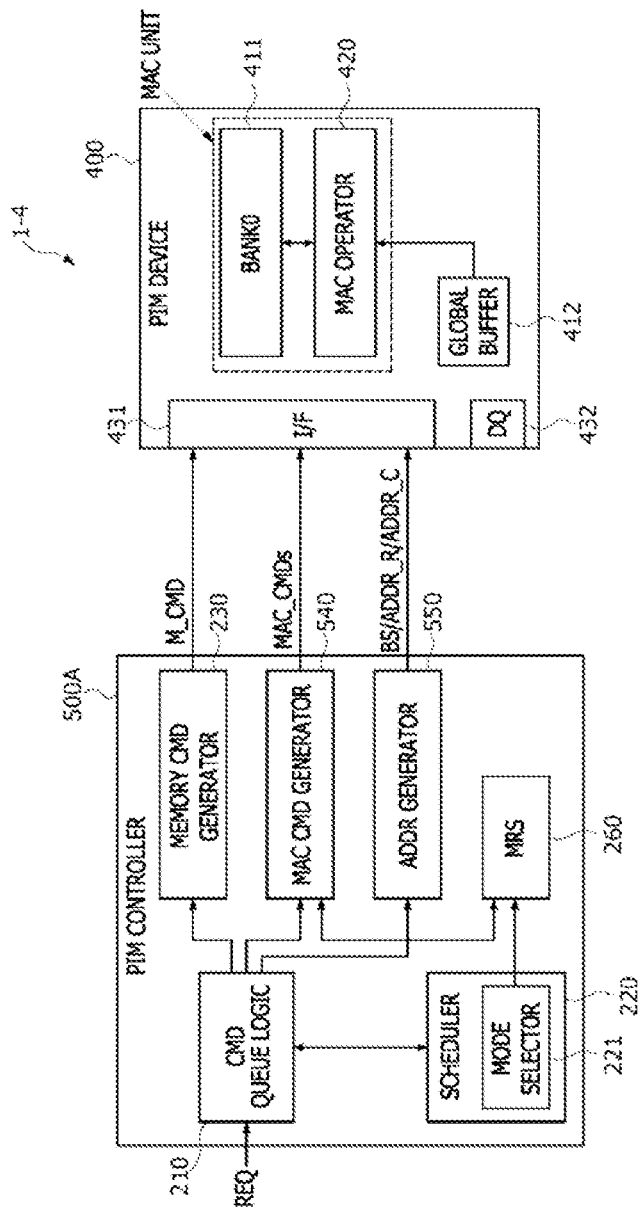
FIG. 30 is a block diagram illustrating a PIM system according to still another embodiment of the present disclosure.

FIG. 30 is a block diagram illustrating a PIM system 1-4 according to a fourth embodiment of the present disclosure. As illustrated in FIG. 30, the PIM system 1-4 may have substantially the same configuration as the PIM system 1-2 illustrated in FIG. 20 except that a PIM controller 500A of the PIM system 1-4 further includes the mode register set (MRS) 260 as compared with the PIM controller 500 of the PIM system 1-2. Thus, the same explanation as described with reference to FIG. 20 will be omitted hereinafter. The mode register set 260 in the PIM controller 500A may receive an MRS signal instructing arrangement of various signals necessary for the MAC arithmetic operation of the PIM system 1-4. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 540.

In an embodiment, the MRS signal may include timing information on when the MAC commands MAC_CMDs are generated. In such a case, the deterministic operation of the PIM system 1-4 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the global buffer 412 of the PIM device 400 by the inference request signal transmitted from an external device to the PIM controller 500A. Alternatively, the generation of the MRS signal in the MRS 260 may be executed after the vector data are stored in the global buffer 412 of the PIM device 400 by the inference request signal transmitted from an external device to the PIM controller 500A.

Figure 31:
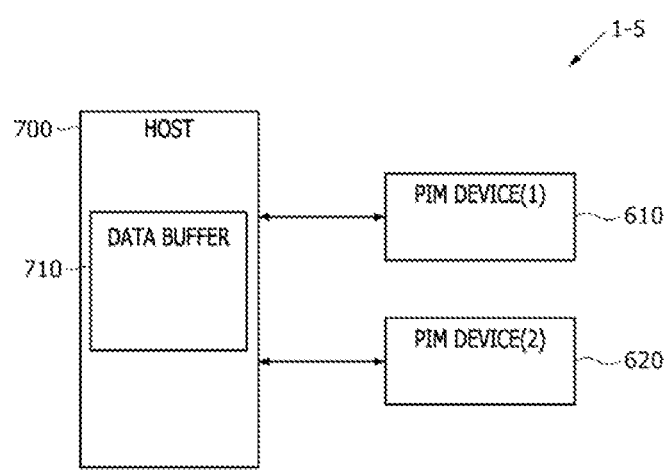
FIG. 31 is a block diagram illustrating a PIM system according to further another embodiment of the present disclosure.

FIG. 31 is a block diagram illustrating a PIM system 1-5 according to further another embodiment of the present disclosure. Referring to FIG. 31, the PIM system 1-5 may include a first PIM device 610, a second PIM device 620, and a host 700. Although the PIM system 1-5 according to the present embodiment is illustrated to include two PIM devices (i.e., the first and second PIM devices 610 and 620), the present embodiment may be merely an example of the present disclosure. Accordingly, in some other embodiments, the PIM system 1-5 may include three or more PIM devices. The first and second PIM devices 610 and 620 may operate in a memory mode or an arithmetic mode. In the present embodiment, the first and second PIM devices 610 and 620 may perform a MAC arithmetic operation in the arithmetic mode. Operations of the first and second PIM devices 610 and 620 may be controlled by the host 700. The host 700 may include a data buffer 710. The host may receive a first group of vector data and a second group of vector data from respective ones of the first and second PIM devices 610 and 620 and may store the first group of vector data and the second group of vector data into the data buffer 710. The host 700 may also write the first group of vector data and the second group of vector data, which are stored in the data buffer 710, into the first and second PIM devices 610 and 620. Although not shown in FIG. 31, the host 700 may include a controller that controls a memory operation or an arithmetic operation of the first and second PIM devices 610 and 620.

Figure 32:
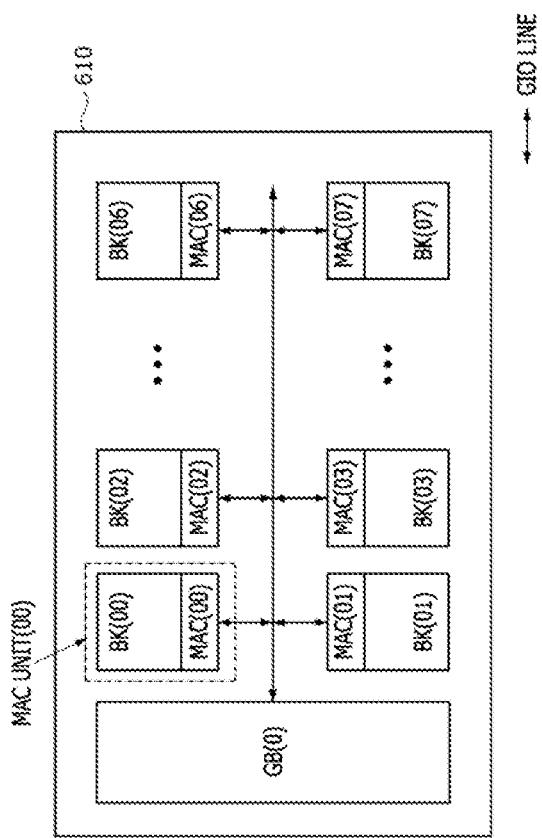
FIG. 32 illustrates an example of a first PIM device included in the PIM system illustrated in FIG. 31.

FIG. 32 illustrates an example of the first PIM device 610 included in the PIM system 1-5 illustrated in FIG. 31. The following operation and configuration of the first PIM device 610 described hereinafter may be equally applicable to the second PIM device (620 of FIG. 31). Referring to FIG. 32, the first PIM device 610 may include a plurality of MAC operators (e.g., first to eighth MAC operators MAC(00)~MAC(07)), a plurality of memory banks (e.g., first to eighth memory banks BK(00)~BK(07)), and a first global buffer GB(0). In an embodiment, the first to eighth memory banks BK(00)~BK(07) may correspond to the first storage region of the data storage region 11 included in the PIM device 10 illustrated in FIG. 1, and the first global buffer GB(0) may correspond to the second storage region of the data storage region 11 included in the PIM device 10 illustrated in FIG. 1. The first to eighth MAC operators MAC(00)~MAC(07) may constitute the arithmetic circuit 12 of the PIM device 10 illustrated in FIG. 1.

The first to eighth memory banks BK(00)~BK(07) may receive weight data from the host (700 of FIG. 31) and may store the weight data therein. The first to eighth memory banks BK(00)~BK(07) may provide the weight data to the first to eighth memory banks BK(00)~BK(07), respectively. A certain memory bank of the first to eighth memory banks BK(00)~BK(07) and one MAC operator allocated to the certain memory bank among the first to eighth MAC operators MAC(00)~MAC(07) may constitute one MAC unit. A MAC operator included in the one MAC unit may receive weight data for execution of a MAC arithmetic operation from a memory bank included in the one MAC unit. For example, the first memory bank BK(00) and the first MAC operator MAC(00) may constitute a first MAC unit MAC_UNIT(00). In such a case, the first MAC operator MAC(00) may receive the weight data, which are used for performing a MAC arithmetic operation, from the first memory bank BK(00).

The first global buffer GB(0) may store vector data which are used for performing a MAC arithmetic operation. In an embodiment, the first global buffer GB(0) may receive vector data from the host (700 of FIG. 31) and may store the vector data. In another embodiment, the first global buffer GB(0) may receive vector data from at least one of the first to eighth memory banks BK(00)~BK(07) and may store the vector data. The first global buffer GB(0) may provide the vector data to each of the first to eighth MAC operators MAC(00)~MAC(07). The vector data in the first global buffer GB(0) may be transmitted to each of the first to eighth MAC operators MAC(00)~MAC(07) through a global input/output (GIO) line.

The first to eighth MAC operators MAC(00)~MAC(07) may perform MAC arithmetic operations using weight data provided by the first to eighth memory banks BK(00)~BK(07) and vector data provided by the first global buffer GB(0) as input data. Each of the first to eighth MAC operators MAC(00)~MAC(07) may generate and output MAC result data as a result of the MAC arithmetic operation. The MAC result data outputted from each of the first to eighth MAC operators MAC(00)~MAC(07) may be transmitted to the host (700 of FIG. 31) according to a request of the host 700.

Figure 33:
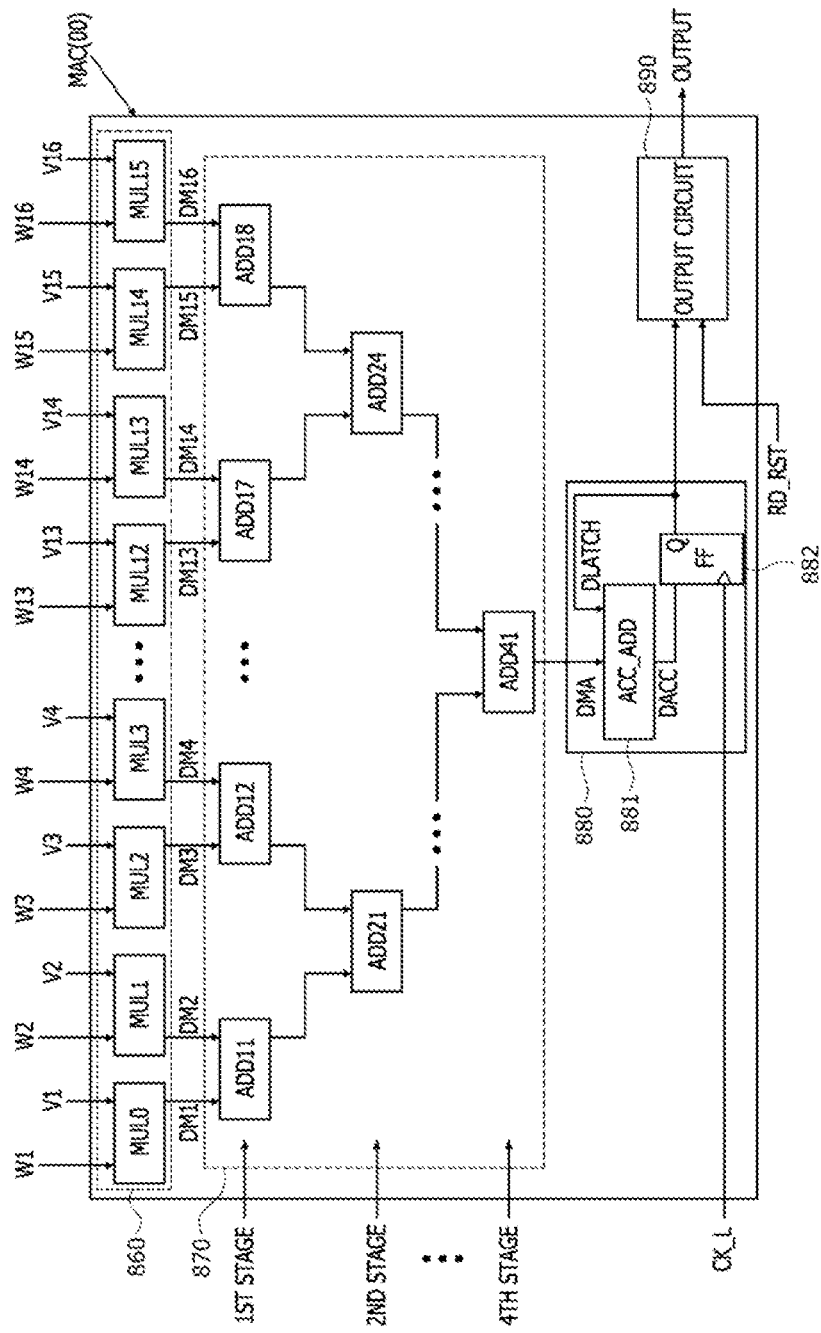
FIG. 33 illustrates an example of a first MAC operator included in the first PIM device illustrated in FIG. 32.

FIG. 33 illustrates an example of the first MAC operator MAC(00) included in the first PIM device 610 illustrated in FIG. 32. The following operation and configuration of the first MAC operator MAC(00) described hereinafter may be equally applicable to each of the second to eighth MAC operators MAC(01)~MAC(07) included in the first PIM device 610 and may also be equally applicable to each of MAC operators included in the second PIM device 620. Referring to FIG. 33, the first MAC operator MAC(00) may include a multiplication circuit 860, an adder tree 870, an accumulator 880, and an output circuit 890.

The multiplication circuit 860 may receive weight data (e.g., first to sixteenth weight data W1~W16) and vector data (e.g., first to sixteenth vector data V1~V16) from respective ones of the first memory bank BK(00) and the first global buffer GB(0) to generate and output first to sixteenth multiplication result data DM1~DM16. In an embodiment, the multiplication circuit 860 may include a plurality of multipliers, for example, first to sixteenth multipliers MUL0~MUL15. Each of the first to sixteenth multipliers MUL0~MUL15 may receive one set of weight data among the first to sixteenth weight data W1~W16 and one set of vector data among the first to sixteenth vector data V1~V16 from respective ones of the first memory bank BK(00) and the first global buffer GB(0). Each of the first to sixteenth multipliers MUL0~MUL15 may perform a multiplying calculation using one set of weight data W and one set of vector data V as input data, thereby generating and outputting one set of multiplication result data DM among the first to sixteenth multiplication result data DM1~DM16. For example, the first multiplier MUL0 may perform a multiplying calculation using the first weight data W1 and the first vector data V1 as input data, thereby generating and outputting the first multiplication result data DM1, and the second multiplier MUL1 may perform a multiplying calculation using the second weight data W2 and the second vector data V2 as input data, thereby generating and outputting the second multiplication result data DM2. In the same way as described above, the remaining third to sixteenth multiplier MUL2~MUL15 may generate and output the third to sixteenth multiplication result data DM3~DM16, respectively. The first to sixteenth multiplication result data DM1~DM16 outputted from the multipliers MUL0~MUL15 may be transmitted to the adder tree 870.

The adder tree 870 may include a plurality of adders ADDs which are arrayed to have a hierarchical structure such as a tree structure. In the present embodiment, the adder tree 870 may be comprised of half-adders. However, the present embodiment is merely an example of the present disclosure. Accordingly, in some other embodiment, the adder tree 870 may be comprised of full-adders. In the present embodiment, eight adders ADD11~ADD18 may be disposed in a first stage located at a highest level of the adder tree 870, and four adders ADD21~ADD24 may be disposed in a second stage located at a second highest level of the adder tree 870. Although not shown in FIG. 33, two adders may be disposed in a third stage located at a third highest level of the adder tree 870. In addition, one adder ADD41 may be disposed in a fourth stage located at a lowest level of the adder tree 870.

Each of the adders ADD11~ADD18 disposed in the first stage of the adder tree 870 may receive two sets of multiplication result data outputted from two of the first to sixteenth multipliers MUL0~MUL15 included in the multiplication circuit 860. In addition, each of the adders ADD11~ADD18 may perform an adding calculation of the two sets of multiplication result data to generate and output added data. For example, the adder ADD11 disposed in the first stage of the adder tree 870 may perform an adding calculation of the first multiplication result data DM1 and the second multiplication result data DM2 outputted from respective ones of the first and second multipliers MUL0 and MUL1, thereby generating and outputting added data as a result of the adding calculation. Similarly, the adder ADD18 disposed in the first stage of the adder tree 870 may perform an adding calculation of the fifteenth multiplication result data DM15 and the sixteenth multiplication result data DM16 outputted from respective ones of the fifteenth and sixteenth multipliers MUL14 and MUL15, thereby generating and outputting added data as a result of the adding calculation.

Each of the adders ADD21~ADD24 disposed in the second stage of the adder tree 870 may receive two sets of added data outputted from two of the adders ADD11~ADD18 disposed in the first stage and may perform an adding calculation of the two sets of added data to generate and output added data as a result of the adding calculation. For example, the adder ADD21 disposed in the second stage of the adder tree 870 may perform an adding calculation of the two sets of added data outputted from respective ones of the adders ADD11 and ADD12 in the first stage, thereby generating and outputting added data as a result of the adding calculation. The added data outputted from the adder ADD21 may have a value corresponding to a sum of the first to fourth multiplication result data DM1~DM4. In the same way as described above, the adder ADD41 disposed in the fourth stage of the adder tree 870 may perform an adding calculation of the two sets of added data outputted from respective ones of two adders in the third stage, thereby generating and outputting addition result data DMA corresponding to output data of the adder tree 870. The addition result data DMA outputted from the adder tree 870 may be transmitted to the accumulator 880.

The accumulator 880 may perform an accumulative adding calculation for adding the addition result data DMA outputted from the adder tree 870 to latched data DLATCH. The accumulator 880 may include an accumulative adder 881 and a latch circuit 882. The accumulative adder 881 may receive the addition result data DMA from the adder tree 870. The latch circuit 882 may feedback the latched data DLATCH to the accumulative adder 881 in response to a latch clock signal CK_L having a logic "high" level. The latched data DLATCH may mean data which are latched in the latch circuit 882 by a previous MAC arithmetic operation. The accumulative adder 881 may add the latched data DLATCH to the addition result data DMA to generate and output accumulated data DACC. The accumulated data DACC outputted from the accumulative adder 881 may be transmitted to an input terminal of the latch circuit 882.

The latch circuit 882 may latch the accumulated data DACC outputted from the accumulative adder 881 in response to the latch clock signal CK_L having a logic "high" level. Thus, the data which are previously latched in the latch circuit 882 may be updated into the accumulated data DACC. The latch circuit 882 may output the accumulated data DACC through an output terminal Q in response to the latch clock signal CK_L having a logic "high" level. The accumulated data DACC outputted from the latch circuit 882 may be used as the latched data DLATCH which are transmitted to the accumulative adder 881 when a next MAC arithmetic operation is performed. In addition, the accumulated data DACC outputted from the latch circuit 882 may also be transmitted to the output circuit 890.

The output circuit 890 may receive the accumulated data DACC from the latch circuit 882 to output the accumulated data DACC or to interrupt the output of the accumulated data DACC according to a logic level of a result read signal RD_RST. In an embodiment, when a MAC arithmetic operation completely terminates to generate MAC result data (i.e., when the accumulated data DACC outputted from the latch circuit 882 correspond to MAC result data), the result read signal RD_RST having a logic "high" level may be transmitted to the output circuit 890. In such a case, the output circuit 890 may output the accumulated data DACC corresponding to the MAC result data as output data of the first MAC operator MAC(00), in response to the result read signal RD_RST having a logic "high" level. In contrast, when the MAC result data are not generated during a MAC arithmetic operation, the result read signal RD_RST having a logic "low" level may be transmitted to the output circuit 890. In such a case, the output circuit 890 may interrupt the output of the accumulated data DACC in response to the result read signal RD_RST having a logic "low" level.

Figure 34:
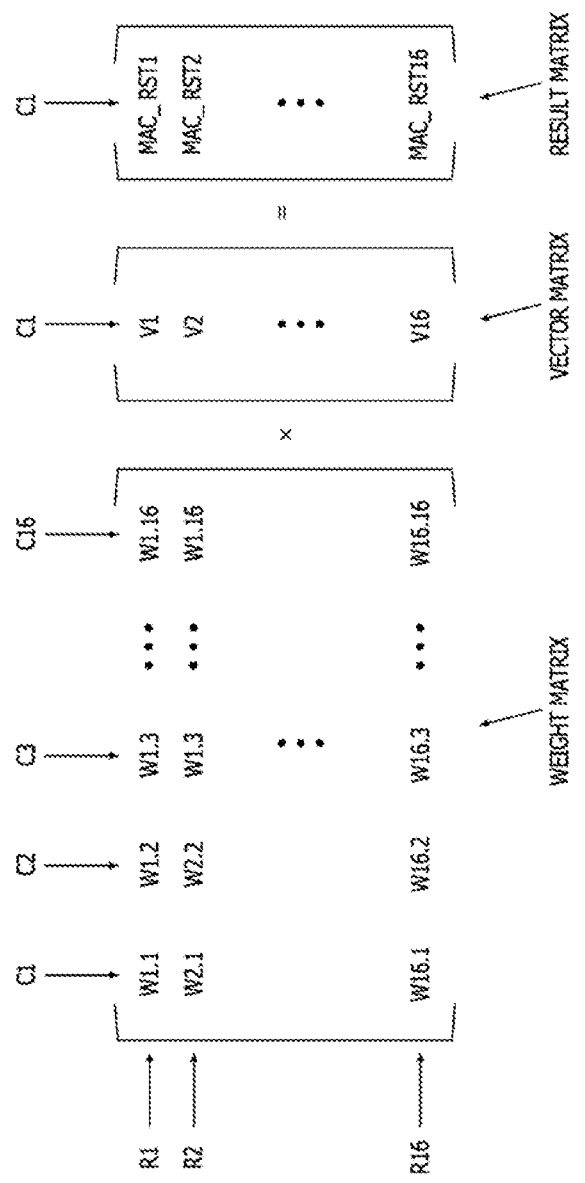
FIG. 34 illustrates an example of a MAC arithmetic operation performed by the first PIM device illustrated in FIG. 32.

FIG. 34 illustrates an example of a MAC arithmetic operation performed by the first PIM device 610 illustrated in FIG. 32. The flowing description may also be equally applied to a MAC arithmetic operation performed by the second PIM device 620. In such a case, only the weight data used for the MAC arithmetic operation may be different. The MAC arithmetic operation according to the present embodiment may be different from the MAC arithmetic operation described with reference to FIG. 5 in terms of a point that the MAC arithmetic operation according to the present embodiment is performed by the first to eighth MAC operators MAC(00)~MAC(07). In substance, the explanation described with reference to FIG. 5 may be equally applied to the MAC arithmetic operation according to the present embodiment.

Referring to FIG. 34, the first to eighth MAC operators MAC(00)~MAC(07) may perform a MAC arithmetic operation that executes a matrix multiplying calculation of a weight matrix and a vector matrix to generate a result matrix. The number of rows in the vector matrix may be equal to the number of columns in the weight matrix. The number of rows in the result matrix may be equal to the number of rows in the weight matrix. The present embodiment will be described in conjunction with a case for which the weight matrix has 16 rows and 16 columns. In such a case, the weight matrix may have first to sixteenth rows R1~R16 and first to sixteenth columns C1~C16. The vector matrix may have 16 rows (i.e., first to sixteenth rows R1~R16) and one column (i.e., C1). The result matrix may also have 16 rows (i.e., first to sixteenth rows R1~R16) and one column (i.e., C1). The weight matrix may have 256 (=16×16) elements W1.1~W1.16, . . . , and W16.1~W16.16. The elements W1.1~W1.16, . . . , and W16.1~W16.16 of the weight matrix may correspond to 256 sets of weight data which are used for MAC arithmetic operations. The vector matrix may have 16 elements V1~V16. The elements V1~V16 of the vector matrix may correspond to first to sixteenth sets of vector data which are used for MAC arithmetic operations. The result matrix may have 16 elements MAC_RST1~MAC_RST16. The elements MAC_RST1~MAC_RST16 of the result matrix may correspond to first to sixteenth sets of MAC result data which are generated by MAC arithmetic operations. Hereinafter, a term "an element of the weight matrix" may be construed as having the same meaning as the term "weight data" or "one set of weight data," and a term "an element of the vector matrix" may be construed as having the same meaning as the term "vector data" or "one set of vector data." In addition, a term "an element of the result matrix" may be construed as having the same meaning as the term "MAC result data" or "one set of MAC result data."

Figure 35:
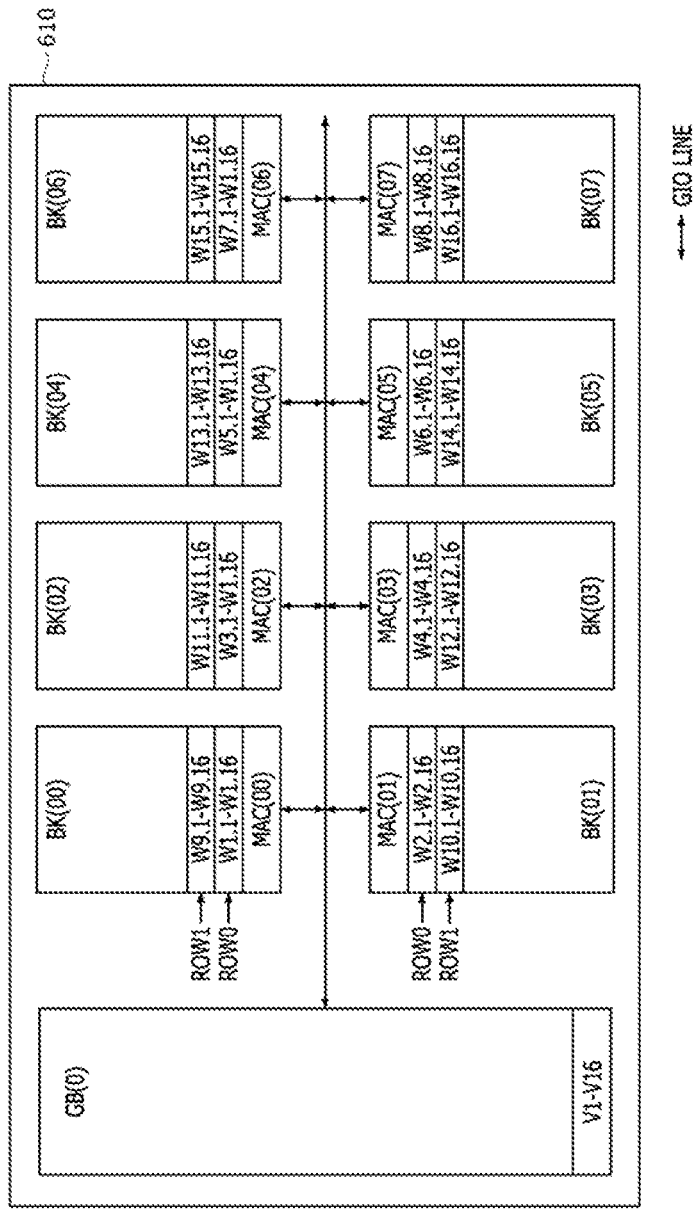
FIG. 35 illustrates a process for storing weight data and vector data illustrated in FIG. 34 into memory banks and a first global buffer of the first PIM device illustrated in FIG. 32.

FIG. 35 illustrates a process for storing the weight data W1.1~W1.16, . . . , and W16.1~W16.16 of the weight matrix illustrated in FIG. 34 and the vector data V1~V16 of the vector matrix illustrated in FIG. 34 into the memory banks BK(00)~BK(07) and the first global buffer GB(0) included in the first PIM device 610 of FIG. 32. Referring to FIGS. 34 and 35, the vector data V1~V16 of the vector matrix may be stored in the first global buffer GB(0), and the weight data W1.1~W1.16, . . . , and W16.1~W16.16 of the weight matrix may be dispersedly stored in the memory banks BK(00)~BK(07) in units of the weight matrix rows R. In an embodiment, the weight data Ws arrayed in one of the first to sixteenth rows R1~R16 of the weight matrix may be stored in one of a plurality of rows ROWs of any one among the memory banks BK(00)~BK(07). In another embodiment, the weight data Ws arrayed in two or more rows Rs of the weight matrix may be stored in one of the plurality of rows ROWs of any one among the memory banks BK(00)~BK(07).

Specifically, first to eighth groups of weight data W1.1~W1.16, . . . , and W8.1~W8.16 arrayed in respective ones of first eight rows (i.e., the first to eighth rows R1~R8) of the weight matrix may be stored in the first rows ROW0 of the first to eighth memory banks BK(00)~BK(07), respectively. For example, the weight data W1.1~W1.16 arrayed in the first row R1 of the weight matrix may be stored in the first row ROW0 of the first memory bank BK(00), and the weight data W2.1~W2.16 arrayed in the second row R2 of the weight matrix may be stored in the first row ROW0 of the second memory bank BK(01). In addition, the weight data W3.1~W3.16 arrayed in the third row R3 of the weight matrix may be stored in the first row ROW0 of the third memory bank BK(02). In the same way, the weight data W8.1~W8.16 arrayed in the eighth row R8 of the weight matrix may be stored in the first row ROW0 of the eighth memory bank BK(07).

Ninth to sixteenth groups of weight data W9.1~W9.16, . . . , and W16.1~W16.16 arrayed in respective ones of second eight rows (i.e., the ninth to sixteenth rows R9~R16) of the weight matrix may be stored in the second rows ROW1 of the first to eighth memory banks BK(00)~BK(07), respectively. For example, the weight data W9.1~W9.16 arrayed in the ninth row R9 of the weight matrix may be stored in the second row ROW1 of the first memory bank BK(00), and the weight data W10.1~W10.16 arrayed in the tenth row R10 of the weight matrix may be stored in the second row ROW1 of the second memory bank BK(01). In addition, the weight data W11.1~W11.16 arrayed in the eleventh row R11 of the weight matrix may be stored in the second row ROW1 of the third memory bank BK(02). In the same way, the weight data W16.1~W16.16 arrayed in the sixteenth row R16 of the weight matrix may be stored in the second row ROW1 of the eighth memory bank BK(07).

A MAC arithmetic operation performed by each of the first to eighth MAC operators MAC(00)~MAC(07) included in the first PIM device 610 may be the same as the MAC arithmetic operation of the first MAC operator MAC(00), which is described with reference to FIG. 33. Specifically, the first to eighth MAC operators MAC(00)~MAC(07) may perform MAC arithmetic operations using the first to eighth groups of weight data W1.1~W1.16, . . . , and W8.1~W8.16 arrayed in respective ones of the first eight rows (i.e., the first to eighth rows R1~R8) of the weight matrix and the first to sixteenth vector data V1~V16 of the vector matrix as input data, thereby generating and output the first to eighth MAC result data MAC_RST1~MAC_RST8, respectively. Subsequently, the first to eighth MAC operators MAC(00)~MAC(07) may perform MAC arithmetic operations using the ninth to sixteenth groups of weight data W9.1~W9.16, . . . , and W16.1~W16.16 arrayed in respective ones of the second eight rows (i.e., the ninth to sixteenth rows R9~R16) of the weight matrix and the first to sixteenth vector data V1~V16 of the vector matrix as input data, thereby generating and output the ninth to sixteenth MAC result data MAC_RST9~MAC_RST16, respectively.

As described above, in order that the first to eighth MAC operators MAC(00)~MAC(07) perform the MAC arithmetic operations, the weight data and the vector data used for the MAC arithmetic operations have to be stored in the memory banks BK(00)~BK(07) and the first global buffer GB(0) in advance. A process for storing the weight data into the memory banks BK(00)~BK(07) may be executed by an active operation and a write operation for the memory banks BK(00)~BK(07) in the memory mode. A process for storing the vector data into the first global buffer GB(0) may be executed by a write operation for the first global buffer GB(0) in the arithmetic mode. The vector data may be provided by an external device and may be written into the first global buffer GB(0) through the host (700 of FIG. 31). However, in some other embodiments, the vector data may be initially stored in any one of the first to eighth memory banks BK(00)~BK(07). In such a case, the host (700 of FIG. 31) may read out the vector data in the memory bank to store the vector data into the data buffer (710 of FIG. 31) and may write the vector data in the data buffer 710 into the first global buffer GB(0).

Figure 36:
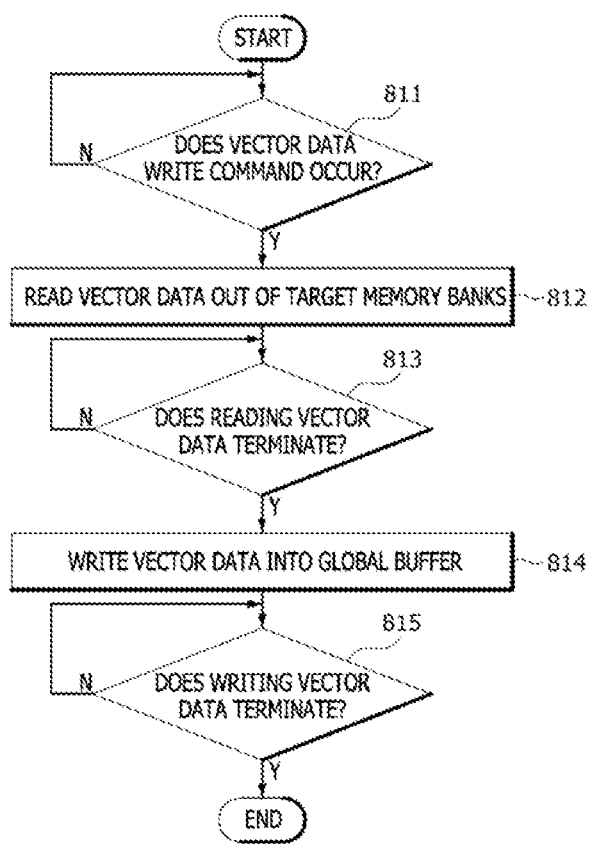
FIG. 36 is a flowchart illustrating an example of a process for supplying vector data to first and second global buffers of first and second PIM devices included in the PIM system illustrated in FIG. 31.

FIG. 36 is a flowchart illustrating an example of a process for supplying the vector data V1~V16 to the first global buffer GB(0) of the first PIM device 610 and the second global buffer (not shown) of the second PIM device 620 in the PIM system 1-5 illustrated in FIG. 31. Referring to FIG. 36, at a step 811, the host (700 of FIG. 31) may determine whether a vector data write command occurs. The vector data write command may be defined as a command requesting an operation for supplying the vector data used for the MAC arithmetic operation to the MAC operators. When no vector data write command occurs at the step 811, a standby status may be maintained. The standby status may mean a status for continuously or periodically verifying occurrence of the vector data write command. When the vector data write command occurs at the step 811, the host 700 may read out the vector data stored in target memory banks at a step 812. The target memory banks may mean memory banks of the first and second PIM devices 610 and 620 in which the vector data are stored. At a step 813, whether the vector data in the target memory banks are completely read out may be determined. When the vector data in the target memory banks are not completely read out at the step 813, the step 812 may be executed again. In contrast, when the vector data in the target memory banks are completely read out at the step 813, the host 700 may write the vector data into the global buffer at a step 814. At a step 815, whether the vector data are completely written into the global buffer may be determined. When the vector data are not completely written into the global buffer at the step 815, the step 814 may be executed again. In contrast, when the vector data are completely written into the global buffer at the step 815, the process for storing the vector data into the global buffer may terminate. Subsequently, although not shown in FIG. 36, the vector data stored in the global buffer may be transmitted to the MAC operators.

Figure 37:
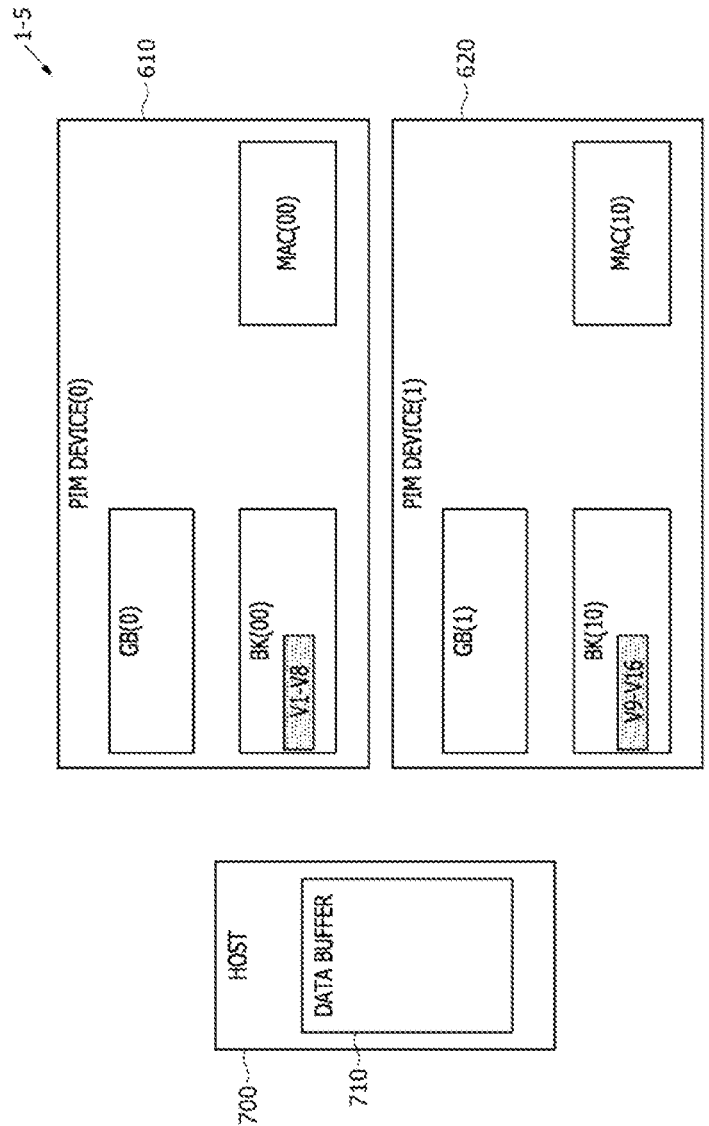
FIGS. 37 to 39 illustrate operations performed at various steps of the flowchart illustrated in FIG. 36.
Figure 38:
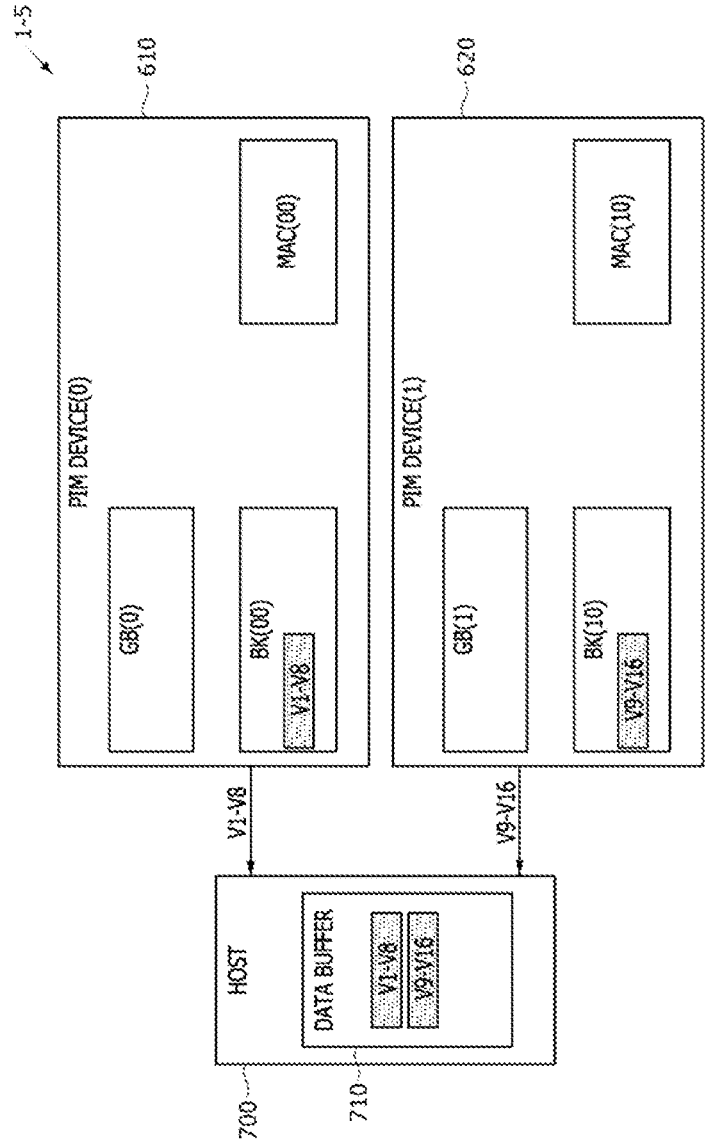
Figure 39:
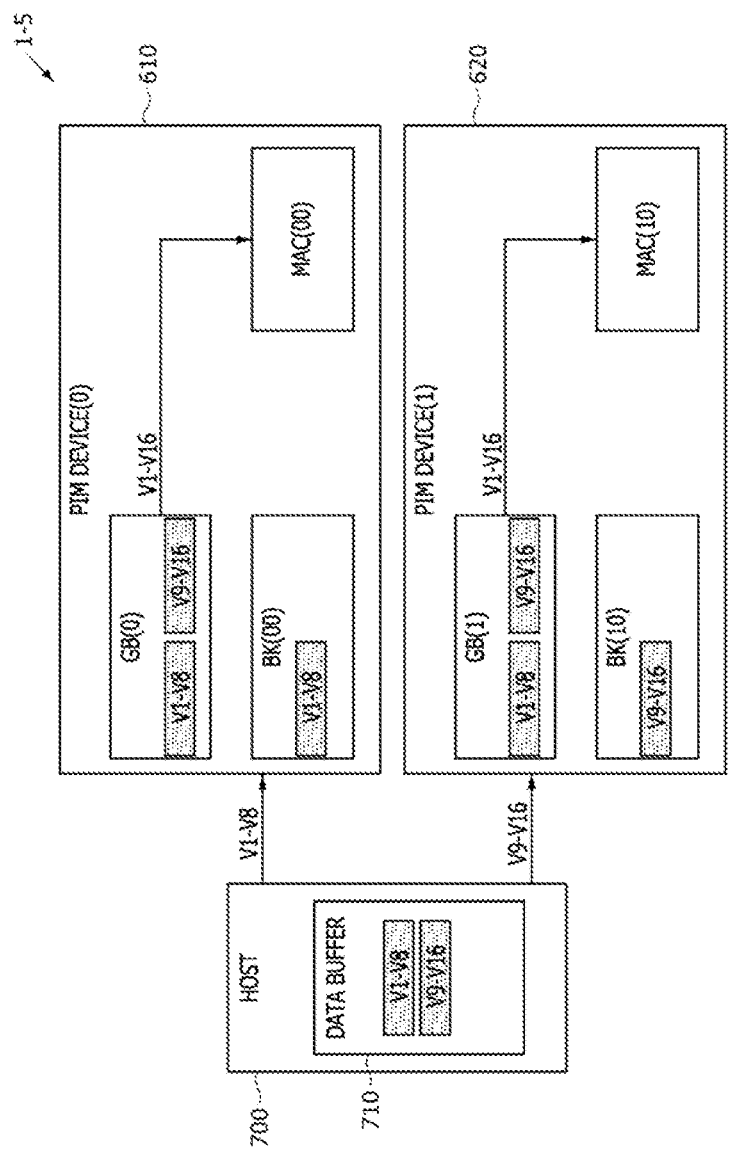

FIGS. 37 to 39 illustrate operations performed at the various steps of the flowchart illustrated in FIG. 36. In the present embodiment, it may be assumed that the vector data used for the MAC arithmetic operation include a first group of vector data and a second group of vector data. The first group of vector data may include the first to eighth vector data V1~V8, and the second group of vector data may include the ninth to sixteenth vector data V9~V16. As illustrated in FIG. 37, it may be assumed that the first group of vector data (i.e., the first to eight vector data V1~V8) are stored in the first memory bank BK(00) of the first PIM device 610, and the second group of vector data (i.e., the ninth to sixteenth vector data V9~V16) are stored in a first memory bank BK(10) of the second PIM device 620. The first memory bank BK(00) of the first PIM device 610 in which the first group of vector data V1~V8 are stored may correspond to a first target memory bank of the target memory banks described with reference to FIG. 36, and the first memory bank BK(10) of the second PIM device 620 in which the second group of vector data V9~V16 are stored may correspond to a second target memory bank of the target memory banks described with reference to FIG. 36.

When the vector data write command occurs at the step 811 of FIG. 36, the host 700 may read the first to eighth vector data V1~V8 out of the first memory bank BK(00) of the first PIM device 610 and may store the first to eighth vector data V1~V8 into the data buffer 710 of the host 700 (refer to the step 812 of FIG. 36), as illustrated in FIG. 38. In addition, the host 700 may also read the ninth to sixteenth vector data V9~V16 out of the first memory bank BK(10) of the second PIM device 620 and may store the ninth to sixteenth vector data V9~V16 into the data buffer 710 of the host 700 (refer to the step 812 of FIG. 36), as illustrated in FIG. 38. When the first to sixteenth vector data V1~V16 are completely read out of the first memory banks BK(00) and BK(10) at the step 813 of FIG. 36, the host 700 may write the first to sixteenth vector data V1~V16 stored in the data buffer 710 into each of the first global buffer GB(0) of the first PIM device 610 and the second global buffer GB(1) of the second PIM device 620 (refer to the step 814 of FIG. 36), as illustrated in FIG. 39. When the first to sixteenth vector data V1~V16 are completely written into each of the first and second global buffers GB(0) and GB(1) at the step 815 of FIG. 36, the first to sixteenth vector data V1~V16 written into the first global buffer GB(0) may be transmitted to the first MAC operator MAC(00) of the first PIM device 610 and the first to sixteenth vector data V1~V16 written into the second global buffer GB(1) may be transmitted to a first MAC operator MAC(10) of the second PIM device 620.

Figure 40:
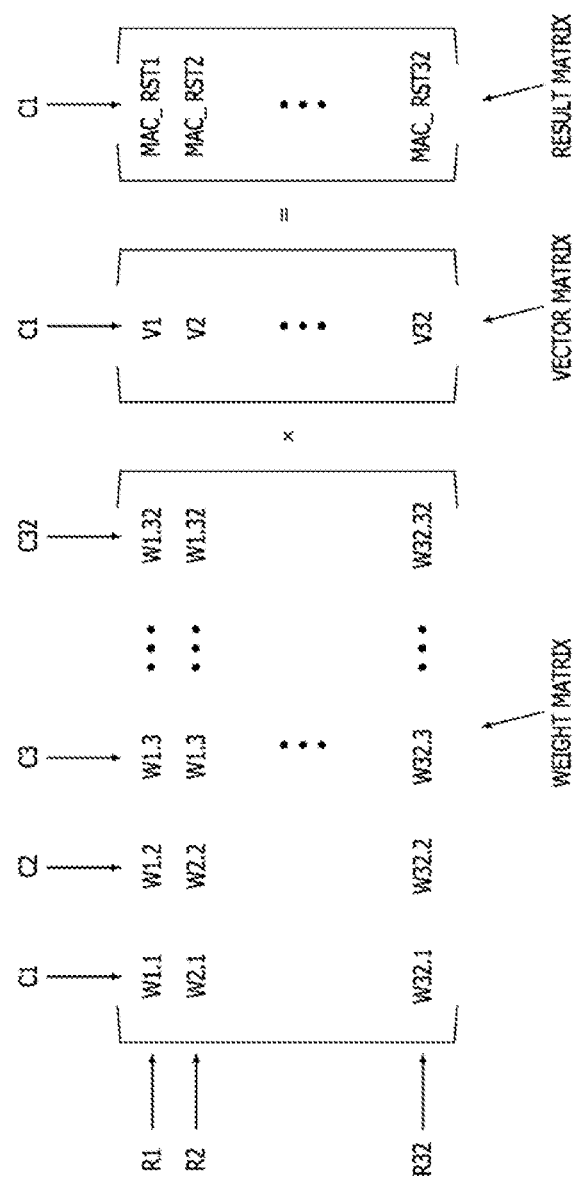
FIG. 40 illustrates another example of a MAC arithmetic operation performed by the first PIM device illustrated in FIG. 32.

FIG. 40 illustrates another example of the MAC arithmetic operation performed by the first PIM device 610 illustrated in FIG. 32. The following description may also be equally applied to a MAC arithmetic operation performed by the second PIM device 620. In such a case, only the weight data used for the MAC arithmetic operation may be different. The MAC arithmetic operation according to the present embodiment may be different from the MAC arithmetic operation described with reference to FIG. 5 in terms of a point that the MAC arithmetic operation according to the present embodiment is performed by the first to eighth MAC operators MAC(00)~MAC(07). In substance, the explanation described with reference to FIG. 5 may be equally applied to the MAC arithmetic operation according to the present embodiment. In addition, the MAC arithmetic operation according to the present embodiment may be different from the MAC arithmetic operation described with reference to FIG. 34 in terms of a point that the MAC result data MAC_RST are generated by iteratively executing a plurality of MAC arithmetic operations.

Referring to FIG. 40, the first to eighth MAC operators MAC(00)~MAC(07) may perform MAC arithmetic operations that execute a matrix multiplying calculation of a weight matrix and a vector matrix to generate a result matrix. In the present embodiment, it may be assumed that the weight matrix has 32 rows and 32 columns. That is, the weight matrix may have first to $32^{nd}$ rows R1~R32 and first to $32^{nd}$ columns C1~C32. The vector matrix may have 32 rows R1~R32 and one column C1. The result matrix may also have 32 rows R1~R32 and one column C1. The weight matrix may have 1024 (=32×32) weight data, that is, 1024 sets of weight data W1.1~W1.32, . . . , and W32.1~W32.32. The vector matrix may have 32 vector data, that is, 32 sets of vector data V1~V32. The result matrix may have 32 MAC result data, that is, 32 sets of MAC result data MAC_RST1~MAC_RST32.

Each of the MAC operators may generate one set of MAC result data MAC_RST through a matrix calculation of weight data arrayed in one row R of the weight matrix and vector data arrayed in the vector matrix. In case of a MAC arithmetic operation according to the present embodiment, 32 weight data (i.e., 32 sets of weight data) may be arrayed in each of the rows of the weight matrix. That is, each MAC operator may perform a matrix calculation using 32 sets of weight data and 32 sets of vector data as input data to generate one set of MAC result data MAC_RST. However, as described with reference to FIG. 33, a MAC arithmetic operation performed by the first MAC operator MAC(00) of the first PIM device 610 may be executed using 16 sets of weight data and 16 sets of vector data as input data. Thus, in order that a certain MAC operator performs a MAC arithmetic operation using 32 sets of weight data arrayed in one row of the weight matrix as input data to generate one set of MAC result data, the certain MAC operator has to perform two sub-MAC arithmetic operations. Accordingly, it may be necessary to divide the weight matrix and the vector matrix into a plurality of weight sub-matrixes and a plurality of vector sub-matrixes.

Figure 41:
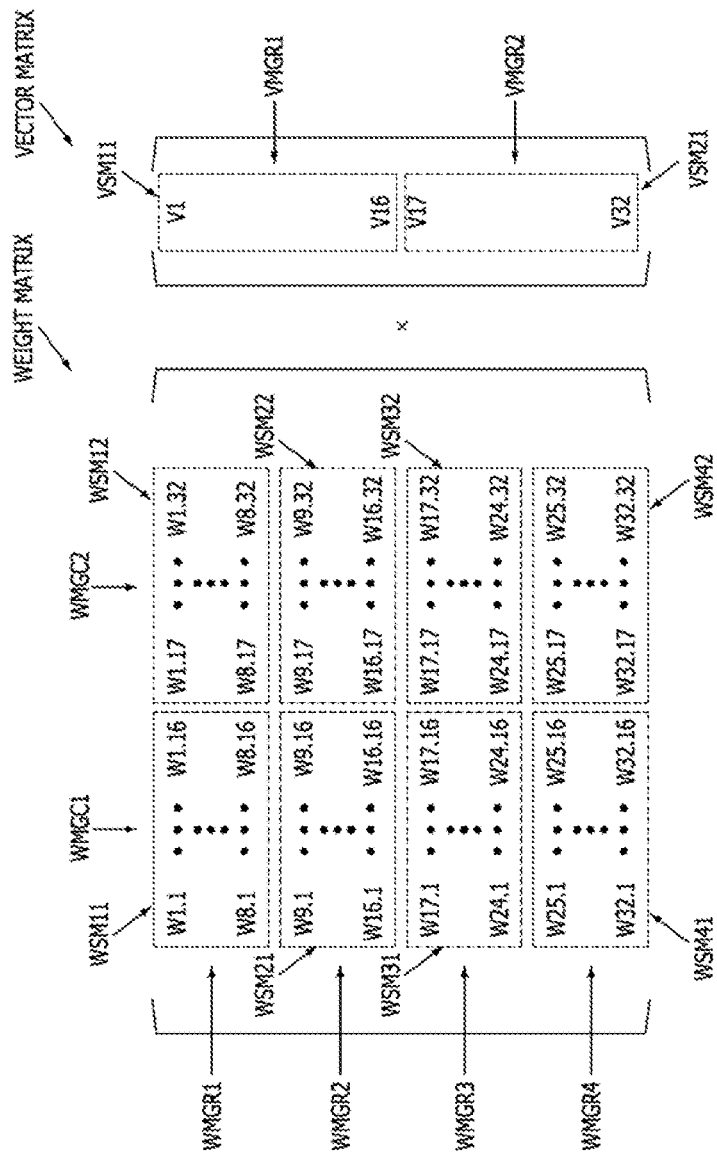
FIG. 41 illustrates a process for dividing a weight matrix and a vector matrix illustrated in FIG. 40 into a plurality of weight sub-matrixes and a plurality of vector sub-matrixes.

FIG. 41 illustrates a process for dividing the weight matrix and the vector matrix illustrated in FIG. 40 into a plurality of weight sub-matrixes and a plurality of vector sub-matrixes. Referring to FIG. 41, the weight matrix and the vector matrix used for the MAC arithmetic operations of the first and second PIM devices (610 and 620 of FIG. 31) may be divided into a plurality of weight sub-matrixes WSMs and a plurality of vector sub-matrixes VSMs according to the number of memory banks and an amount of computation of each MAC operator. The amount of computation of each MAC operator may be defined as the number of weight data (i.e., a total size of weight data) which is capable of being processed by each MAC operator at a time. Each of the weight sub-matrixes WSMs constituting the weight matrix may be defined by weight matrix group rows WMGRs and weight matrix group columns WMGCs. Each of the vector sub-matrixes VSMs constituting the vector matrix may be defined by vector matrix group rows VMGRs.

The number of the weight matrix group rows WMGRs may be determined by the number of memory banks BKs included in each MAC operator. The number of the weight matrix group columns WMGCs may be determined by the amount of computation of each MAC operator. In an embodiment, the number of the weight matrix group rows WMGRs may be determined by dividing the number of rows of the weight matrix by the number of memory banks. The number of the weight matrix group columns WMGCs may be determined by dividing the number of columns of the weight matrix by the amount of computation of each MAC operator. When the number of rows of the weight matrix is '32' and the number of memory banks included in each MAC operator is '8' like the present embodiment, the weight matrix may have four weight matrix group rows (i.e., first to fourth weight matrix group rows WMGR1~WMGR4). In addition, when the number of columns of the weight matrix is '32' and the amount of computation of each MAC operator is '16' (i.e., 16 sets of weight data), the weight matrix may have two weight matrix group columns (i.e., first and second weight matrix group columns WMGC1 and WMGC2).

The number of the vector matrix group rows VMGRs may be determined by dividing the number of rows of the vector matrix by the amount of computation of each MAC operator. When the number of rows of the vector matrix is '32' and the amount of computation of each MAC operator is '16' (i.e., 16 sets of weight data) like the present embodiment, the vector matrix may have two vector matrix group rows (i.e., first and second vector matrix group rows VMGR1 and VMGR2). That is, the vector matrix may be comprised of a first vector sub-matrix VSM11 located in the first vector matrix group row VMGR1 and a second vector sub-matrix VSM21 located in the second vector matrix group row VMGR2. The number of the vector matrix group rows VMGRs of the vector matrix may be equal to the number of the weight matrix group columns WMGCs of the weight matrix.

The first weight matrix group row WMGR1 may include the first to eighth rows R1~R8 of the weight matrix. The second weight matrix group row WMGR2 may include the ninth to sixteenth rows R9~R16 of the weight matrix. The third weight matrix group row WMGR3 may include the seventeenth to $24^{th}$ rows R17~R24 of the weight matrix. The fourth weight matrix group row WMGR4 may include the $25^{th}$ to $32^{nd}$ rows R25~R32 of the weight matrix. The first weight matrix group column WMGC1 may include the first to sixteenth columns C1~C16 of the weight matrix. The second weight matrix group column WMGC2 may include the seventeenth to $32^{nd}$ columns C17~C32 of the weight matrix. The first vector matrix group row VMGR1 may include the first to sixteenth rows R1~R16 of the vector matrix. The second vector matrix group row VMGR2 may include the seventeenth to $32^{nd}$ rows R17~R32 of the vector matrix.

A weight sub-matrix WSM11 may be defined to have elements located at cross points of the first to eighth rows R1~R8 belonging to the first weight matrix group row WMGR1 and the first to sixteenth columns C1~C16 belonging to the first weight matrix group column WMGC1. A weight sub-matrix WSM12 may be defined to have elements located at cross points of the first to eighth rows R1~R8 belonging to the first weight matrix group row WMGR1 and the seventeenth to $32^{nd}$ columns C17~C32 belonging to the second weight matrix group column WMGC2. A weight sub-matrix WSM21 may be defined to have elements located at cross points of the ninth to sixteenth rows R9~R16 belonging to the second weight matrix group row WMGR2 and the first to sixteenth columns C1~C16 belonging to the first weight matrix group column WMGC1. A weight sub-matrix WSM22 may be defined to have elements located at cross points of the ninth to sixteenth rows R9~R16 belonging to the second weight matrix group row WMGR2 and the seventeenth to $32^{nd}$ columns C17~C32 belonging to the second weight matrix group column WMGC2. A weight sub-matrix WSM31 may be defined to have elements located at cross points of the seventeenth to $24^{th}$ rows R17~R24 belonging to the third weight matrix group row WMGR3 and the first to sixteenth columns C1~C16 belonging to the first weight matrix group column WMGC1. A weight sub-matrix WSM32 may be defined to have elements located at cross points of the seventeenth to $24^{th}$ rows R17~R24 belonging to the third weight matrix group row WMGR3 and the seventeenth to $32^{nd}$ columns C17~C32 belonging to the second weight matrix group column WMGC2. A weight sub-matrix WSM41 may be defined to have elements located at cross points of the $25^{th}$ to $32^{nd}$ rows R25~R32 belonging to the fourth weight matrix group row WMGR4 and the first to sixteenth columns C1~C16 belonging to the first weight matrix group column WMGC1. A weight sub-matrix WSM42 may be defined to have elements located at cross points of the $25^{th}$ to $32^{nd}$ rows R25~R32 belonging to the fourth weight matrix group row WMGR4 and the seventeenth to $32^{nd}$ columns C17~C32 belonging to the second weight matrix group column WMGC2. The first vector sub-matrix VSM11 may be defined to have elements located at cross points of the first to sixteenth rows R1~R16 belonging to the first vector matrix group row VMGR1 and a column belonging to a vector matrix group column VMGC. The second vector sub-matrix VSM21 may be defined to have elements located at cross points of the seventeenth to $32^{nd}$ rows R17~R32 belonging to the second vector matrix group row VMGR2 and the column belonging to the vector matrix group column VMGC.

The two weight sub-matrixes WSM11 and WSM12 located in the first weight matrix group row WMGR1 may include the weight data W1.1~W1.32, ..., and W8.1~W8.32 arrayed in the first to eighth rows R1~R8 of the weight matrix. The two weight sub-matrixes WSM21 and WSM22 located in the second weight matrix group row WMGR2 may include the weight data W9.1~W9.32, ..., and W16.1~W16.32 arrayed in the ninth to sixteenth rows R9~R16 of the weight matrix. The two weight sub-matrixes WSM31 and WSM32 located in the third weight matrix group row WMGR3 may include the weight data W17.1~W17.32, ..., and W24.1~W24.32 arrayed in the seventeenth to $24^{th}$ rows R17~R24 of the weight matrix. The two weight sub-matrixes WSM41 and WSM42 located in the fourth weight matrix group row WMGR4 may include the weight data W25.1~W25.32, ..., and W32.1~W32.32 arrayed in the $25^{th}$ to $32^{nd}$ rows R25~R32 of the weight matrix. The four weight sub-matrixes WSM11, WSM21, WSM31, and WSM41 located in the first weight matrix group column WMGC1 may include the weight data W1.1~W32.1, ..., and W1.16~W32.16 arrayed in the first to sixteenth columns C1~C16 of the weight matrix. The four weight sub-matrixes WSM12, WSM22, WSM32, and WSM42 located in the second weight matrix group column WMGC2 may include the weight data W1.17~W32.17, ..., and W1.32~W32.32 arrayed in the seventeenth to $32^{nd}$ columns C17~C32 of the weight matrix. The first vector sub-matrix VSM11 may include the first to sixteenth vector data V1~V16 arrayed in the first to sixteenth rows R1~R16 of the vector matrix. The second vector sub-matrix VSM21 may include the seventeenth to $32^{nd}$ vector data V17~V32 arrayed in the seventeenth to $32^{nd}$ rows R17~R32 of the vector matrix.

In order that the first to eighth MAC operators MAC(00)~MAC(07) of the first PIM device 610 perform a MAC arithmetic operation of the weight matrix and the vector matrix illustrated in FIG. 41 to generate the first to $32^{nd}$ MAC result data MAC_RST1~MAC_RST32, four MAC arithmetic operations (i.e., first to fourth MAC arithmetic operations) have to be performed. The first MAC arithmetic operation may be performed by the first to eighth MAC operators MAC(00)~MAC(07) using the weight data (i.e., the weight data W1.1~W1.32, ..., and W8.1~W8.32 arrayed in the first weight matrix group row WMGR1) in the weight sub-matrixes WSM11 and WSM12 and the vector data V1~V32 in the vector matrix as input data. For example, the first MAC operator MAC(00) may perform the first MAC arithmetic operation using the weight data W1.1~W1.32 arrayed in a first row (i.e., the first row R1 of the weight matrix) of the first weight matrix group row WMGR1 and the vector data V1~V32 arrayed in the vector matrix as input data. Similarly, the eighth MAC operator MAC(07) may perform the first MAC arithmetic operation using the weight data W8.1~W8.32 arrayed in a last row (i.e., the eighth row R8 of the weight matrix) of the first weight matrix group row WMGR1 and the vector data V1~V32 arrayed in the vector matrix as input data.

The second MAC arithmetic operation may be performed by the first to eighth MAC operators MAC(00)~MAC(07) using the weight data (i.e., the weight data W9.1~W9.32, ..., and W16.1~W16.32 arrayed in the second weight matrix group row WMGR2) in the weight sub-matrixes WSM21 and WSM22 and the vector data V1~V32 in the vector matrix as input data. For example, the first MAC operator MAC(00) may perform the second MAC arithmetic operation using the weight data W9.1~W9.32 arrayed in a first row (i.e., the ninth row R9 of the weight matrix) of the second weight matrix group row WMGR2 and the vector data V1~V32 arrayed in the vector matrix as input data. Similarly, the eighth MAC operator MAC(07) may perform the second MAC arithmetic operation using the weight data W16.1~W16.32 arrayed in a last row (i.e., the sixteenth row R16 of the weight matrix) of the second weight matrix group row WMGR2 and the vector data V1~V32 arrayed in the vector matrix as input data.

The third MAC arithmetic operation may be performed by the first to eighth MAC operators MAC(00)~MAC(07) using the weight data (i.e., the weight data W17.1~W17.32, ..., and W24.1~W24.32 arrayed in the third weight matrix group row WMGR3) in the weight sub-matrixes WSM31 and WSM32 and the vector data V1~V32 in the vector matrix as input data. For example, the first MAC operator MAC(00) may perform the third MAC arithmetic operation using the weight data W17.1~W17.32 arrayed in a first row (i.e., the seventeenth row R17 of the weight matrix) of the third weight matrix group row WMGR3 and the vector data V1~V32 arrayed in the vector matrix as input data. Similarly, the eighth MAC operator MAC(07) may perform the third MAC arithmetic operation using the weight data W24.1~W24.32 arrayed in a last row (i.e., the $24^{th}$ row R24 of the weight matrix) of the third weight matrix group row WMGR3 and the vector data V1~V32 arrayed in the vector matrix as input data.

The fourth MAC arithmetic operation may be performed by the first to eighth MAC operators MAC(00)~MAC(07) using the weight data (i.e., the weight data W25.1~W25.32, . . . , and W32.1~W32.32 arrayed in the fourth weight matrix group row WMGR4) in the weight sub-matrixes WSM41 and WSM42 and the vector data V1~V32 in the vector matrix as input data. For example, the first MAC operator MAC(00) may perform the fourth MAC arithmetic operation using the weight data W25.1~W25.32 arrayed in a first row (i.e., the $25^{th}$ row R25 of the weight matrix) of the fourth weight matrix group row WMGR4 and the vector data V1~V32 arrayed in the vector matrix as input data. Similarly, the eighth MAC operator MAC(07) may perform the fourth MAC arithmetic operation using the weight data W32.1~W32.32 arrayed in a last row (i.e., the $32^{nd}$ row R32 of the weight matrix) of the fourth weight matrix group row WMGR4 and the vector data V1~V32 arrayed in the vector matrix as input data.

Each of the first to fourth arithmetic operations may include a first sub-MAC arithmetic operation and a second sub-MAC arithmetic operation. The first sub-MAC arithmetic operations of the first to fourth arithmetic operations may be performed using the weight data of the weight sub-matrixes WSM11, WSM21, WSM31, and WSM41 arrayed in the first weight matrix group column WMGC1 and the vector data V1~V16 of the vector sub-matrix VSM11 arrayed in the first vector matrix group row VMGR1 as input data. For example, the first sub-MAC arithmetic operation of the first arithmetic operation may be performed using the weight data W1.1~W1.16, . . . , and W8.1~W8.16 of the weight sub-matrix WSM11 and the vector data V1~V16 of the vector sub-matrix VSM11 as input data, and the second sub-MAC arithmetic operation of the first arithmetic operation may be performed using the weight data W1.17~W1.32, . . . , and W8.17~W8.32 of the weight sub-matrix WSM12 and the vector data V17~V32 of the vector sub-matrix VSM21 as input data. Moreover, the first sub-MAC arithmetic operation of the second arithmetic operation may be performed using the weight data W9.1~W9.16, . . . , and W16.1~W16.16 of the weight sub-matrix WSM21 and the vector data V1~V16 of the vector sub-matrix VSM11 as input data, and the second sub-MAC arithmetic operation of the second arithmetic operation may be performed using the weight data W9.17~W9.32, . . . , and W16.17~W16.32 of the weight sub-matrix WSM22 and the vector data V17~V32 of the vector sub-matrix VSM21 as input data. In addition, the first sub-MAC arithmetic operation of the third arithmetic operation may be performed using the weight data W17.1~W17.16, . . . , and W24.1~W24.16 of the weight sub-matrix WSM31 and the vector data V1~V16 of the vector sub-matrix VSM11 as input data, and the second sub-MAC arithmetic operation of the third arithmetic operation may be performed using the weight data W17.17~W17.32, . . . , and W24.17~W24.32 of the weight sub-matrix WSM32 and the vector data V17~V32 of the vector sub-matrix VSM21 as input data. Further, the first sub-MAC arithmetic operation of the fourth arithmetic operation may be performed using the weight data W25.1~W25.16, . . . , and W32.1~W32.16 of the weight sub-matrix WSM41 and the vector data V1~V16 of the vector sub-matrix VSM11 as input data, and the second sub-MAC arithmetic operation of the fourth arithmetic operation may be performed using the weight data W25.17~W25.32, . . . , and W32.17~W32.32 of the weight sub-matrix WSM42 and the vector data V17~V32 of the vector sub-matrix VSM21 as input data.

First, the first to eighth MAC operators MAC(00)~MAC(07) of the first PIM device 610 may perform the first and second sub-MAC arithmetic operations of the first MAC arithmetic operation to generate the first to eighth MAC result data MAC_RST1~MAC_RST8, respectively. Next, the first to eighth MAC operators MAC(00)~MAC(07) of the first PIM device 610 may perform the first and second sub-MAC arithmetic operations of the second MAC arithmetic operation to generate the ninth to sixteenth MAC result data MAC_RST9~MAC_RST16, respectively. Subsequently, the first to eighth MAC operators MAC(00)~MAC(07) of the first PIM device 610 may perform the first and second sub-MAC arithmetic operations of the third MAC arithmetic operation to generate the seventeenth to $24^{th}$ MAC result data MAC_RST17~MAC_RST24, respectively. Finally, the first to eighth MAC operators MAC(00)~MAC(07) of the first PIM device 610 may perform the first and second sub-MAC arithmetic operations of the fourth MAC arithmetic operation to generate the $25^{th}$ to $32^{nd}$ MAC result data MAC_RST25~MAC_RST32, respectively.

Figure 42:
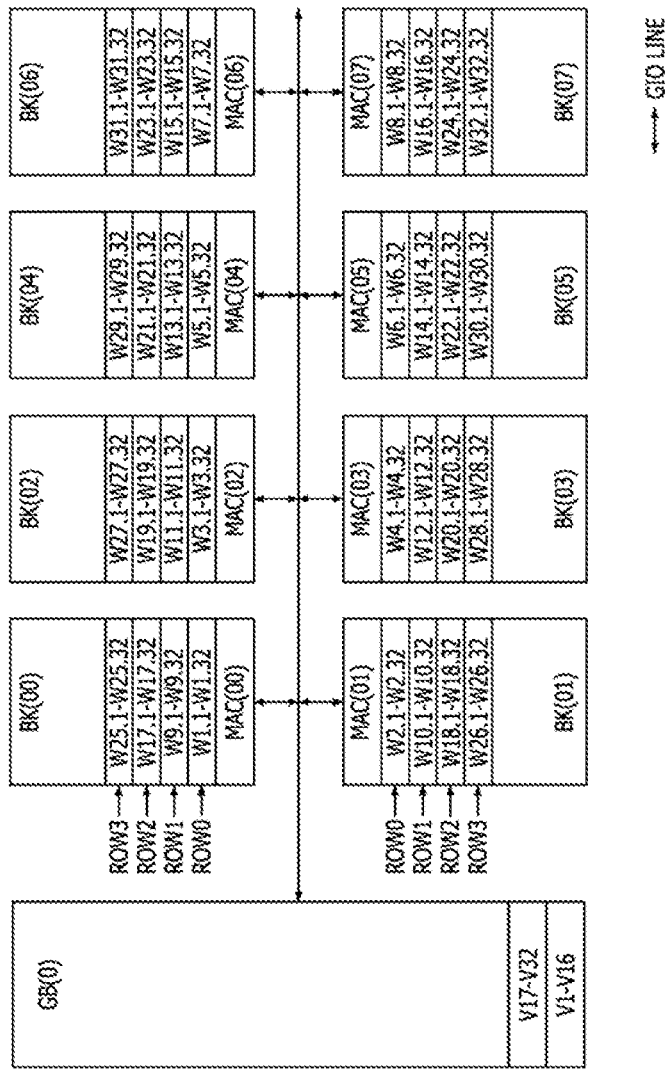
FIG. 42 illustrates a process for storing weight data and vector data illustrated in FIG. 40 into memory banks and a first global buffer of the first PIM device illustrated in FIG. 32.

FIG. 42 illustrates a process for storing the weight data and the vector data illustrated in FIG. 40 or 41 into the memory banks BK(00)~BK(07) and the first global buffer GB(0) of the first PIM device 610 illustrated in FIG. 32. Referring to FIGS. 40, 41, and 42, the vector data V1~V32 arrayed in the vector sub-matrixes VSM11 and VSM21 constituting the vector matrix may be stored into the first global buffer GB(0). The weight data W1.1~W1.32, . . . , and W32.1~W32.32 arrayed in the weight matrix may be stored into the memory banks BK(00)~BK(07) in units of the weight matrix rows. In an embodiment, the weight data arrayed in any one of the first to $32^{nd}$ rows R1~R32 of the weight matrix may be stored into any one of the plurality of rows ROWs included in any one of the memory banks BK(00)~BK(07). Alternatively, the weight data arrayed in two or more rows of the weight matrix may be stored into one of the plurality of rows ROWs included in any one of the memory banks BK(00)~BK(07).

Specifically, eight groups of the weight data W1.1~W1.32, . . . , and W8.1~W8.32 arrayed in respective ones of first eight rows (i.e., the first to eighth rows R1~R8) of the weight matrix may be stored into the first rows ROW0 of the first to eighth memory banks BK(00)~BK(07), respectively. For example, the weight data W1.1~W1.32 arrayed in the first row R1 of the weight matrix may be stored into the first row ROW0 of the first memory bank BK(00), and the weight data W2.1~W2.32 arrayed in the second row R2 of the weight matrix may be stored into the first row ROW0 of the second memory bank BK(01). In addition, the weight data W3.1~W3.32 arrayed in the third row R3 of the weight matrix may be stored into the first row ROW0 of the third memory bank BK(02). In the same way, the weight data W8.1~W8.32 arrayed in the eighth row R8 of the weight matrix may be stored into the first row ROW0 of the eighth memory bank BK(07). Thus, the weight data W1.1~W1.32, . . . , and W8.1~W8.32 of the weight sub-matrixes (WSM11 and WSM12 of FIG. 41) may be stored into the first rows ROW0 of the first to eighth memory banks BK(00)~BK(07).

Eight groups of the weight data W9.1~W9.32, . . . , and W16.1~W16.32 arrayed in respective ones of the second eight rows (i.e., the ninth to sixteenth rows R9~R16) of the weight matrix may be stored into the second rows ROW1 of the first to eighth memory banks BK(00)~BK(07), respectively. For example, the weight data W9.1~W9.32 arrayed in the ninth row R9 of the weight matrix may be stored into the second row ROW1 of the first memory bank BK(00), and the weight data W10.1~W10.32 arrayed in the tenth row R10 of the weight matrix may be stored into the second row ROW1 of the second memory bank BK(01). In addition, the weight data W11.1~W11.32 arrayed in the eleventh row R11 of the weight matrix may be stored into the second row ROW1 of the third memory bank BK(02). In the same way, the weight data W16.1~W16.32 arrayed in the sixteenth row R16 of the weight matrix may be stored into the second row ROW1 of the eighth memory bank BK(07). Thus, the weight data W9.1~W9.32, . . . , and W16.1~W16.32 of the weight sub-matrixes (WSM21 and WSM22 of FIG. 41) may be stored into the second rows ROW1 of the first to eighth memory banks BK(00)~BK(07).

Eight groups of the weight data W17.1~W17.32, . . . , and W24.1~W24.32 arrayed in respective ones of third eight rows (i.e., the seventeenth to $24^{th}$ rows R17~R24) of the weight matrix may be stored into the third rows ROW2 of the first to eighth memory banks BK(00)~BK(07), respectively. For example, the weight data W17.1~W17.32 arrayed in the seventeenth row R17 of the weight matrix may be stored into the third row ROW2 of the first memory bank BK(00), and the weight data W18.1~W18.32 arrayed in the eighteenth row R18 of the weight matrix may be stored into the third row ROW2 of the second memory bank BK(01). In addition, the weight data W19.1~W19.32 arrayed in the nineteenth row R19 of the weight matrix may be stored into the third row ROW2 of the third memory bank BK(02). In the same way, the weight data W24.1~W24.32 arrayed in the $24^{th}$ row R24 of the weight matrix may be stored into the third row ROW2 of the eighth memory bank BK(07). Thus, the weight data W17.1~W17.32, . . . , and W24.1~W24.32 of the weight sub-matrixes (WSM31 and WSM32 of FIG. 41) may be stored into the third rows ROW2 of the first to eighth memory banks BK(00)~BK(07).

Eight groups of the weight data W25.1~W25.32, . . . , and W32.1~W32.32 arrayed in respective ones of fourth eight rows (i.e., the $25^{th}$ to $32^{nd}$ rows R25~R32) of the weight matrix may be stored into the fourth rows ROW3 of the first to eighth memory banks BK(00)~BK(07), respectively. For example, the weight data W25.1~W25.32 arrayed in the $25^{th}$ row R25 of the weight matrix may be stored into the fourth row ROW3 of the first memory bank BK(00), and the weight data W26.1~W26.32 arrayed in the $26^{th}$ row R26 of the weight matrix may be stored into the fourth row ROW3 of the second memory bank BK(01). In addition, the weight data W27.1~W27.32 arrayed in the $27^{th}$ row R27 of the weight matrix may be stored into the fourth row ROW3 of the third memory bank BK(02). In the same way, the weight data W32.1~W32.32 arrayed in the $32^{nd}$ row R32 of the weight matrix may be stored into the fourth row ROW3 of the eighth memory bank BK(07). Thus, the weight data W25.1~W25.32, . . . , and W32.1~W32.32 of the weight sub-matrixes (WSM41 and WSM42 of FIG. 41) may be stored into the fourth rows ROW3 of the first to eighth memory banks BK(00)~BK(07).

While the first to fourth MAC arithmetic operations are performed in the first PIM device 610, the vector data V1~V16 of the vector sub-matrix VSM11 and the vector data V17~V32 of the vector sub-matrix VSM21 may be alternately supplied to the first to eighth MAC operators MAC(00)~MAC(07) of the first PIM device 610. Specifically, the vector data V1~V16 of the vector sub-matrix VSM11 may be first supplied to each of the first to eighth MAC operators MAC(00)~MAC(07) to perform the first sub-MAC arithmetic operation of the first MAC arithmetic operation, and the vector data V17~V32 of the vector sub-matrix VSM21 may then be supplied to each of the first to eighth MAC operators MAC(00)~MAC(07) to perform the second sub-MAC arithmetic operation of the first MAC arithmetic operation. Next, the vector data V1~V16 of the vector sub-matrix VSM11 may be supplied to each of the first to eighth MAC operators MAC(00)~MAC(07) to perform the first sub-MAC arithmetic operation of the second MAC arithmetic operation, and the vector data V17~V32 of the vector sub-matrix VSM21 may then be supplied to each of the first to eighth MAC operators MAC(00)~MAC(07) to perform the second sub-MAC arithmetic operation of the second MAC arithmetic operation. Subsequently, the vector data V1~V16 of the vector sub-matrix VSM11 may be supplied to each of the first to eighth MAC operators MAC(00)~MAC(07) to perform the first sub-MAC arithmetic operation of the third MAC arithmetic operation, and the vector data V17~V32 of the vector sub-matrix VSM21 may then be supplied to each of the first to eighth MAC operators MAC(00)~MAC(07) to perform the second sub-MAC arithmetic operation of the third MAC arithmetic operation. Finally, the vector data V1~V16 of the vector sub-matrix VSM11 may be supplied to each of the first to eighth MAC operators MAC(00)~MAC(07) to perform the first sub-MAC arithmetic operation of the fourth MAC arithmetic operation, and the vector data V17~V32 of the vector sub-matrix VSM21 may then be supplied to each of the first to eighth MAC operators MAC(00)~MAC(07) to perform the second sub-MAC arithmetic operation of the fourth MAC arithmetic operation.

Figure 43:
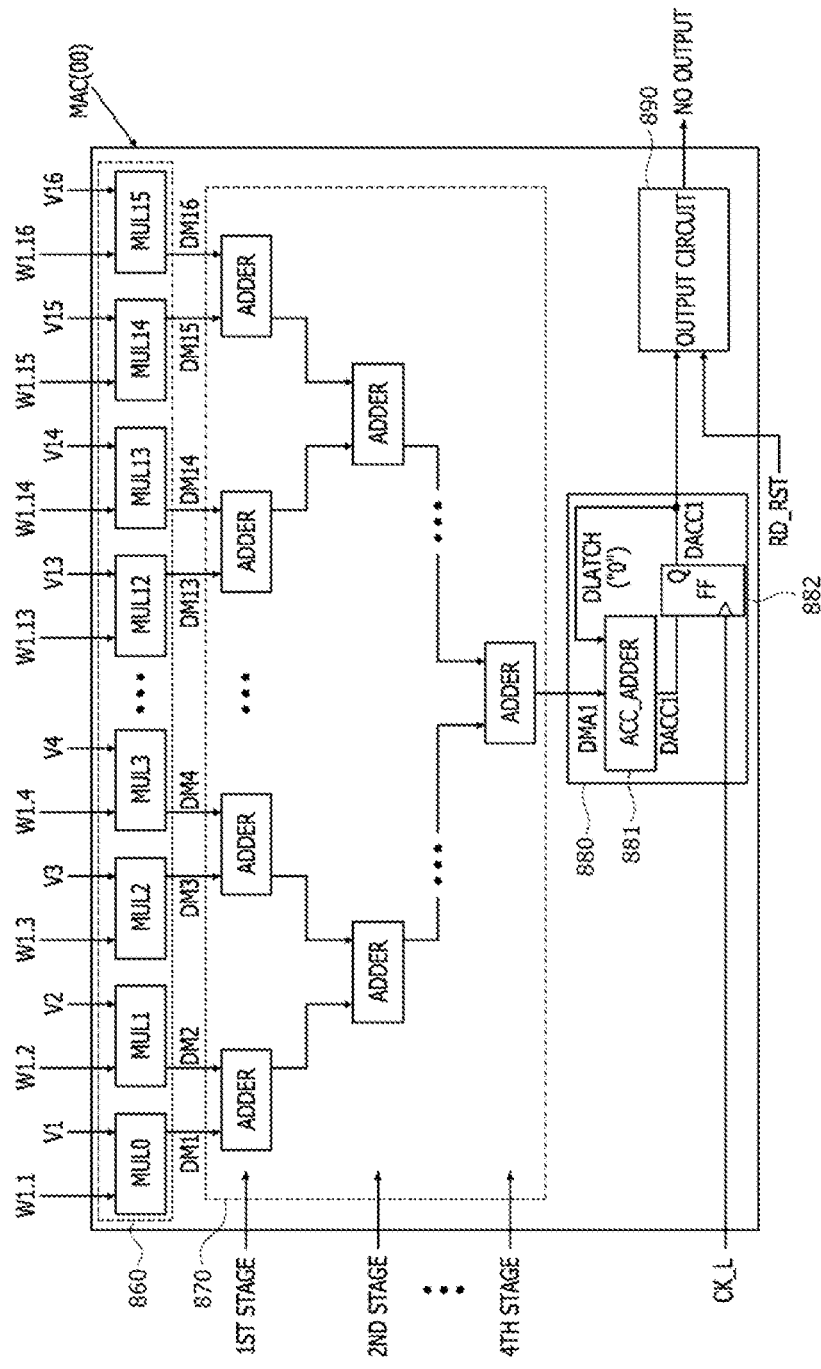
FIG. 43 illustrates a first sub-MAC arithmetic operation of a first MAC arithmetic operation performed by the first MAC operator illustrated in FIG. 33.

FIG. 43 illustrates the first sub-MAC arithmetic operation of the first MAC arithmetic operation performed by the first MAC operator MAC(00) illustrated in FIG. 33. In FIG. 43, the same reference numerals or symbols as used in FIG. 33 denote the same elements. Referring to FIG. 43, the multiplication circuit 860 of the first MAC operator MAC(00) may receive the weight data W1.1~W1.16 of the weight sub-matrix WSM11 from the first memory bank (BK(00) of FIG. 42). In addition, the multiplication circuit 860 may receive the vector data V1~V16 of the vector sub-matrix VSM11 from the first global buffer (GB(0) of FIG. 42). The first to sixteenth multipliers MUL0~MUL15 may perform multiplying calculations using the weight data W1.1~W1.16 and the vector data V1~V16 as input data to generate and output the first to sixteenth multiplication result data DM1~DM16, respectively. The first multiplication result data DM1 outputted from the first multiplier MUL0 may have a value of data generated by multiplying the weight data W1.1 by the vector data V1. Similarly, the sixteenth multiplication result data DM16 outputted from the sixteenth multiplier MUL15 may have a value of data generated by multiplying the weight data W1.16 by the vector data V16.

The adder tree 870 may receive the first to sixteenth multiplication result data DM1~DM16 from the respective ones of the first to sixteenth multiplier MUL0~MUL15 and may perform an adding calculation of the first to sixteenth multiplication result data DM1~DM16 to generate first addition result data DMA1. The adder tree 870 may output the first addition result data DMA1 to the accumulator 880. The accumulative adder 881 of the accumulator 880 may perform an adding calculation for adding the first addition result data DMA1 to the latched data DLATCH outputted from the latch circuit 882 to generate and output first accumulated data DACC1. Because no previous MAC arithmetic operation is performed, the latched data DLATCH outputted from the latch circuit 882 may have a value of zero. Thus, the first accumulated data DACC1 outputted from the accumulative adder 881 may be the same data as the first addition result data DMA1. The first accumulated data DACC1 outputted from the accumulative adder 881 may be inputted to the latch circuit 882 and may be latched in the latch circuit 882. The first accumulated data DACC1 latched in the latch circuit 882 may be used as the latched data DLATCH during the second sub-MAC arithmetic operation of the first MAC arithmetic operation which is performed at a subsequent step (refer to FIG. 44). In addition, the first accumulated data DACC1 latched in the latch circuit 882 may be transmitted to the output circuit 890. Because the first MAC result data MAC_RST1 have not been generated yet (i.e., the result read signal RD_RST has not been generated yet), no output data are generated by the output circuit.

Figure 44:
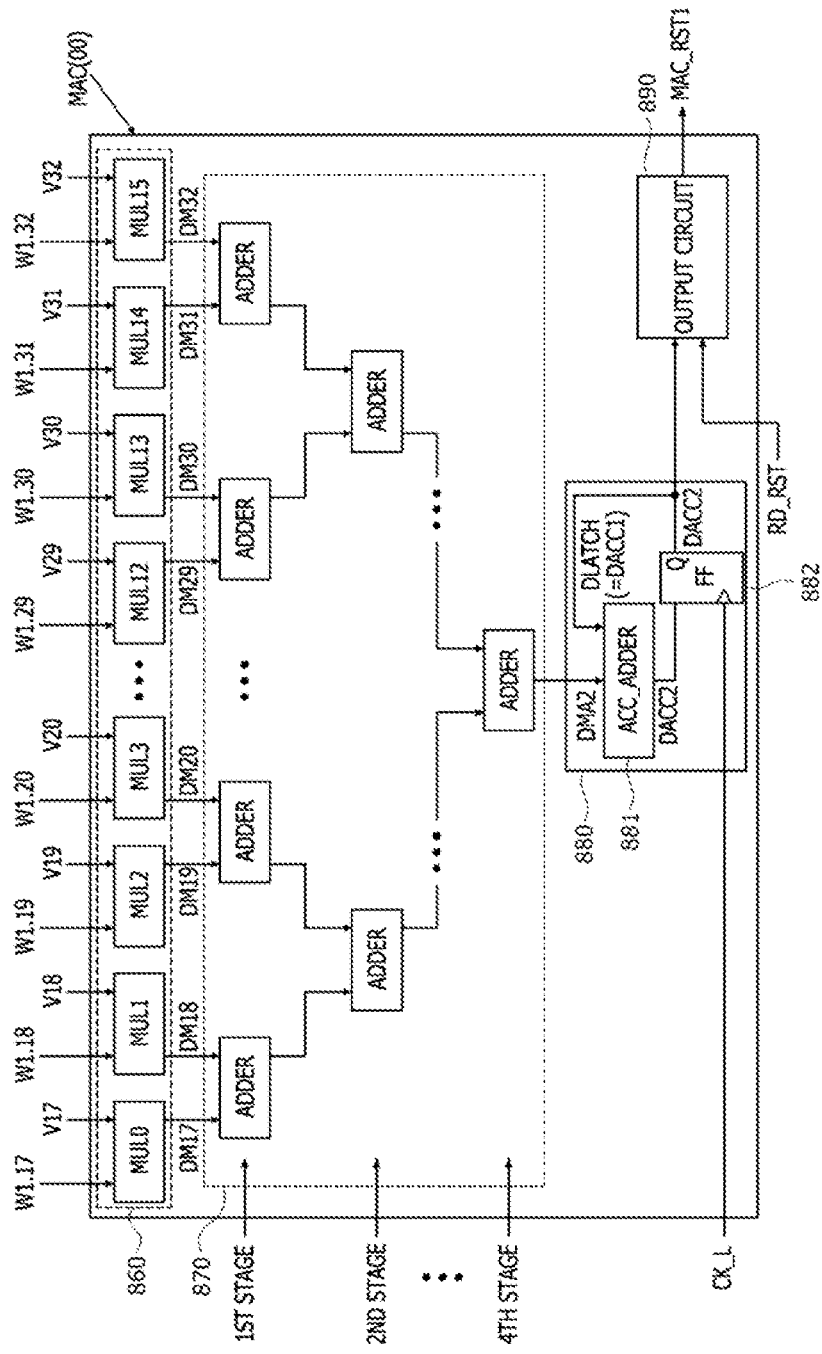
FIG. 44 illustrates a second sub-MAC arithmetic operation of a first MAC arithmetic operation performed by the first MAC operator illustrated in FIG. 33.

FIG. 44 illustrates the second sub-MAC arithmetic operation of the first MAC arithmetic operation performed by the first MAC operator MAC(00) illustrated in FIG. 33. In FIG. 44, the same reference numerals or symbols as used in FIG. 33 denote the same elements. Referring to FIG. 44, the multiplication circuit 860 of the first MAC operator MAC (00) may receive the weight data W1.17~W1.32 of the weight sub-matrix WSM12 from the first memory bank (BK(00) of FIG. 42). In addition, the multiplication circuit 860 may receive the vector data V17~V32 of the vector sub-matrix VSM21 from the first global buffer (GB(0) of FIG. 42). The first to sixteenth multipliers MUL0~MUL15 may perform multiplying calculations using the weight data W1.17~W1.32 and the vector data V17~V32 as input data to generate and output seventeenth to $32^{nd}$ multiplication result data DM17~DM32, respectively. The seventeenth multiplication result data DM17 outputted from the first multiplier MUL0 may have a value of data generated by multiplying the weight data W1.17 by the vector data V17. Similarly, the $32^{nd}$ multiplication result data DM32 outputted from the sixteenth multiplier MUL15 may have a value of data generated by multiplying the weight data W1.32 by the vector data V32.

The adder tree 870 may receive the seventeenth to $32^{nd}$ multiplication result data DM17~DM32 from the respective ones of the first to sixteenth multiplier MUL0~MUL15 and may perform an adding calculation of the seventeenth to $32^{nd}$ multiplication result data DM17~DM32 to generate second addition result data DMA2. The adder tree 870 may output the second addition result data DMA2 to the accumulator 880. The accumulative adder 881 of the accumulator 880 may perform an adding calculation for adding the second addition result data DMA2 to the latched data DLATCH outputted from the latch circuit 882 to generate and output second accumulated data DACC2. Because the latched data DLATCH correspond to the first accumulated data DACC1 generated during the first sub-MAC arithmetic operation of the first MAC arithmetic operation and the first accumulated data DACC1 correspond to the first addition result data DMA1 generated during the first sub-MAC arithmetic operation of the first MAC arithmetic operation, the second accumulated data DACC2 may correspond to a sum of the first addition result data DMA1 and the second addition result data DMA2. Thus, because the second accumulated data DACC2 correspond to data generated by a matrix multiplying calculation of the weight data W1.1~W1.32 arrayed in the first row R1 of the weight matrix and the vector data V1~V32 arrayed in the vector matrix, the second accumulated data DACC2 may correspond to the first MAC result data MAC_RST1. The second accumulated data DACC2 outputted from the accumulative adder 881 may be inputted to the latch circuit 882 and may be latched in the latch circuit 882. The second accumulated data DACC2 latched in the latch circuit 882 may be transmitted to the output circuit 890, and the latch circuit 882 may then be reset. The output circuit 890 may output the second accumulated data DACC2, which are provided by the latch circuit 882, as the first MAC result data MAC_RST1.

Figure 45:
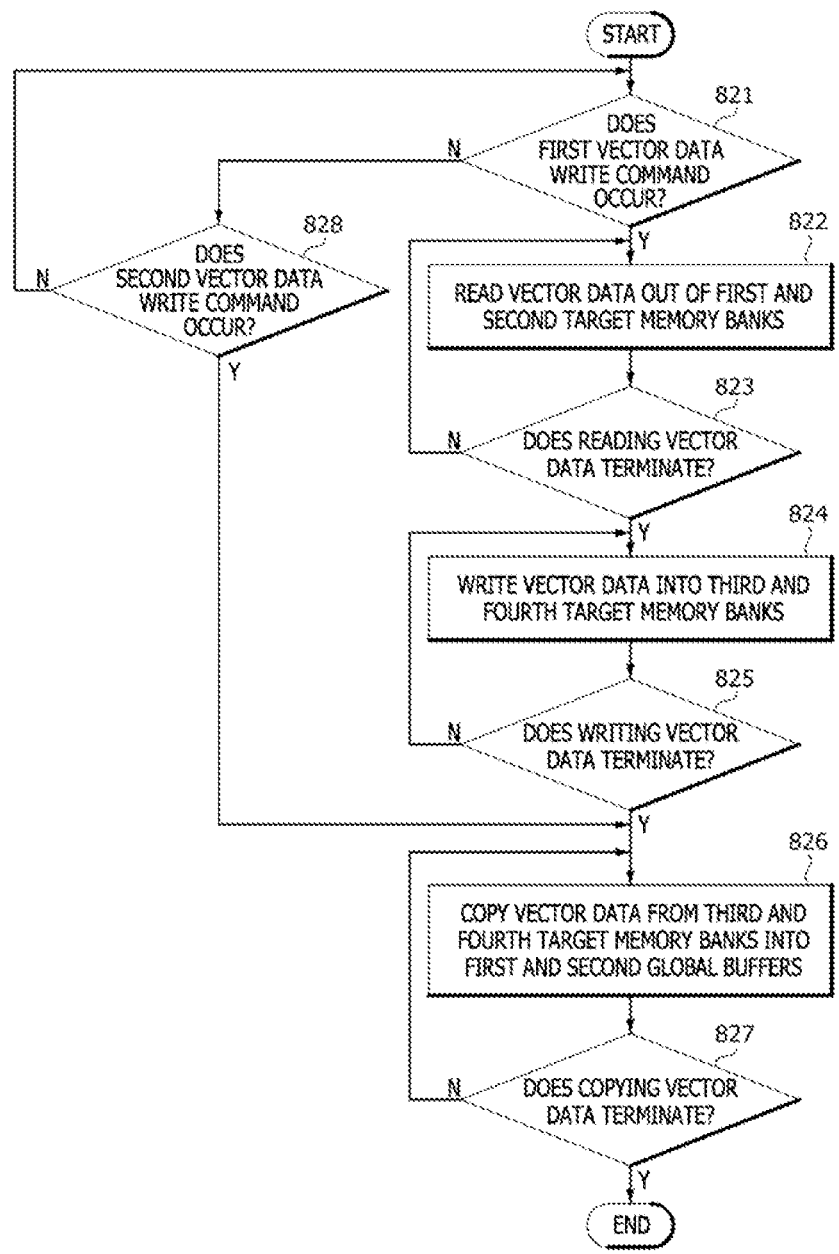
FIG. 45 is a flowchart illustrating another example of a process for supplying vector data to first and second global buffers of first and second PIM devices included in the PIM system illustrated in FIG. 31.

FIG. 45 is a flowchart illustrating an example of a process for supplying the vector data V1~V32 to the first and second global buffers GB(0) and GB(1) of first and second PIM devices 610 and 620 included in the PIM system 1-5 illustrated in FIG. 31. Referring to FIG. 45, at a step 821, the host (700 of FIG. 31) may determine whether a first vector data write command occurs. The first vector data write command may be defined as a command requesting an operation for supplying the vector data used for the first sub-MAC arithmetic operation to the MAC operators. In order to execute the first vector data write command, the vector data dispersedly stored in first and second target memory banks of the first and second PIM devices 610 and 620 may be collected to primarily perform an operation for storing the vector data into third and fourth target memory banks of the first and second PIM devices 610 and 620. When no first vector data write command occurs at the step 821, the host (700 of FIG. 31) may determine whether a second vector data write command occurs at a step 828. The second vector data write command may be defined as a command requesting an operation for supplying the vector data used for the second sub-MAC arithmetic operation to the MAC operators. When no second vector data write command occurs at the step 828, the host (700 of FIG. 31) may maintain a standby status. The standby status may mean a status for continuously or periodically verifying occurrence of the first or second vector data write command. When the second vector data write command occurs at the step 828, a step 826 may be executed.

When the first vector data write command occurs at the step 821, the host 700 may read out the vector data stored in the first target memory bank of the first PIM device 610 and the second target memory bank of the second PIM device 620 at a step 822. At a step 823, whether the vector data in the first and second target memory banks are completely read out may be determined. When the vector data in the first and second target memory banks are not completely read out at the step 823, the step 822 may be executed again. In contrast, when the vector data in the first and second target memory banks are completely read out at the step 823, the vector data may be written into a third target memory bank of the first PIM device 610 and a fourth target memory bank of the second PIM device 620 at a step 824. At a step 825, whether the vector data are completely written into the third and fourth target memory banks may be determined. When the vector data are not completely written into the third and fourth target memory banks at the step 825, the step 824 may be executed again. In contrast, when the vector data are completely written into the third and fourth target memory banks at the step 825 or the second vector data write command occurs at the step 828, the vector data stored in the first target memory bank of the first PIM device 610 and the second target memory bank of the second PIM device 620 may be copied into the first global buffer GB(0) of the first PIM device 610 and the second global buffer GB(1) of the first PIM device 610 at the step 826. At a step 827, whether the vector data are completely copied into the first and second global buffers GB(0) and GB(1) may be determined. When the vector data are not completely copied into the first and second global buffers GB(0) and GB(1) at the step 827, the step 826 may be executed again. When the vector data are completely copied into the first and second global buffers GB(0) and GB(1) at the step 827, the process for storing the vector data into the first and second global buffers may terminate.

Figure 46:
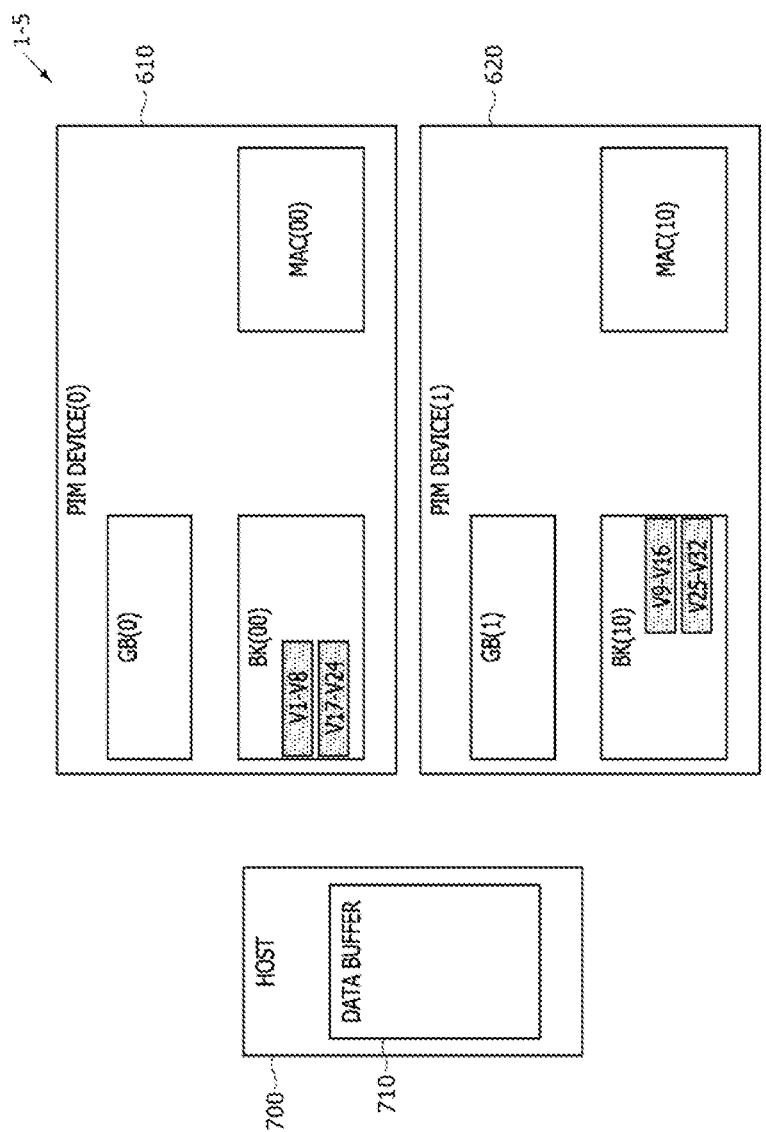
FIGS. 46 to 52 illustrate operations performed at various steps of the flowchart illustrated in FIG. 45.
Figure 47:
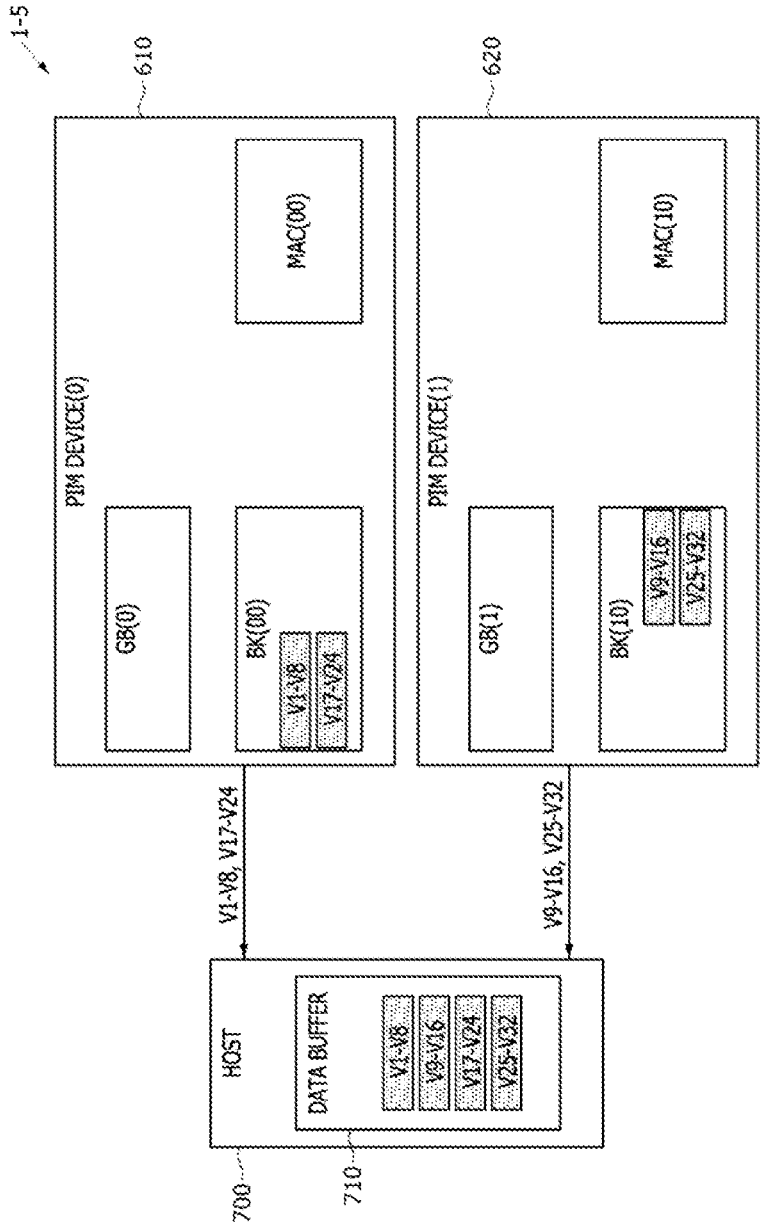

FIGS. 46 to 52 illustrate operations of the PIM device 1-5 performed at various steps of the flowchart illustrated in FIG. 45. As illustrated in FIG. 46, it may be assumed that a first group of vector data (i.e., the first to eighth vector data V1~V8) and a third group of vector data (i.e., the seventeenth to $24^{th}$ vector data V17~V24) are stored in the first memory bank BK(00) of the first PIM device 610 and a second group of vector data (i.e., the ninth to sixteenth vector data V9~V16) and a fourth group of vector data (i.e., the $25^{th}$ to $32^{nd}$ vector data V25~V32) are stored in the first memory bank BK(10) of the second PIM device 620. When the first vector data write command occurs at the step 821 of FIG. 45, the host 700 may read the first to eighth vector data V1~V8 and the seventeenth to $24^{th}$ vector data V17~V24 out of the first memory bank BK(00) of the first PIM device 610 to store the first to eighth vector data V1~V8 and the seventeenth to $24^{th}$ vector data V17~V24 into the data buffer 710 of the host 700 (refer to the step 822 of FIG. 45), as illustrated in FIG. 47. In addition, the host 700 may also read the ninth to sixteenth vector data V9~V16 and the $25^{th}$ to $32^{nd}$ vector data V25~V32 out of the first memory bank BK(10) of the second PIM device 620 to store the ninth to sixteenth vector data V9~V16 and the $25^{th}$ to $32^{nd}$ vector data V25~V32 into the data buffer 710 of the host 700 (refer to the step 822 of FIG. 45), as illustrated in FIG. 47. The first memory bank BK(00) of the first PIM device 610 and the first memory bank BK(10) of the second PIM device 620 may correspond to the first target memory bank and the second target memory bank which are described with reference to FIG. 45, respectively.

Figure 48:
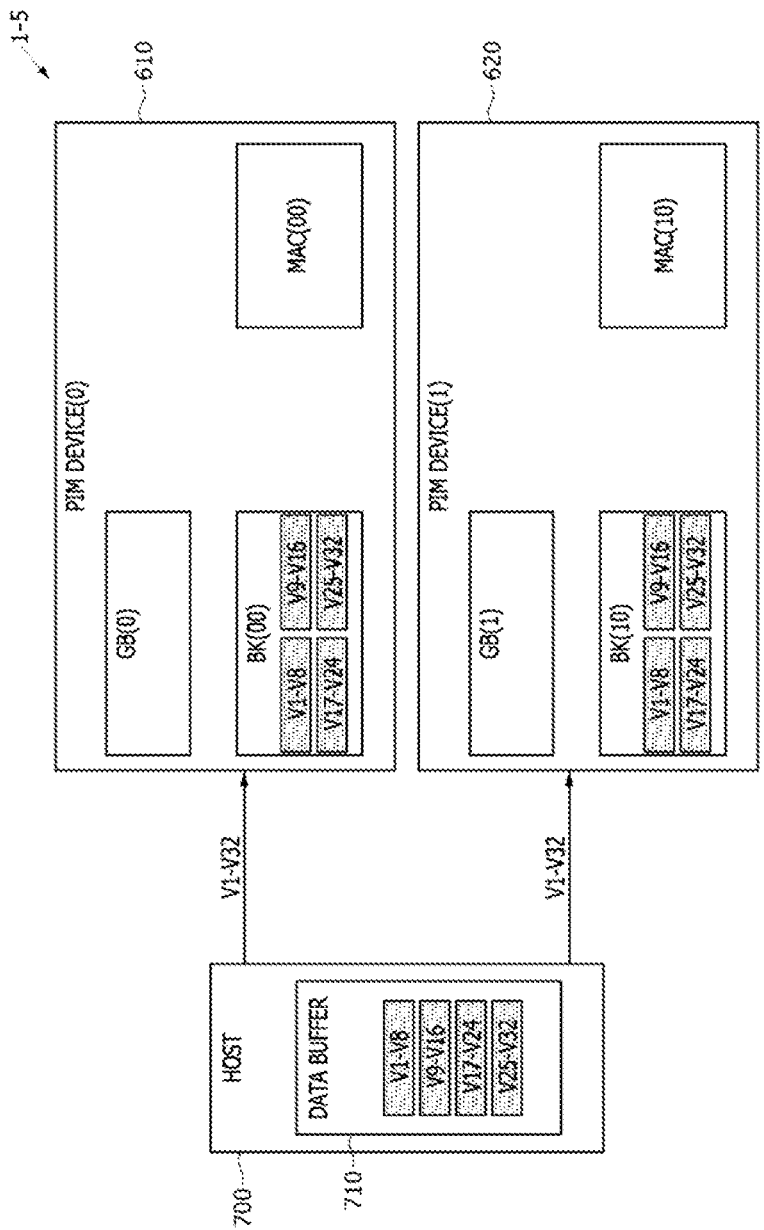

When a process for reading the first to sixteenth vector data V1~V16 used for the first sub-MAC arithmetic operation and a process for reading the seventeenth to $32^{nd}$ vector data V17~V32 used for the second sub-MAC arithmetic operation are determined as being terminated at the step 823 of FIG. 45, the host 700 may write the first to $32^{nd}$ vector data V1~V32 stored in the data buffer 710 into each of the first memory bank BK(00) of the first PIM device 610 and the first memory bank BK(10) of the second PIM device 620 (refer to the step 824 of FIG. 45), as illustrated in FIG. 48. In such a case, the first memory bank BK(00) of the first PIM device 610 and the first memory bank BK(10) of the second PIM device 620 may correspond to the third target memory bank and the fourth target memory bank which are described with reference to FIG. 45, respectively. That is, in the present embodiment, it may be assumed that the first target memory bank and the third target memory bank are the same memory bank and the second target memory bank and the fourth target memory bank are the same memory bank. However, the present embodiment may be merely an example of the present disclosure. Accordingly, in some other embodiments, the first and third target memory banks may be different memory banks, and the second and fourth target memory banks may also be different memory banks.

Figure 49:
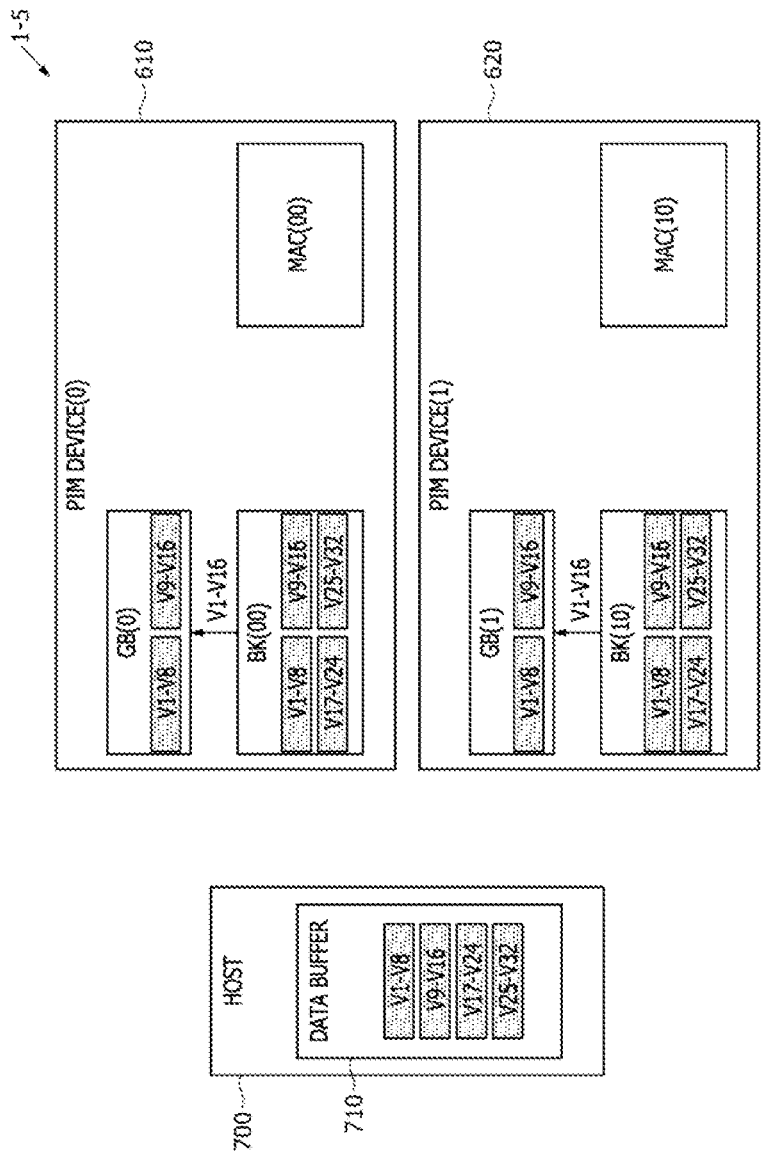
Figure 50:
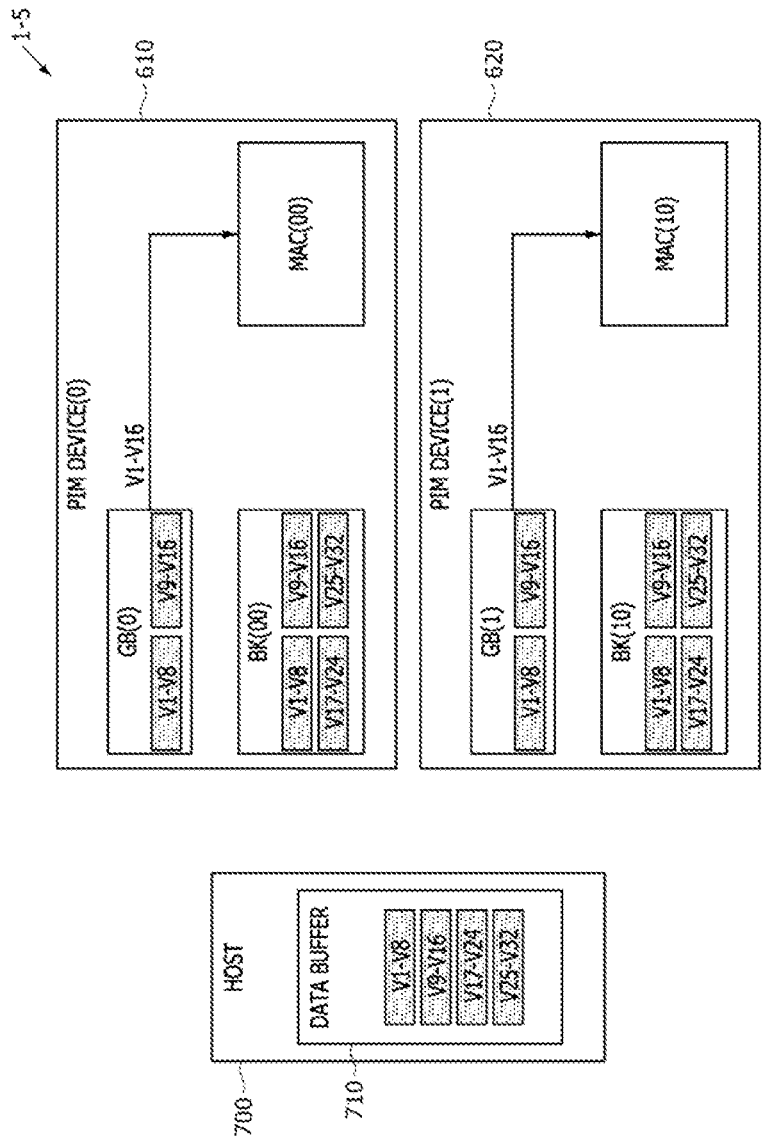

When a process for writing the first to $32^{nd}$ vector data V1~V32 is determined as being terminated at the step 825 of FIG. 45, the first to sixteenth vector data V1~V16 used for the first sub-MAC arithmetic operation among the first to $32^{nd}$ vector data V1~V32 stored in the first memory bank BK(00) of the first PIM device 610 may be copied into the first global buffer GB(0) of the first PIM device 610 (refer to the step 826 of FIG. 45), as illustrated in FIG. 49. Similarly, the first to sixteenth vector data V1~V16 used for the first sub-MAC arithmetic operation among the first to $32^{nd}$ vector data V1~V32 stored in the first memory bank BK(10) of the second PIM device 620 may also be copied into the second global buffer GB(1) of the second PIM device 620 (refer to the step 826 of FIG. 45), as illustrated in FIG. 49. When a process for copying the first to sixteenth vector data V1~V16 terminates at the step 827 of FIG. 45, the first to sixteenth vector data V1~V16 copied into the first global buffer GB(0) of the first PIM device 610 may be supplied to the first MAC operator MAC(00) in the first PIM device 610, as illustrated in FIG. 50. Similarly, the first to sixteenth vector data V1~V16 copied into the second global buffer GB(1) of the second PIM device 620 may also be supplied to the first MAC operator MAC(10) in the second PIM device 620, as illustrated in FIG. 50. Each of the first MAC operator MAC(00) in the first PIM device 610 and the first MAC operator MAC(10) in the second PIM device 620 may perform the first sub-MAC arithmetic operation using the first to sixteenth vector data V1~V16 as input data.

Figure 51:
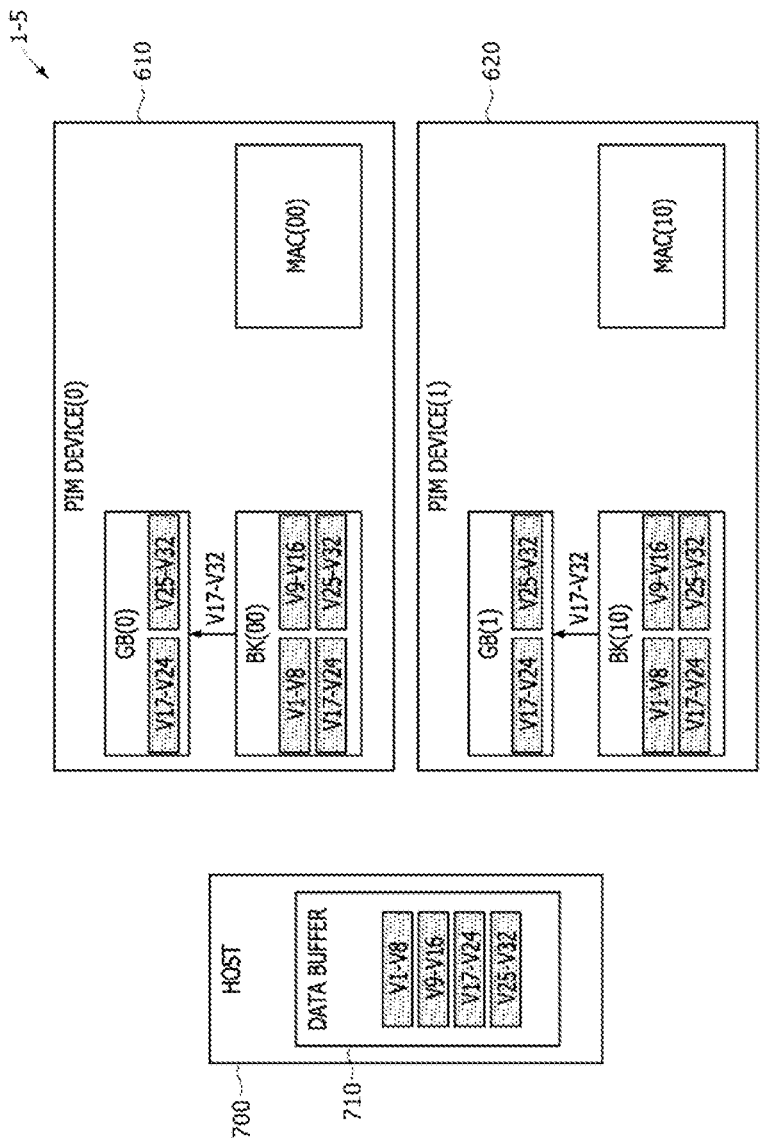
Figure 52:
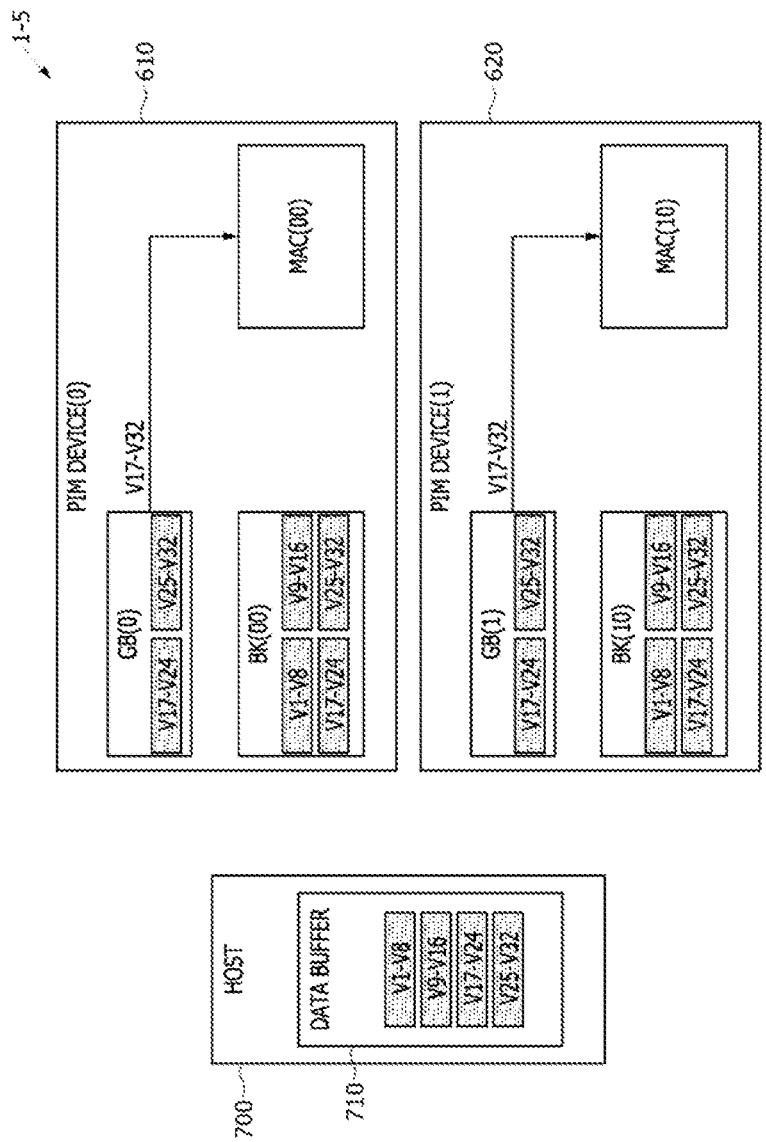

When the second vector data write command occurs at the step 828 of FIG. 45, the seventeenth to $32^{nd}$ vector data V17~V32 used for the second sub-MAC arithmetic operation among the first to $32^{nd}$ vector data V1~V32 stored in the first memory bank BK(00) of the first PIM device 610 may be copied into the first global buffer GB(0) of the first PIM device 610 (refer to the step 826 of FIG. 45), as illustrated in FIG. 51. Similarly, the seventeenth to $32^{nd}$ vector data V17~V32 used for the second sub-MAC arithmetic operation among the first to $32^{nd}$ vector data V1~V32 stored in the first memory bank BK(10) of the second PIM device 620 may also be copied into the second global buffer GB(1) of the second PIM device 620 (refer to the step 826 of FIG. 45), as illustrated in FIG. 51. When a process for copying the seventeenth to $32^{nd}$ vector data V17~V32 terminates at the step 827 of FIG. 45, the seventeenth to $32^{nd}$ vector data V17~V32 copied into the first global buffer GB(0) of the first PIM device 610 may be supplied to the first MAC operator MAC(00) in the first PIM device 610, as illustrated in FIG. 52. Similarly, the seventeenth to $32^{nd}$ vector data V17~V32 copied into the second global buffer GB(1) of the second PIM device 620 may also be supplied to the first MAC operator MAC(10) in the second PIM device 620, as illustrated in FIG. 52. Each of the first MAC operator MAC(00) in the first PIM device 610 and the first MAC operator MAC(10) in the second PIM device 620 may perform the second sub-MAC arithmetic operation using the seventeenth to $32^{nd}$ vector data V17~V32 as input data.

Figure 53:
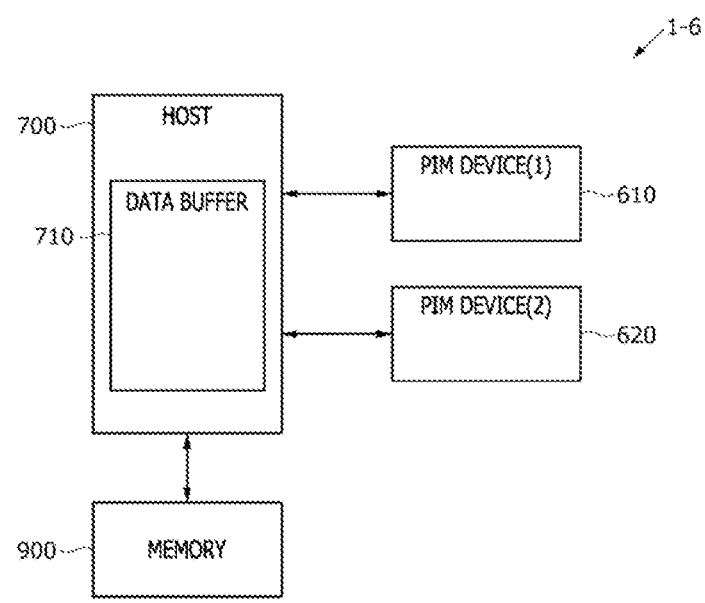
FIG. 53 is a block diagram illustrating a PIM system according to yet further another embodiment of the present disclosure.

FIG. 53 is a block diagram illustrating a PIM system 1-6 according to yet further another embodiment of the present disclosure. The PIM system 1-6 may be different from the PIM system 1-5 illustrated in FIG. 31 in terms of a point that the vector data used for the MAC arithmetic operations of the first and second PIM devices 610 and 620 are stored in a memory device 900 which is disposed to be separated from the first and second PIM devices 610 and 620. In FIG. 53, the same reference numerals or symbols as used in FIG. 31 denote the same elements. Referring to FIG. 53, the PIM system 1-6 may include the first PIM device 610, the second PIM device 620, the host 700 having the data buffer 710, and the memory device 900. Because the first PIM device 610, the second PIM device 620, and the host 700 have been already described with reference to FIG. 31, the first PIM device 610, the second PIM device 620, and the host 700 will not be described hereinafter. The memory device 900 may be controlled by the host 700 to perform a memory read operation and a memory write operation. That is, the memory device 900 may perform the memory write operation that receives write data from the host 700 to store the write data in the memory device 900. In addition, the memory device 900 may perform the memory read operation for transmitting read data stored in the memory device 900 to the host 700. When the vector data are stored in the memory device 900, the host 700 may read the vector data out of the memory device 900 to store the vector data into the data buffer 710 and to transmit the vector data to the first and second PIM devices 610 and 620.

Figure 54:
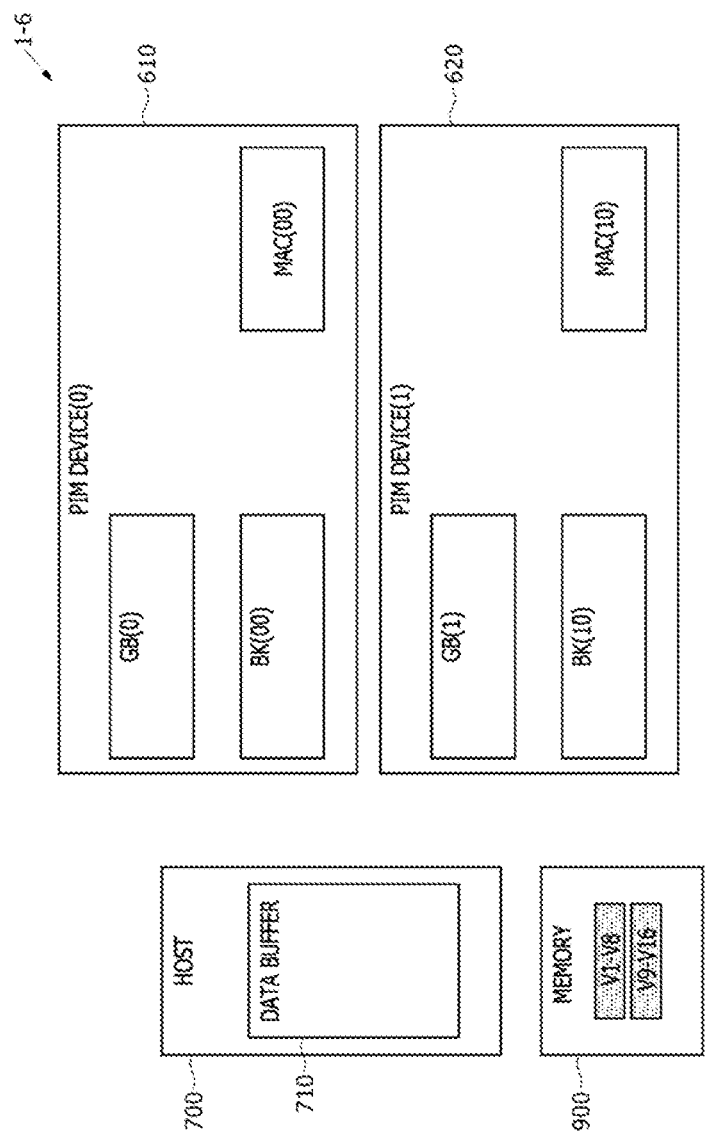
FIGS. 54 to 56 illustrate an example of a process for supplying vector data to first and second global buffers of first and second PIM devices included in the PIM system illustrated in FIG. 53.
Figure 55:
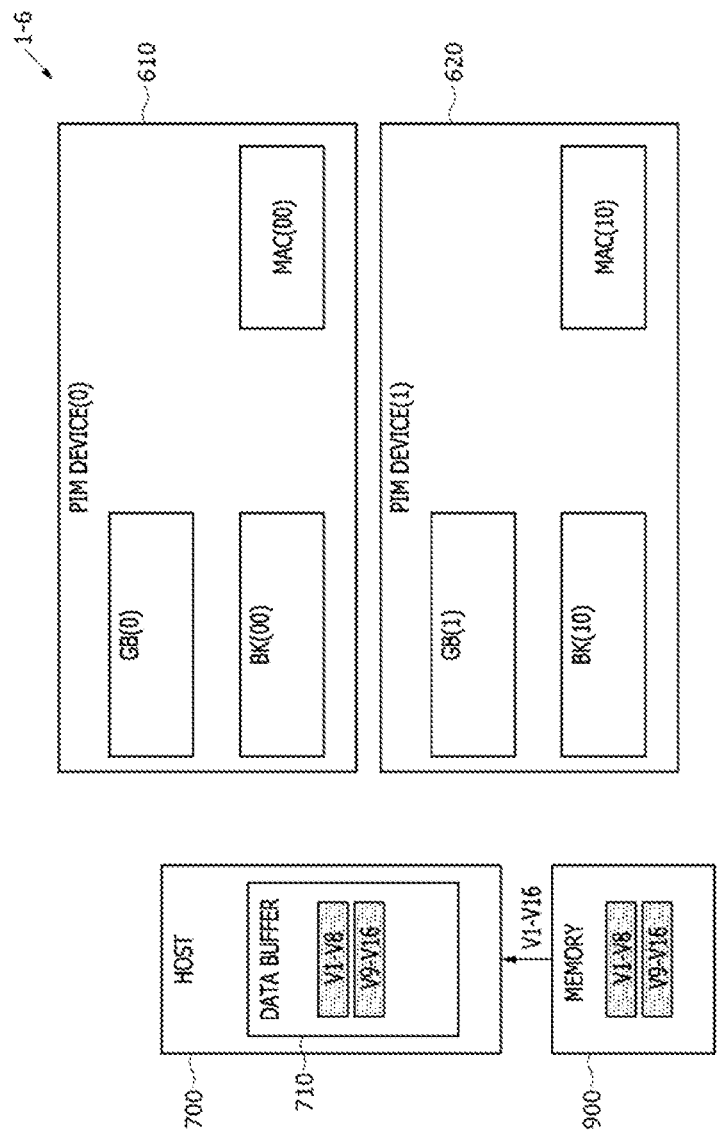
Figure 56:
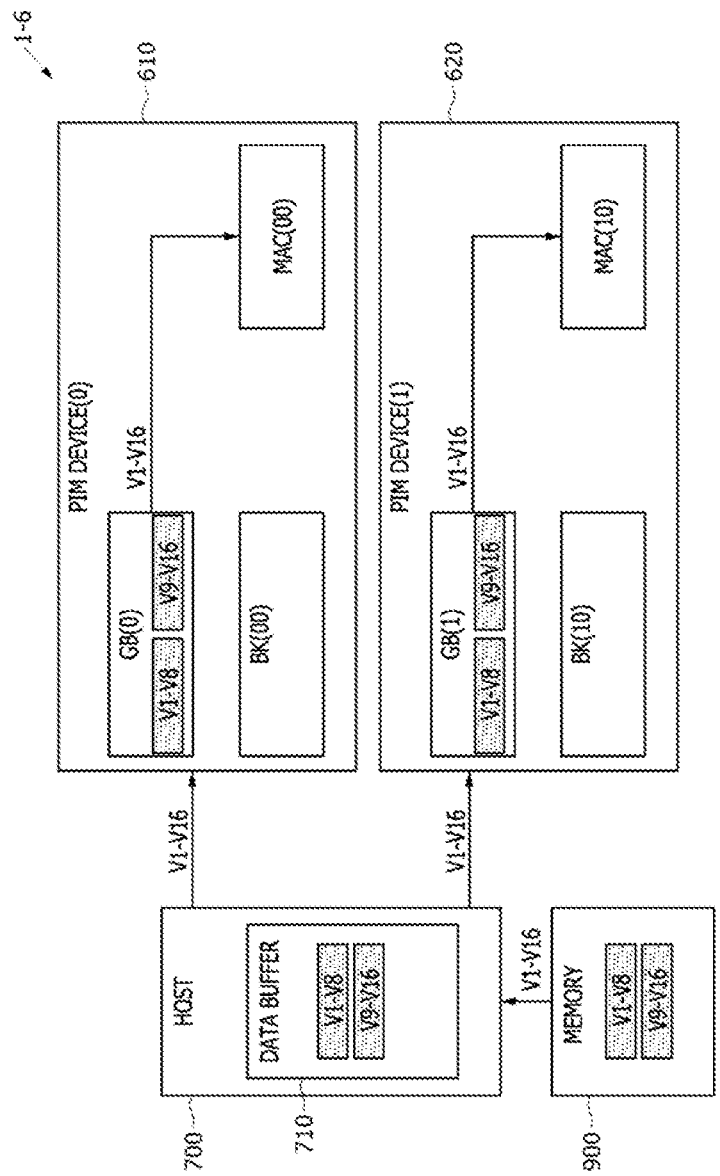

FIGS. 54 to 56 illustrate an example of a process for supplying the vector data to the first and second global buffers GB(0) and GB(1) of the first and second PIM devices 610 and 620 included in the PIM system 1-6 illustrated in FIG. 53. As illustrated in FIG. 54, it may be assumed that vector data (i.e., the first to sixteenth vector data V1~V16) necessary for a MAC arithmetic operation are stored in the memory device 900. As illustrated in FIG. 55, the host 700 may read the first to sixteenth vector data V1~V16 out of the memory device 900 to store the first to sixteenth vector data V1~V16 into the data buffer 710 of the host 700, in response to a vector data write command. Next, as illustrated in FIG. 56, the host 700 may write the first to sixteenth vector data V1~V16 stored in the data buffer 710 into each of the first global buffer GB(0) of the first PIM device 610 and the second global buffer GB(1) of the second PIM device 620. The first to sixteenth vector data V1~V16 written into the first global buffer GB(0) of the first PIM device 610 may be supplied to the first MAC operator MAC(00) included in the first PIM device 610, and the first to sixteenth vector data V1~V16 written into the second global buffer GB(1) of the second PIM device 620 may be supplied to the first MAC operator MAC(10) included in the second PIM device 620.

Figure 57:
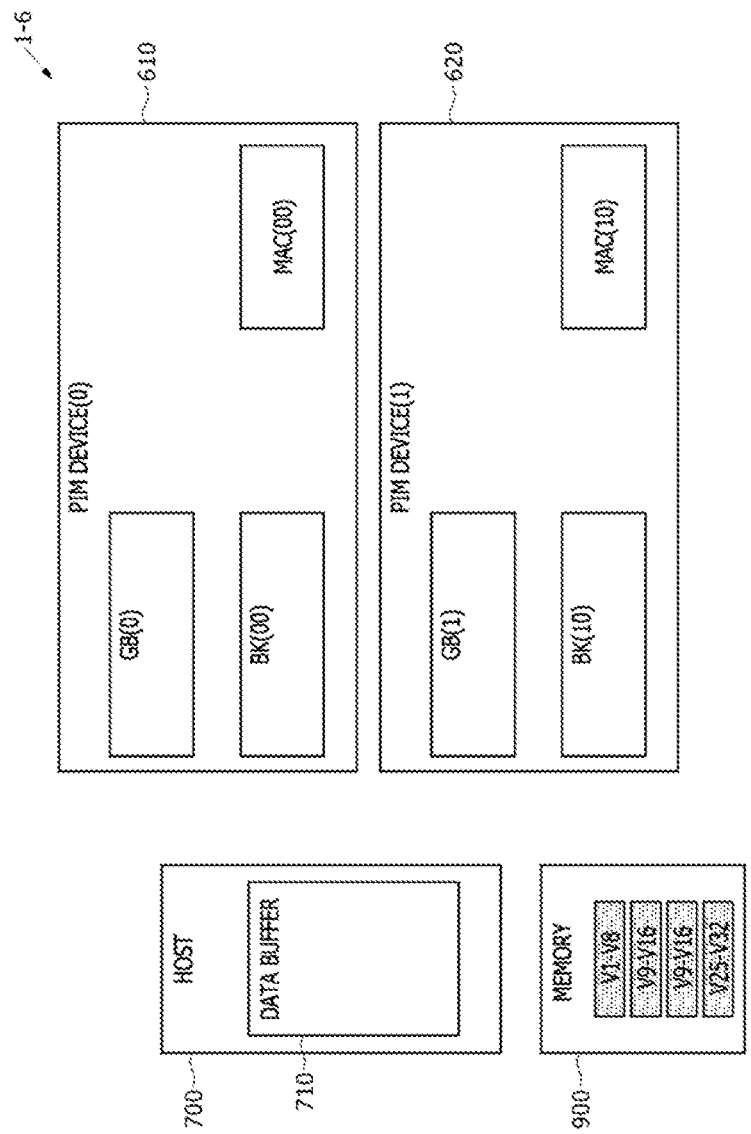
FIGS. 57 to 63 illustrate another example of a process for supplying vector data to first and second global buffers of first and second PIM devices included in the PIM system illustrated in FIG. 53.
Figure 58:
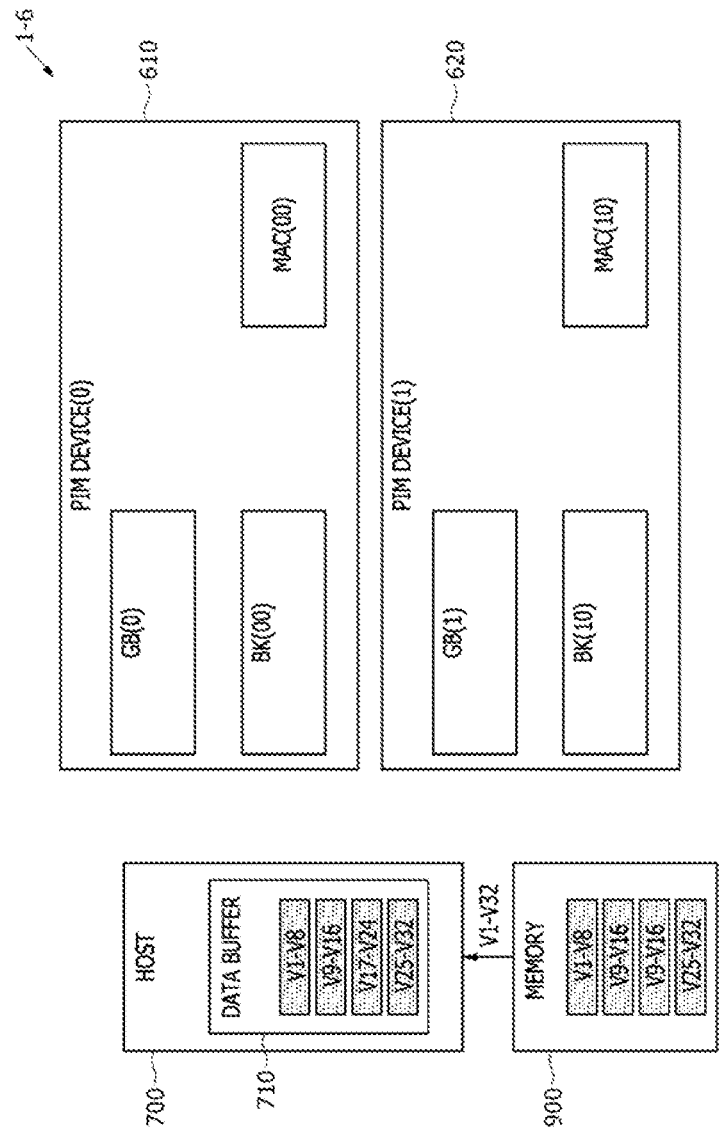
Figure 59:
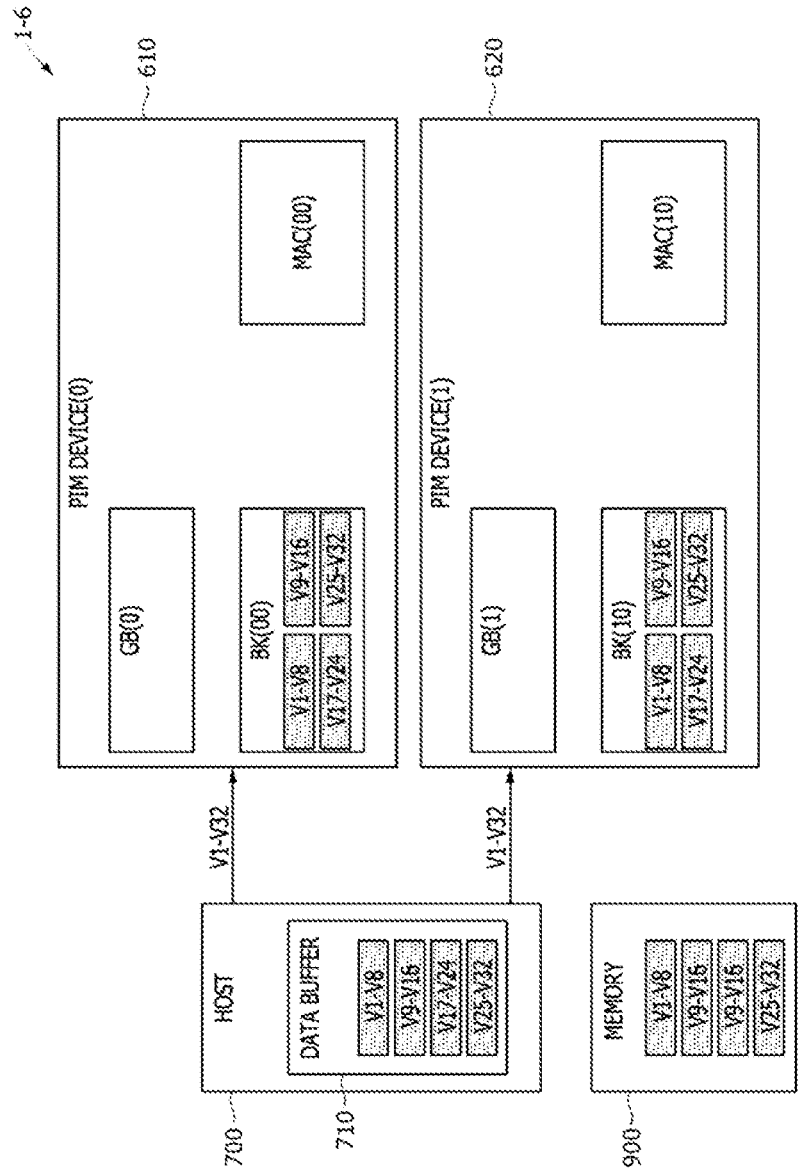

FIGS. 57 to 63 illustrate another example of a process for supplying the vector data to the first and second global buffers GB(0) and GB(1) of the first and second PIM devices 610 and 620 included in the PIM system 1-6 illustrated in FIG. 53. First, as illustrated in FIG. 57, it may be assumed that the first to $32^{nd}$ vector data V1~V32 used for the MAC arithmetic operations of the first and second PIM devices 610 and 620 are stored in the memory device 900. As illustrated in FIG. 58, the host 700 may read the first to $32^{nd}$ vector data V1~V32 out of the memory device 900 to store the first to $32^{nd}$ vector data V1~V32 into the data buffer 710 of the host 700 when the first vector data write command occurs. Next, as illustrated in FIG. 59, the host 700 may write the first to $32^{nd}$ vector data V1~V32 stored in the data buffer 710 into each of the first memory bank BK(00) of the first PIM device 610 and the first memory bank BK(10) of the second PIM device 620.

Figure 60:
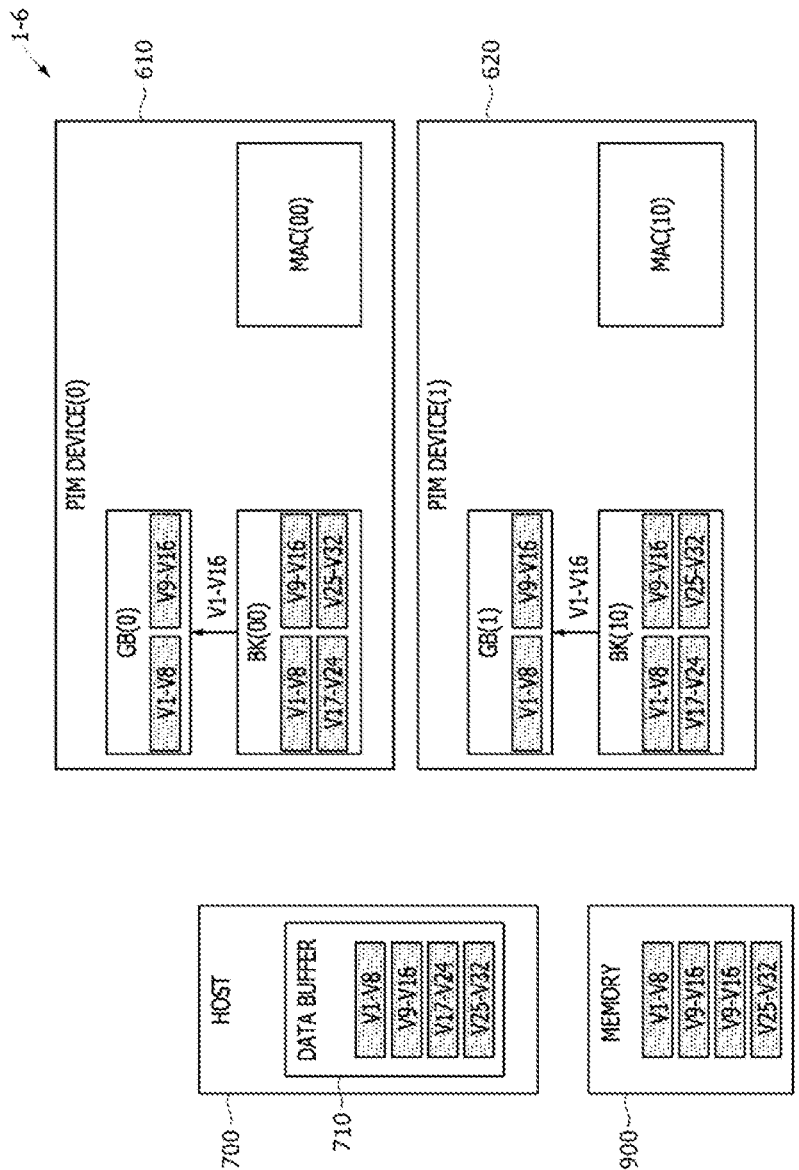
Figure 61:
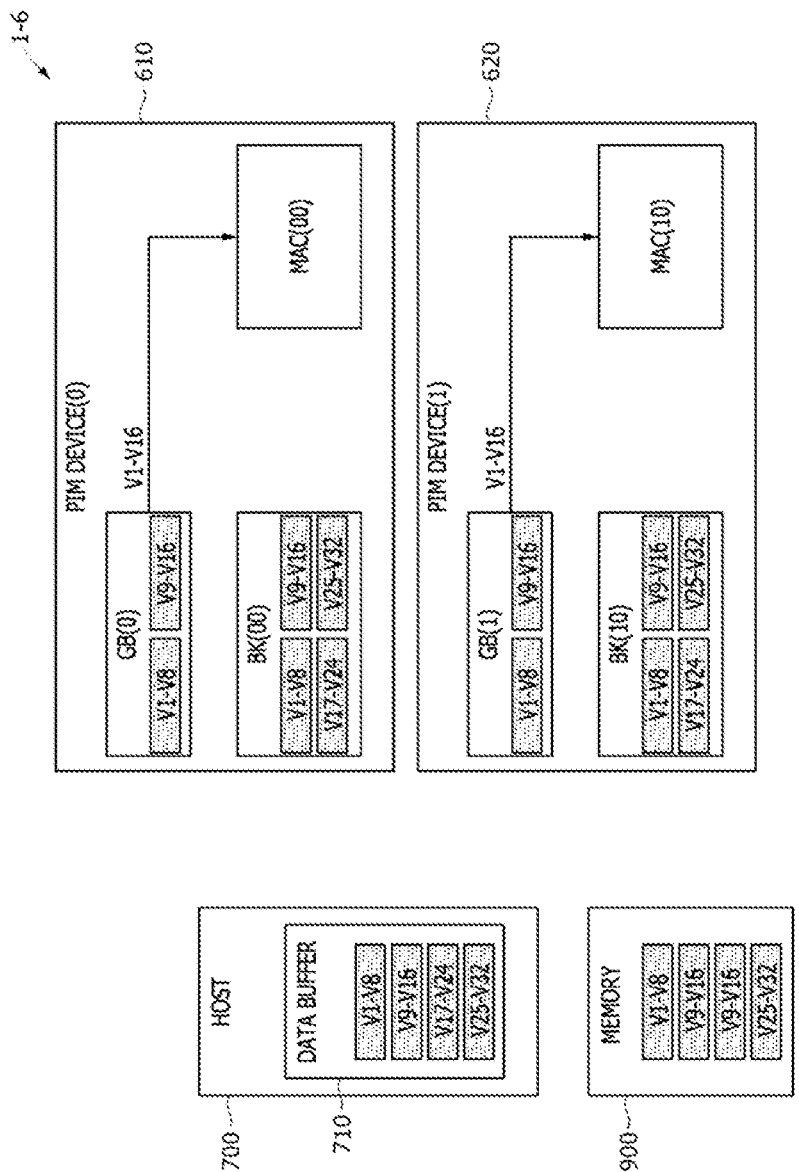

Next, as illustrated in FIG. 60, the first to sixteenth vector data V1~V16 used for the first sub-MAC arithmetic operation among the first to $32^{nd}$ vector data V1~V32 stored in the first memory bank BK(00) of the first PIM device 610 may be copied into the first global buffer GB(0) of the first PIM device 610, and the first to sixteenth vector data V1~V16 used for the first sub-MAC arithmetic operation among the first to $32^{nd}$ vector data V1~V32 stored in the first memory bank BK(10) of the second PIM device 620 may be copied into the second global buffer GB(1) of the second PIM device 620. As illustrated in FIG. 61, the first to sixteenth vector data V1~V16 copied into the first global buffer GB(0) of the first PIM device 610 may be supplied to the first MAC operator MAC(00) included in the first PIM device 610, and the first to sixteenth vector data V1~V16 copied into the second global buffer GB(1) of the second PIM device 620 may be supplied to the first MAC operator MAC(10) included in the second PIM device 620. Each of the first MAC operator MAC(00) in the first PIM device 610 and the first MAC operator MAC(10) in the second PIM device 620 may perform the first sub-MAC arithmetic operation using the first to sixteenth vector data V1~V16 as input data.

Figure 62:
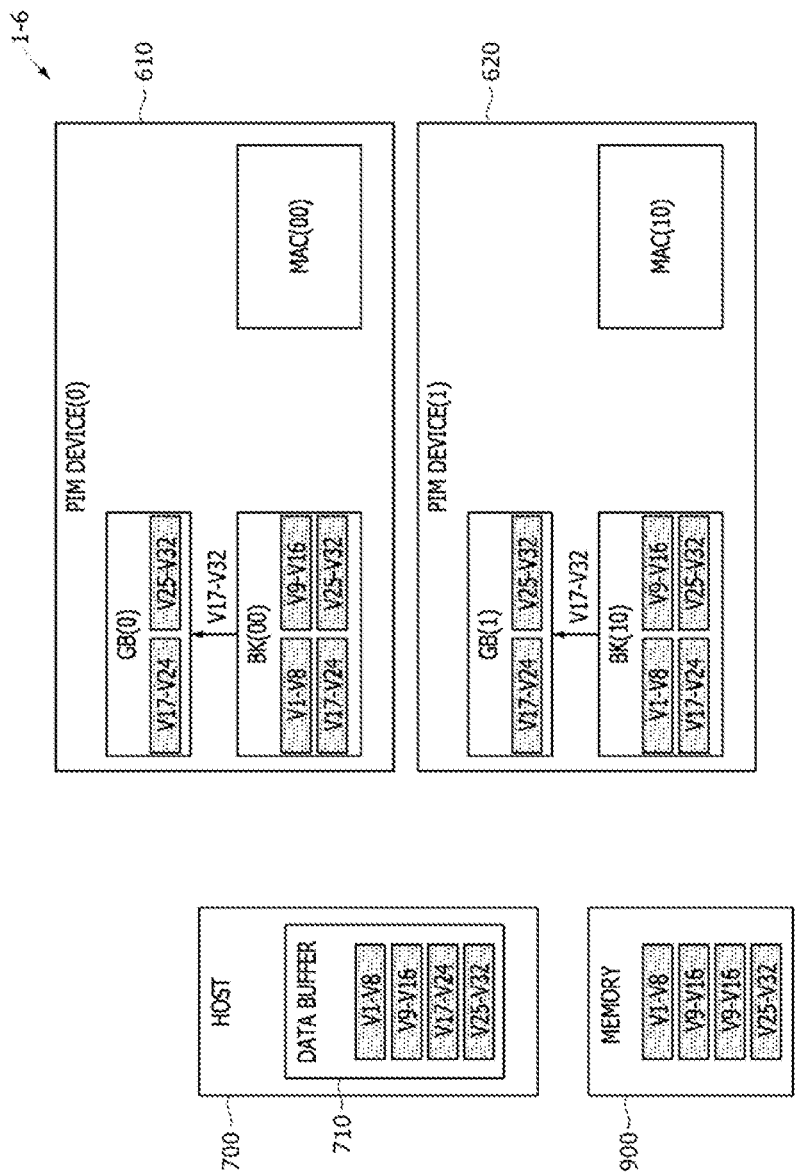
Figure 63:
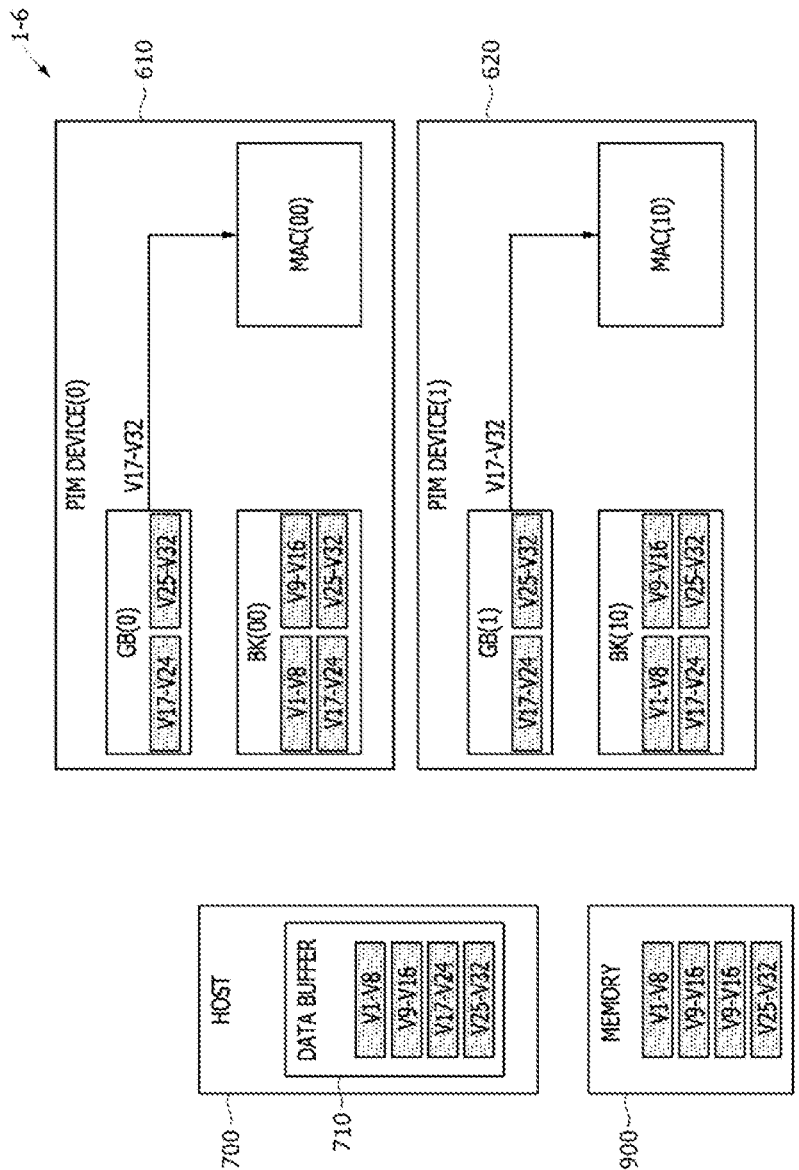

As illustrated in FIG. 62, when the second vector data write command occurs, the seventeenth to $32^{nd}$ vector data V17~V32 used for the second sub-MAC arithmetic operation among the first to $32^{nd}$ vector data V1~V32 stored in the first memory bank BK(00) of the first PIM device 610 may be copied into the first global buffer GB(0) of the first PIM device 610, and the seventeenth to $32^{nd}$ vector data V17~V32 used for the second sub-MAC arithmetic operation among the first to $32^{nd}$ vector data V1~V32 stored in the first memory bank BK(10) of the second PIM device 620 may be copied into the second global buffer GB(1) of the second PIM device 620. As illustrated in FIG. 63, the seventeenth to $32^{nd}$ vector data V17~V32 copied into the first global buffer GB(0) of the first PIM device 610 may be supplied to the first MAC operator MAC(00) included in the first PIM device 610, and the seventeenth to $32^{nd}$ vector data V17~V32 copied into the second global buffer GB(1) of the second PIM device 620 may be supplied to the first MAC operator MAC(10) included in the second PIM device 620. Each of the first MAC operator MAC(00) in the first PIM device 610 and the first MAC operator MAC(10) in the second PIM device 620 may perform the second sub-MAC arithmetic operation using the seventeenth to $32^{nd}$ vector data V17~V32 as input data.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A processing-in-memory (PIM) system comprising:
   a first PIM device and a second PIM devices, wherein each of the first and second PIM devices includes a plurality of multiplying-and-accumulating (MAC) operators capable of performing a MAC arithmetic operation and a plurality of memory banks capable of supplying weight data to the plurality of MAC operators, and wherein the MAC arithmetic operation is performed using the weight data and vector data as input data; and
   a host capable of controlling the first and second PIM devices and including a data buffer,
   wherein the first and second PIM devices include a first global buffer and a second global buffer, which are capable of supplying the vector data to the plurality of MAC operators, respectively, and
   wherein the host is configured to read the vector data out of the first and second PIM devices to store the vector data into the data buffer and is configured to write the vector data stored in the data buffer into the first and second global buffers.

2. The PIM system of claim 1, wherein the vector data supplied from the first global buffer to the plurality of MAC operators in the first PIM device are the same data as the vector data supplied from the second global buffer to the plurality of MAC operators in the second PIM device.

3. The PIM system of claim 2,
wherein the vector data include a first group of vector data and a second group of vector data; and
wherein the first group of vector data and the second group of vector data are separately stored into at least one first target memory bank among the plurality of memory banks in the first PIM device and at least one second target memory bank among the plurality of memory banks in the second PIM device, respectively.

4. The PIM system of claim 3, wherein the host is capable of:
reading the first group of vector data out of the at least one first target memory bank to store the first group of vector data into the data buffer; and
reading the second group of vector data out of the at least one second target memory bank to store the second group of vector data into the data buffer.

5. The PIM system of claim 4, wherein the host is configured to store the first and second groups of vector data in the data buffer into each of the first global buffer and the second global buffer.

6. The PIM system of claim 5,
wherein the first PIM device is configured to supply the first and second groups of vector data stored in the first global buffer to each of the plurality of MAC operators in the first PIM device; and
wherein the second PIM device is configured to supply the first and second groups of vector data stored in the second global buffer to each of the plurality of MAC operators in the second PIM device.

7. The PIM system of claim 2,
wherein the vector data include first, second, third, and fourth groups of vector data; and
wherein the first, second, third, and fourth groups of vector data are dispersedly stored into at least one first target memory bank among the plurality of memory banks in the first PIM device and at least one second target memory bank among the plurality of memory banks in the second PIM device.

8. The PIM system of claim 7, wherein the first and third groups of vector data are stored into the at least one first target memory bank, and the second and fourth groups of vector data are stored into the at least one second target memory bank.

9. The PIM system of claim 8, wherein the host is capable of:
reading the first and third groups of vector data out of the at least one first target memory bank to store the first and third groups of vector data into the data buffer; and
reading the second and fourth groups of vector data out of the at least one second target memory bank to store the second and fourth groups of vector data into the data buffer.

10. The PIM system of claim 9, wherein the host is configured to store the first, second, third, and fourth groups of vector data in the data buffer into each of at least one third target memory bank among the plurality of memory banks in the first PIM device and at least one fourth target memory bank among the plurality of memory banks in the second PIM device.

11. The PIM system of claim 10,
wherein the MAC arithmetic operation performed by each of the plurality of MAC operators included in the first and second PIM devices includes a first sub-MAC arithmetic operation and a second sub-MAC arithmetic operation;
wherein the first PIM device copies the first and second groups of vector data stored in the at least one third target memory bank into the first global buffer; and
wherein the second PIM device copies the first and second groups of vector data stored in the at least one fourth target memory bank into the second global buffer.

12. The PIM system of claim 11,
wherein the first PIM device is capable of supplying the first and second groups of vector data copied in the first global buffer to each of the plurality of MAC operators in the first PIM device for the first sub-MAC arithmetic operation; and
wherein the second PIM device is capable of supplying the first and second groups of vector data copied in the second global buffer to each of the plurality of MAC operators in the second PIM device for the first sub-MAC arithmetic operation.

13. The PIM system of claim 12,
wherein the first PIM device is capable of copying the third and fourth groups of vector data stored in the at least one third target memory bank into the first global buffer after the first sub-MAC arithmetic operation; and
wherein the second PIM device is capable of copying the third and fourth groups of vector data stored in the at least one fourth target memory bank into the second global buffer after the first sub-MAC arithmetic operation.

14. The PIM system of claim 13,
wherein the first PIM device is capable of supplying the third and fourth groups of vector data copied in the first global buffer to each of the plurality of MAC operators in the first PIM device for the second sub-MAC arithmetic operation; and
wherein the second PIM device is capable of supplying the third and fourth groups of vector data copied in the second global buffer to each of the plurality of MAC operators in the second PIM device for the second sub-MAC arithmetic operation.

15. A processing-in-memory (PIM) system comprising:
a first PIM device and a second PIM devices, wherein each of the first and second PIM devices includes a plurality of multiplying-and-accumulating (MAC) operators capable of performing a MAC arithmetic operation and a plurality of memory banks capable of supplying weight data to the plurality of MAC operators, and wherein the MAC arithmetic operation is performed using the weight data and vector data as input data;
a host capable of controlling the first and second PIM devices and including a data buffer; and
a memory device configured to communicate with the host,
wherein the first and second PIM devices include a first global buffer and a second global buffer, which are capable of supplying the vector data to the plurality of MAC operators, respectively, and
wherein the host is configured to read the vector data out of the memory device to store the vector data into the data buffer and is configured to write the vector data stored in the data buffer into the first and second global buffers.

16. The PIM system of claim 15, wherein the vector data supplied from the first global buffer to the plurality of MAC operators in the first PIM device are the same data as the vector data supplied from the second global buffer to the plurality of MAC operators in the second PIM device.

17. The PIM system of claim 16,
wherein the memory device is configured to store the vector data; and
wherein the vector data include a first group of vector data and a second group of vector data.

18. The PIM system of claim 17, wherein the host is capable of reading the first and second groups of vector data out of the memory device to store the first and second groups of vector data into the data buffer.

19. The PIM system of claim 18, wherein the host is configured to store the first and second groups of vector data in the data buffer into each of the first global buffer and the second global buffer.

20. The PIM system of claim 19,
wherein the first PIM device is configured to supply the first and second groups of vector data stored in the first global buffer to each of the plurality of MAC operators in the first PIM device; and
wherein the second PIM device is configured to supply the first and second groups of vector data stored in the second global buffer to each of the plurality of MAC operators in the second PIM device.

21. The PIM system of claim 16,
wherein the memory device is configured to store the vector data; and
wherein the vector data include first, second, third, and fourth groups of vector data.

22. The PIM system of claim 21, wherein the host is capable of reading the first, second, third, and fourth groups of vector data out of the memory device to store the first, second, third, and fourth groups of vector data into the data buffer.

23. The PIM system of claim 22, wherein the host is configured to store the first, second, third, and fourth groups of vector data in the data buffer into each of:
at least one third target memory bank among the plurality of memory banks in the first PIM device; and
at least one fourth target memory bank among the plurality of memory banks in the second PIM device.

24. The PIM system of claim 23,
wherein the MAC arithmetic operation performed by each of the plurality of MAC operators included in the first and second PIM devices includes a first sub-MAC arithmetic operation and a second sub-MAC arithmetic operation;
wherein the first PIM device is capable of copying the first and second groups of vector data stored in the at least one third target memory bank into the first global buffer; and
wherein the second PIM device is capable of copying the first and second groups of vector data stored in the at least one fourth target memory bank into the second global buffer.

25. The PIM system of claim 24,
wherein the first PIM device is capable of supplying the first and second groups of vector data copied in the first global buffer to each of the plurality of MAC operators in the first PIM device for the first sub-MAC arithmetic operation; and
wherein the second PIM device is capable of supplying the first and second groups of vector data copied in the second global buffer to each of the plurality of MAC operators in the second PIM device for the first sub-MAC arithmetic operation.

26. The PIM system of claim 25,
wherein the first PIM device is capable of copying the third and fourth groups of vector data stored in the at least one third target memory bank into the first global buffer after the first sub-MAC arithmetic operation; and
wherein the second PIM device is capable of copying the third and fourth groups of vector data stored in the at least one fourth target memory bank into the second global buffer after the first sub-MAC arithmetic operation.

27. The PIM system of claim 26,
wherein the first PIM device is capable of supplying the third and fourth groups of vector data copied in the first global buffer to each of the plurality of MAC operators in the first PIM device for the second sub-MAC arithmetic operation; and
wherein the second PIM device is capable of supplying the third and fourth groups of vector data copied in the second global buffer to each of the plurality of MAC operators in the second PIM device for the second sub-MAC arithmetic operation.

* * * * *